US010154328B2

(12) United States Patent
Watson et al.

(10) Patent No.: US 10,154,328 B2
(45) Date of Patent: *Dec. 11, 2018

(54) INGRESS PROTECTION FOR REDUCING PARTICLE INFILTRATION INTO ACOUSTIC CHAMBER OF A MEMS MICROPHONE PACKAGE

(71) Applicant: Knowles Electronics, LLC, Itasca, IL (US)

(72) Inventors: Joshua Watson, Aurora, IL (US); Daniel Todd Grosse, Holly Springs, NC (US); Michael Robert Jacobs, Schaumburg, IL (US); William F. Schimpf, McHenry, IL (US); Ivelisse Del Valle Figueroa, Elk Grove Village, IL (US)

(73) Assignee: Knowles Electronics, LLC, Itasca, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/707,397

(22) Filed: Sep. 18, 2017

(65) Prior Publication Data

US 2018/0070158 A1    Mar. 8, 2018

Related U.S. Application Data

(63) Continuation of application No. 14/821,303, filed on Aug. 7, 2015, now Pat. No. 9,794,661.

(51) Int. Cl.
*H04R 25/00* (2006.01)
*H04R 1/02* (2006.01)
(Continued)

(52) U.S. Cl.
CPC ............ *H04R 1/023* (2013.01); *H04R 17/00* (2013.01); *H04R 17/02* (2013.01); *H04R 19/005* (2013.01);
(Continued)

(58) Field of Classification Search
CPC combination set(s) only.
See application file for complete search history.

(56) References Cited

U.S. PATENT DOCUMENTS

| 7,190,038 B2 | 3/2007 | Dehe et al. |
| 7,473,572 B2 | 1/2009 | Dehe et al. |
(Continued)

FOREIGN PATENT DOCUMENTS

| CN | 201403200 Y | 2/2010 |
| CN | 204145748 U | 2/2015 |
(Continued)

OTHER PUBLICATIONS

International Search Report and Written Opinion, PCT/US2016/044997, Knowles Electronics, LLC, 7 pages (dated Oct. 13, 2016).

*Primary Examiner* — Amir Etesam
(74) *Attorney, Agent, or Firm* — Foley & Lardner LLP

(57) ABSTRACT

A surface-mountable MEMS microphone comprising a MEMS microphone die and an application-specific integrated circuit (ASIC) mounted inside a surface-mountable package housing, and fully enclosed therein. The surface-mountable package is a single, self-contained housing that provides an electrical interface to external circuitry for the enclosed MEMS microphone die and the ASIC, and provides electrical, physical, and environmental protection for the MEMS microphone die and the ASIC. The surface-mountable package allows external acoustic energy to enter the package interior via one or more acoustic ports and impinge on the diaphragm of the MEMS microphone die. The cover of the surface-mountable package comprises an acoustic port with ingress protection to limit dust and particle intrusion. The ingress protection can be a formed member that is part of the cover of the surface-mountable
(Continued)

package having various shapes, an internal shield, or a combination of both a formed member and internal shield.

20 Claims, 38 Drawing Sheets

(51) Int. Cl.
    *H04R 19/00*     (2006.01)
    *H04R 19/04*     (2006.01)
    *H04R 17/00*     (2006.01)
    *H04R 17/02*     (2006.01)

(52) U.S. Cl.
    CPC .... *H04R 19/04* (2013.01); *H01L 2224/48137* (2013.01); *H04R 2201/003* (2013.01)

(56) References Cited

U.S. PATENT DOCUMENTS

| | | | |
|---|---|---|---|
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,102,015 B2 * | 1/2012 | Gong | B81C 1/0023 257/416 |
| 9,002,037 B2 * | 4/2015 | Dehe | B81B 7/0029 381/113 |
| 2002/0102004 A1 | 8/2002 | Minervini | |
| 2005/0207605 A1 | 9/2005 | Dehe et al. | |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2009/0267223 A1 | 10/2009 | Wachtler et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2014/0044297 A1 | 2/2014 | Loeppert et al. | |
| 2015/0195656 A1 | 7/2015 | Ye | |

FOREIGN PATENT DOCUMENTS

| | | |
|---|---|---|
| KR | 101333573 B1 | 11/2013 |
| KR | 2014002170 A | 1/2014 |

* cited by examiner

| EXEMPLARY MICROPHONE SUBSTRATE STACKUP ||||
|---|---|---|---|
| | LAYER | DESCRIPTION | MATERIAL |
| UPPER SURFACE | 1 | FINISH | GOLD |
| | | FINISH | NICKEL |
| | | TOP SOLDER MASK (30) | SOLDER MASK |
| | | METAL PLATING | COPPER |
| | | TOP BASE METAL (31) | COPPER |
| | C1 | PRE-PREG/CORE (34) | FR-4 |
| | 2 | METAL CLAD (32) | COPPER |
| | | ADHESIVE | LAMINATING FILM |
| | D | DIELECTRIC/BARRIER (35) | PFTE |
| | | ADHESIVE | LAMINATING FILM |
| | 3 | METAL CLAD (33) | COPPER |
| | C2 | PRE-PREG/CORE (34) | FR-4 |
| | 4 | BOTTOM BASE METAL (36) | COPPER |
| | | METAL PLATING | COPPER |
| | | BOTTOM SOLDER MASK (37) | SOLDER MASK |
| | | FINISH | NICKEL |
| BOTTOM SURFACE | | FINISH | GOLD |

*FIG. 4*

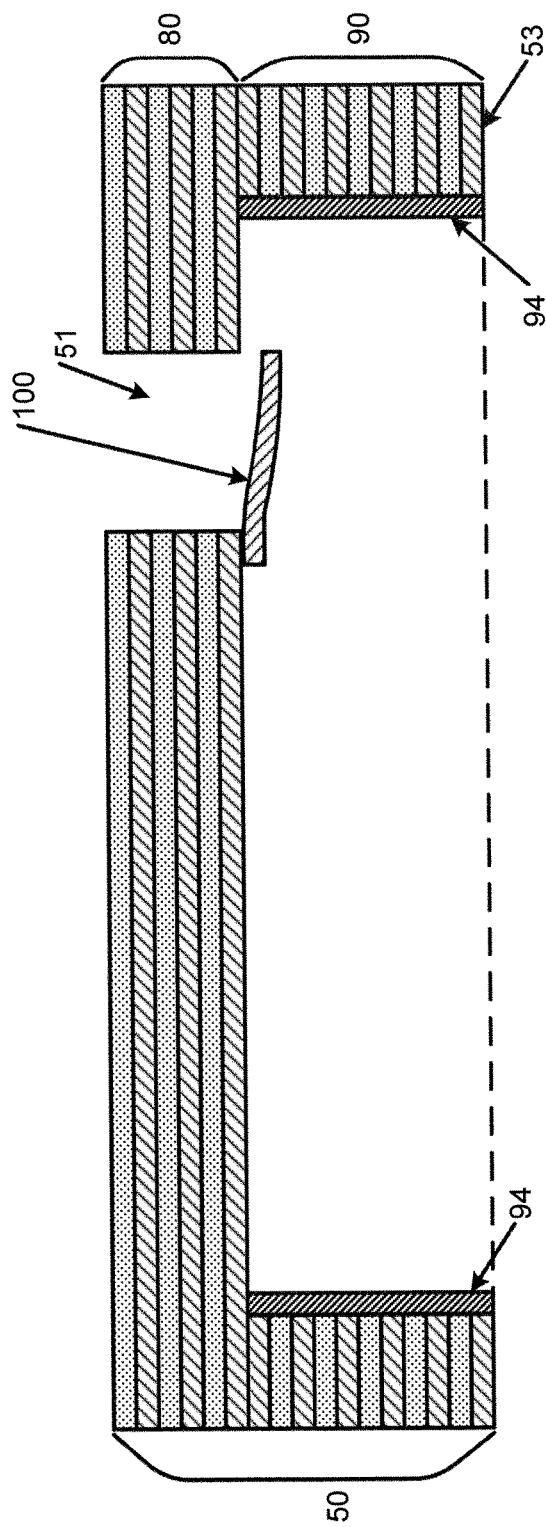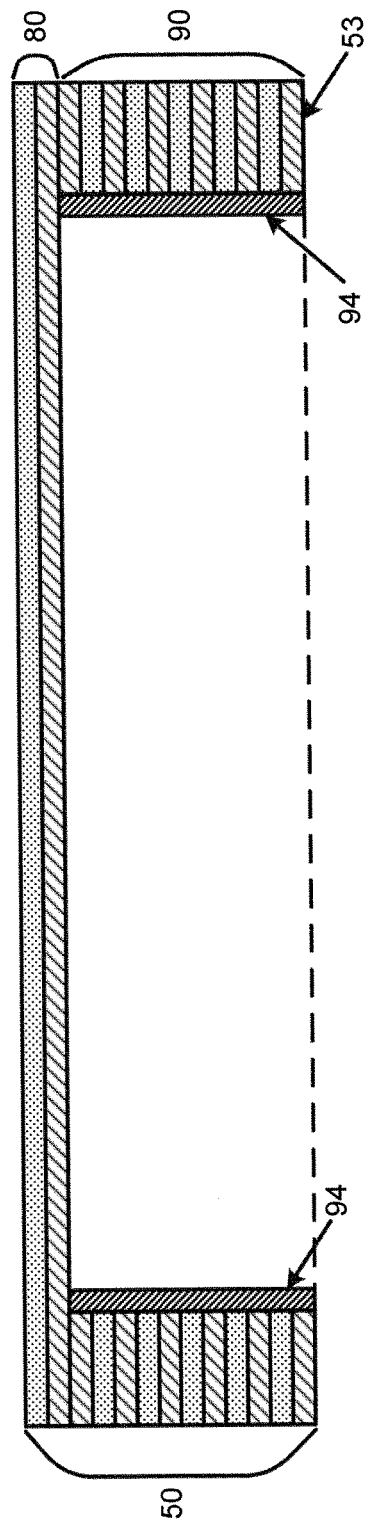

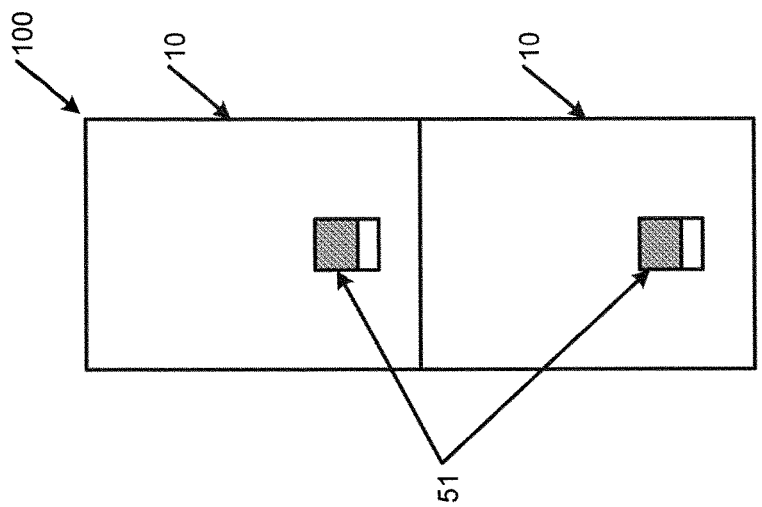
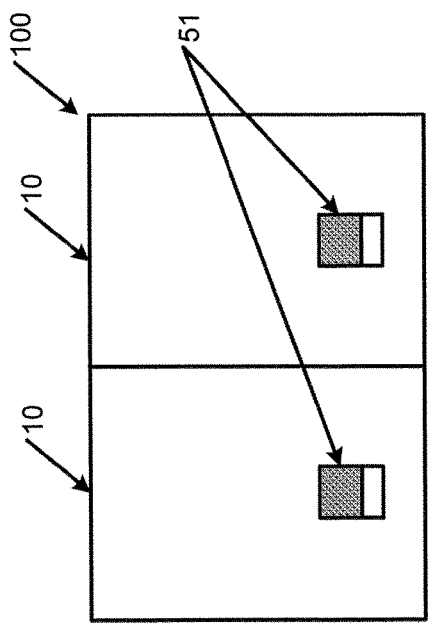
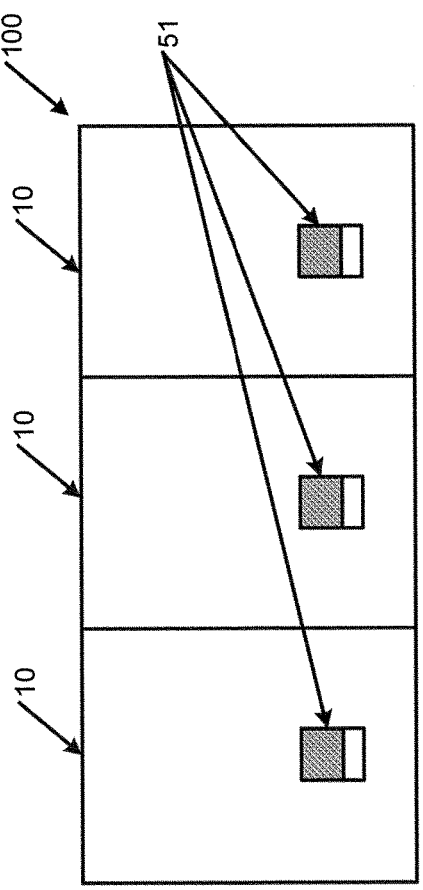
FIG. 22C
FIG. 22A
FIG. 22B

INGRESS PROTECTION FOR REDUCING PARTICLE INFILTRATION INTO ACOUSTIC CHAMBER OF A MEMS MICROPHONE PACKAGE

CROSS-REFERENCE TO RELATED APPLICATIONS

This application is a continuation of U.S. patent application Ser. No. 14/821,303, filed Aug. 7, 2015, the entire contents of which is incorporated herein by reference.

TECHNICAL FIELD

The disclosed invention relates to a MEMS microphone comprising a surface-mountable package, a MEMS microphone die, and an application-specific integrated circuit (ASIC), wherein the MEMS microphone die and the ASIC are mounted inside the package housing, and fully enclosed therein. The surface-mountable package is a single, self-contained housing that provides an electrical interface to external circuitry for the enclosed MEMS microphone die and the ASIC, suppresses or reduces electromagnetic interference, provides environmental protection for the MEMS microphone die and the ASIC, and prevents external forces from damaging the MEMS microphone die and the ASIC. The surface-mountable package is configured for mechanical attachment to a land pattern on an end user printed circuit board, and for electrically coupling to electrical circuitry linked to the land pattern, via reflow soldering techniques. The surface-mountable package allows external acoustic energy to enter the package interior via one or more acoustic ports and impinge on the diaphragm of the MEMS microphone die. The surface-mountable package substantially limits or prevents external contaminants (dust, debris, particles, moisture, oils, etc.) from reaching the MEMS microphone die or the ASIC, and potentially causing damage. The cover of the MEMS microphone comprises an acoustic port with ingress protection to limit dust and particle intrusion into the acoustic chamber created by the mechanical joining of the cover to the substrate of the surface-mountable package. In some embodiments, the ingress protection is a formed member that is part of the acoustic port in the cover of the surface-mountable package, and the formed member has various shapes that extend into the acoustic chamber of the MEMS microphone. In some embodiments, the ingress protection comprises multiple formed members extending into the acoustic chamber. In other embodiments, the cover of the MEMS microphone comprises an acoustic port with an internal shield, set off from the cover, to limit dust and particle intrusion into the acoustic chamber. In some embodiments, the ingress protection comprises both a formed member and an internal shield working in conjunction. In still other embodiments, the ingress protection is realized with a shallow cavity formed in the exterior surface of the cover of the MEMS microphone, with a particle shield residing in the shallow cavity.

BACKGROUND

There have been a number of disclosures by Knowles Electronics related to the design and fabrication of a MEMS microphone die, such as U.S. Pat. Nos. 5,870,482, 6,535, 460, 6,552,469, 6,847,090, 6,987,859, and 7,023,066, all of which are incorporated by reference in their entirety. There have also been a number of disclosures by Knowles Electronics related to the package or housing needed to mechanically and electrically support a MEMS microphone die, and protect the MEMS microphone die from physical damage and the environment. See U.S. Pat. Nos. 6,781,231, 7,166, 910, 7,242,089, 7,537,964, 7,439,616, 7,434,305, 8,018,049, 8,121,331, and 7,381,589, and, all of which are incorporated by reference in their entirety. The Knowles patents are related to the Knowles SiSonic® product line of surface-mount, land grid array MEMS microphones. Collectively, the Knowles patents disclose various MEMS microphone dies and how to protect those MEMS microphone dies from external environmental contaminants, potential physical damage, and electromagnetic interference, while providing electrical and mechanical interfaces and providing a proper acoustic environment for the MEMS microphone die to operate. Although the Knowles patents disclose the use of an environmental barrier in the acoustic port in the cover of a MEMS microphone, such as a polymer material or sintered metal, the Knowles patents do not disclose ingress protection comprising a formed member, an internal shield, a combination of the formed member and the internal shield, or a shallow cavity formed in an external surface of the cover of the MEMS microphone and having a shield member disposed therein.

SUMMARY

The disclosed invention is directed to a MEMS microphone comprising a surface-mount package that encloses a MEMS microphone die, allows acoustic energy to impinge upon the enclosed MEMS microphone die, provides an electrical interface for the enclosed MEMS microphone die, provides the pressure reference for proper operation of the enclosed MEMS microphone die, and protects the enclosed MEMS microphone die from light, electromagnetic interference, environmental contaminants, and physical damage. The disclosed invention improves the protection for the enclosed MEMS microphone die from environmental contaminants by disposing a flange or an extension in the acoustic port of the cover of the MEMS microphone, the flange or the extension configured to limit the entry of environmental contaminants into the acoustic chamber where the MEMS microphone die is disposed.

A conventional MEMS microphone comprises a MEMS microphone die, an ASIC for processing signals from the MEMS microphone die, and a package comprising a substrate and a cover coupled to the substrate. The substrate has upper and lower surfaces, with electrical terminal pads on the lower surface configured for surface-mount attachment to an end user printed circuit board via reflow soldering. The substrate has electrical traces and wire bond pads on the upper surface for electrical connections to the MEMS microphone die and to the ASIC. In certain embodiments of the conventional MEMS microphone, the substrate may have an acoustic port or an internal recess disposed therein. In some embodiments of the conventional MEMS microphone, the MEMS microphone die is mounted on the upper surface of the substrate and, if provided in the substrate, is positioned over the acoustic port or the aperture of the internal recess. To assist with the suppression of electromagnetic interference, the substrate may comprise a metal ground ring disposed on the perimeter edge of its bottom surface. If the substrate comprises an acoustic port, the substrate may further comprise a sealing ring disposed around the perimeter of the acoustic port. Both the ground ring and the sealing ring can be mechanically and electrically coupled to the end user printed circuit board via reflow soldering. The substrate may have internally embedded circuitry, such as resistors and/or capacitors, to filter input and output signals, as well as input power. Passive networks, such as high pass or low pass filters, can be implemented, and these passive networks can be designed to interoperate with circuitry internal to the ASIC. The substrate may have internal and/or surface metallized layers (i.e., ground planes) for suppressing or reducing electromagnetic interference. Internal electrical vias couple the wire bond pads to the terminal pads, and to any internal passive circuitry embedded within the substrate. The cover is mounted on the upper surface of the substrate, and encloses the MEMS microphone die in an acoustic chamber formed by the direct or indirect coupling of the cover to the substrate. In certain embodiments of the conventional MEMS microphone, the cover may have an acoustic port adapted for allowing acoustic energy to contact the MEMS microphone die. In other embodiments of the conventional MEMS microphone, both the substrate and cover each have an acoustic port to allow acoustic energy into the acoustic chamber. In some embodiments of the conventional MEMS microphone, the MEMS microphone die is mounted on the cover and is aligned with the acoustic port in the cover, instead of being mounted on the upper surface of the substrate. The cover may have conductive plating on its interior and/or exterior surfaces, and the conductive plating of the cover, as well as the cover (if constructed from conductive materials), is electrically coupled to the ground plane (or planes) in the substrate to suppress or reduce electromagnetic interference. The substrate and cover, if either or both has an acoustic port, may comprise an environmental barrier that is disposed in the respective acoustic port(s) or is a part of the respective acoustic port(s). The environmental barrier comprises an acoustically transparent material.

The embodiments of the disclosed invention incorporate many features of the conventional MEMS microphone disclosed above, and further incorporate the use of ingress protection on the acoustic port in the cover to limit the entry of potential environmental contaminants into the acoustic chamber of the MEMS microphone, thereby protecting the MEMS microphone die disposed in the acoustic chamber. In some embodiments of the disclosed invention, the ingress protection is a formed member that is part of the acoustic port. The formed member can be configured into various shapes that provide access into the acoustic chamber for acoustic energy impinging upon the MEMS microphone, and is contiguous with the cover material. In other embodiments, the ingress protection is a stand-off shield that is mounted on the inner surface of the cover. The stand-off shield can be configured with multiple ports, open ends, or combinations of both. The stand-off shield can comprise a metal or plastic or composite material, and is attached to the cover with adhesive, solder, or other attachment methods. In other embodiments, the ingress protection is a stand-off shield that is mounted on the inner surface of the cover combined with a formed member as described earlier. In other embodiments, the ingress protection is a shallow cavity formed in the exterior surface of the cover, with the acoustic port for the MEMS microphone disposed within the shallow cavity. A shield member is disposed with the cavity and covers the acoustic port, but allows acoustic pressure to enter the acoustic port while limiting the entry of environmental contaminants. In other embodiments, the ingress protection is a shallow cavity formed in the exterior surface of the cover, with the acoustic port for the MEMS microphone disposed within the shallow cavity. A shield member is disposed with the cavity and covers the acoustic port, but allows acoustic pressure to enter the acoustic port while limiting the entry of environmental contaminants. In other embodiments, a formed member is mechanically attached with solder or other adhesives to the inner surface of the cover immediately adjacent to the acoustic port in the cover.

Other features and advantages of the disclosed invention will be apparent from the following specification taken in conjunction with the following drawings.

BRIEF DESCRIPTION OF DRAWINGS

The accompanying drawings, which are incorporated in and constitute a part of this specification, illustrate embodiments of the disclosed invention and, together with the description, serve to explain the objects, advantages, and principles of the disclosed invention. In the drawings.

FIGS. 3H-1 to 3H-3 are views of another embodiment of a can-type cover for a MEMS microphone according to the disclosed invention;

FIGS. 3J-1 to 3J-3 are views of another embodiment of a can-type cover for a MEMS microphone according to the disclosed invention;

FIGS. 3K-1 to 3K-3 are views of another embodiment of a can-type cover for a MEMS microphone according to the disclosed invention;

FIGS. 3L-1 to 3L-3 are views of another embodiment of a can-type cover for a MEMS microphone according to the disclosed invention;

FIGS. 3M-1 to 3M-3 are views of another embodiment of a can-type cover for a MEMS microphone according to the disclosed invention;

FIGS. 3N-1 to 3N-3 are views of another embodiment of a can-type cover for a MEMS microphone according to the disclosed invention;

FIGS. 3P-1 to 3P-3 are views of another embodiment of a can-type cover for a MEMS microphone according to the disclosed invention;

FIGS. 3Q-1 to 3Q-3 are views of another embodiment of a can-type cover for a MEMS microphone according to the disclosed invention;

FIGS. 3R-1 to 3R-3 are views of another embodiment of a can-type cover for a MEMS microphone according to the disclosed invention;

FIG. 4 is a table of materials for an embodiment of a substrate for a MEMS microphone according to the disclosed invention;

FIG. 18 is a longitudinal cross-sectional view of a first embodiment of a laminate-type cover for a MEMS microphone according to the disclosed invention;

FIG. 19 is a longitudinal cross-sectional view of another embodiment of a laminate-type cover for a MEMS microphone according to the disclosed invention;

FIG. 22A is a plan view of a first embodiment of a microphone array of MEMS microphones according to the disclosed invention;

FIG. 22B is a plan view of another embodiment of a microphone array of MEMS microphones according to the disclosed invention;

FIG. 22C is a plan view of a third embodiment of a microphone array of MEMS microphones according to the disclosed invention;

Figure 1A:
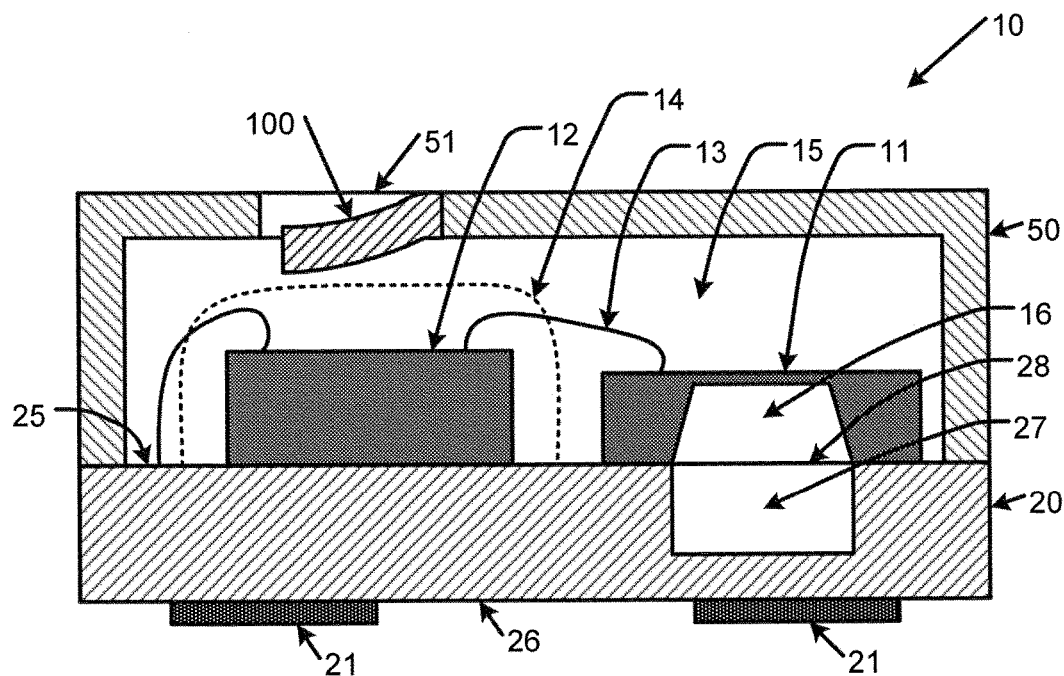
FIG. 1A is a longitudinal cross-sectional view of a first embodiment of a MEMS microphone according to the disclosed invention.

Skilled artisans will appreciate that elements in the Figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

A detailed description of embodiments of the disclosed invention will now be given referring to the accompanying drawings.

While the disclosed invention is susceptible to embodiments in many different forms, there is shown in the drawings, and will herein be described in detail, preferred embodiments of the disclosed invention with the understanding that the present disclosure is to be considered as an exemplification of the principles of the disclosed invention and is not intended to limit the broad aspect of the disclosed invention to the embodiments illustrated.

Top-Port MEMS Microphone Embodiments

Figure 1B:
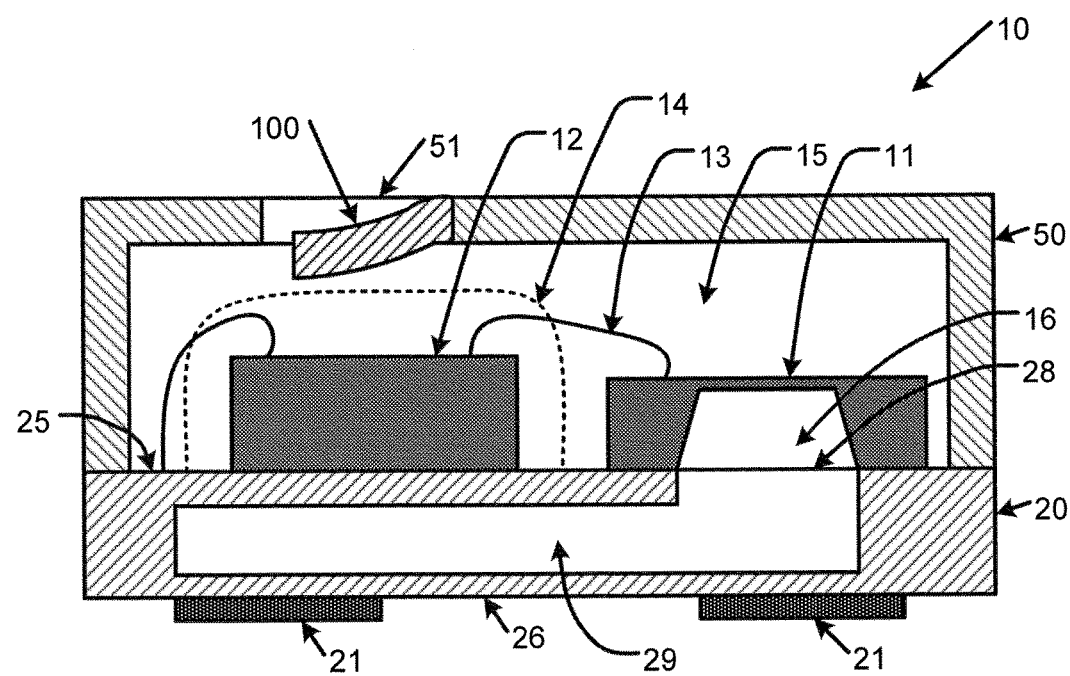
FIG. 1B is a longitudinal cross-sectional view of another embodiment of a MEMS microphone according to the disclosed invention.

Now, referring to FIGS. 1A and 1B, several embodiments of a MEMS microphone 10 are illustrated. These particular embodiments are referred to as "top-port" MEMS microphones, since the cover 50 has an acoustic port 51 (also referred to an "aperture"). The MEMS microphone 10 preferably comprises a MEMS microphone die 11, e.g., as disclosed in U.S. Pat. Nos. 5,870,482 and 6,535,460, each of which is hereby incorporated by reference in its entirety, a substrate 20, an application-specific integrated circuit (ASIC) 12, and a cover 50.

A substantial number of the features disclosed in FIGS. 1A and 1B are disclosed in U.S. application Ser. Nos. 09/886,854, 10/238,256, 11/112,043, and 11/276,025, each of which is incorporated herein in its entirety and is assigned to Knowles, as well as being implemented in the Knowles SiSonic® product line of surface-mount, land grid array MEMS microphones.

For the embodiments shown in FIGS. 1A and 1B, the substrate 20 comprises an E-glass/epoxy laminate material commonly referred to as FR-4. Since it is very common for the end user printed circuit board to be manufactured from FR-4-type material, embodiments of the MEMS microphone 10 have a substrate 20 that is manufactured from FR-4-type material. Use of FR-4-type material allows for a better match of coefficients of thermal expansion between the substrate 20 and the end user's printed circuit board. Other embodiments of the substrate 20 can use conventional materials such as E-glass/bismaleimide-triazine (BT) resin laminate or aramid/epoxy laminate materials as substrate materials. The use of FR-4 printed circuit board material, or equivalents thereof, for the substrate 20 enables economies of scale in manufacturing the MEMS microphones.

For the embodiments shown in FIGS. 1A and 1B, the MEMS microphone 10 has a plurality of terminal pads 21 (also referred to as "solder pads") on the lower surface 26 of the substrate 20. The terminal pads 21 are flat, and are electrically coupled to wire bond pads 39 (not shown) on the upper surface 25 of the substrate 20. The ASIC 12 is electrically coupled to the wire bond pads 39 (not shown) via wiring 13, and the MEMS microphone die 11 is electrically coupled to the ASIC 12. For the embodiments shown in FIGS. 1A and 1B, both the MEMS microphone die 11 and the ASIC 12 are attached to the substrate 20 with a die attach adhesive, or an equivalent adhesive material. The terminal pads 21 are the power, ground potential, input-output signal, clock signal, and/or control signal connections for the MEMS microphone 10.

In certain embodiments, as shown in FIGS. 1A and 1B, the acoustic port 51 is offset from the position of the MEMS microphone die 11 within the acoustic chamber 15. This is done to limit the potential exposure of the MEMS microphone die 11 to light, debris, and moisture that might enter the acoustic chamber 15 through the acoustic port 51. However, this arrangement leaves the ASIC 12 vulnerable to potential interference and/or damage from light, debris, and moisture entering the acoustic port 51. For the embodiments shown in FIGS. 1A and 1B, an encapsulant 14 (shown in outline form in the Figures for reasons of clarity) covers and protects the ASIC 12. The encapsulant 14 can be an epoxy-type material, or its equivalent, that envelops the ASIC 12 to protect it against light, debris, and corrosion-inducing moisture. The encapsulant 14 is dispensed during the manufacturing process, and the amount and location is controlled so the encapsulant 14 does not interfere with the MEMS microphone die 11 or block the acoustic pathway between the acoustic port 51 and the MEMS microphone die 11.

For the embodiments shown in FIGS. 1A and 1B, the joining of the cover 50 to the upper surface 25 of the substrate 20 creates the acoustic chamber 15. The acoustic port 51 allows acoustic energy to reach the MEMS microphone die 11 disposed within the acoustic chamber 15. The interface between the cover 50 and the upper surface 25 of the substrate 20 is sealed during the manufacture of the MEMS microphone 10 to prevent leakage of acoustic pressure along the interface, which could result in improper operation of the MEMS microphone die 11. Materials such as solder or silver-impregnated conductive epoxy are used at seal the interface between the cover 50 and the upper surface 25 of the substrate 20. For the embodiments shown in FIGS. 1A and 1B, the base of the MEMS microphone die 11 is sealed to the upper surface 25 of the substrate 20 to prevent pressure leakage from the internal acoustic channel 16. Die attach epoxy, or other equivalent adhesives, are used to seal the base of the MEMS microphone die 11 to the upper surface 25 of the substrate 20.

In the embodiment shown in FIG. 1A, the acoustic chamber 15 is the "front volume" for the MEMS microphone die 11. The front volume acoustically couples incoming acoustic energy from the acoustic port 51 to the diaphragm of the MEMS microphone die 11. The internal acoustic channel 16 provides the "back volume" for the diaphragm of the MEMS microphone die 11. The base of the MEMS microphone die 11 is sealed to the upper surface 25 of the substrate 20 to prevent pressure leakage from the internal acoustic channel 16. Die attach epoxy or other suitable adhesives are used to seal the base of the MEMS microphone die 11 to the upper surface 25 of the substrate 20. The optional recess 27, disposed in the substrate 20, expands the amount of available back volume to improve the performance of the diaphragm of the MEMS microphone die 11. If the recess 27 is provided, the internal acoustic channel 16 of the MEMS microphone die 11 is aligned with the recess aperture 28 in the upper surface 25 of the substrate 20. In the embodiment shown in FIG. 1A, the recess 27 enlarges the back volume available to the MEMS microphone die 11, and thus improves the performance of the MEMS microphone die 11.

The recess 27 in the substrate 20, as depicted in FIG. 1A, is be formed by a number of methods. One method is controlled depth drilling of the upper surface 25 of the substrate 20 to form the recess aperture 28 and the recess 27 in the upper surface 25 of the substrate 20, over which the MEMS microphone die 11 is mounted (FIG. 1A). Another method is drilling and routing of several individual sheets of printed circuit board material, and laminating the individual sheets to form the substrate 20. The routed sheets of printed circuit board material, when laminated together, will form the recess 27 and the recess aperture 28.

Referring to FIG. 1B, this microphone embodiment has an extended recess 29 that enlarges the amount of back volume available to the MEMS microphone die 11. The extended recess 29 is embedded within the substrate 20, and can extend underneath the ASIC 12 and the MEMS microphone die 11 mounted on the upper surface 25 of the substrate 20. The larger volume of the extended recess 29 provides a larger back volume for the MEMS microphone die 11, and thus improves the performance of the MEMS microphone die 11. To manufacture the extended recess 29, one method is drilling and/or routing several individual sheets of printed circuit board material, and laminating the individual sheets together to form the substrate 20. The routed and/or drilled portions of the individual sheets will form the extended recess 29 when the lamination process is complete. The extended recess 29 may further comprise internal support posts (not shown). The support posts would be defined during the routing/drilling process. The MEMS microphone die 11 is mounted over the recess aperture 28 and the interface between the upper surface 25 and the base of the MEMS microphone die 11 is sealed around the recess aperture 28 to prevent acoustic pressure loss from the back volume formed by the extended recess 29.

In certain embodiments, as shown in FIGS. 1A and 1B, the acoustic port 51 further comprises an ingress protection element 100 to prevent the ingress of dust and other particles into the acoustic chamber 15. The ingress protection element 100 limits the potential exposure of the MEMS microphone die 11 to debris that might enter the acoustic chamber 15 through the acoustic port 51. The ingress protection element 100 must be sized so it does not unduly interfere or restrict the air flow into the acoustic chamber, or interfere with the encapsulant 14 or the wiring 13 as shown in FIGS. 1A and 1B. The ingress protection element 100 can be implemented in various ways (FIGS. 3A-3R), and the particular implementation illustrated in FIGS. 1A and 1B is a formed offset member (FIGS. 3A-3D) embodiment. The ingress protection element 100 is described in greater detail in the disclosure directed to the cover 50 and FIGS. 3A-3R.

Bottom-Port/Directional MEMS Microphone Embodiments

Figure 2A:
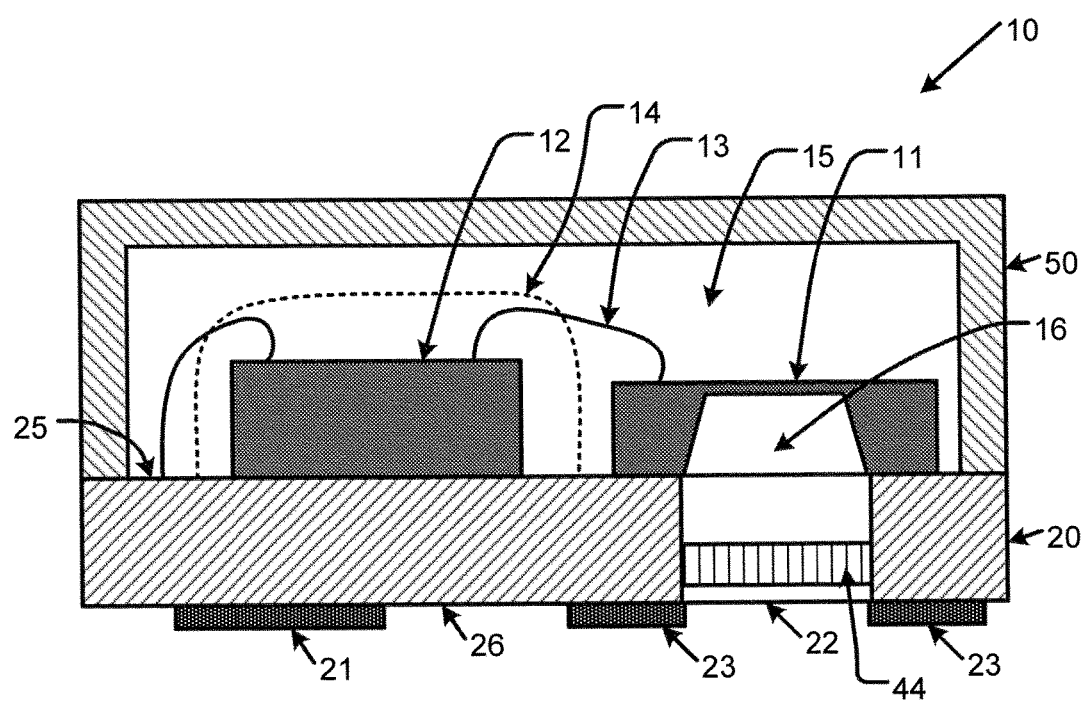
FIG. 2A is a longitudinal cross-sectional view of a fourth embodiment of a MEMS microphone according to the disclosed invention.
Figure 2B:
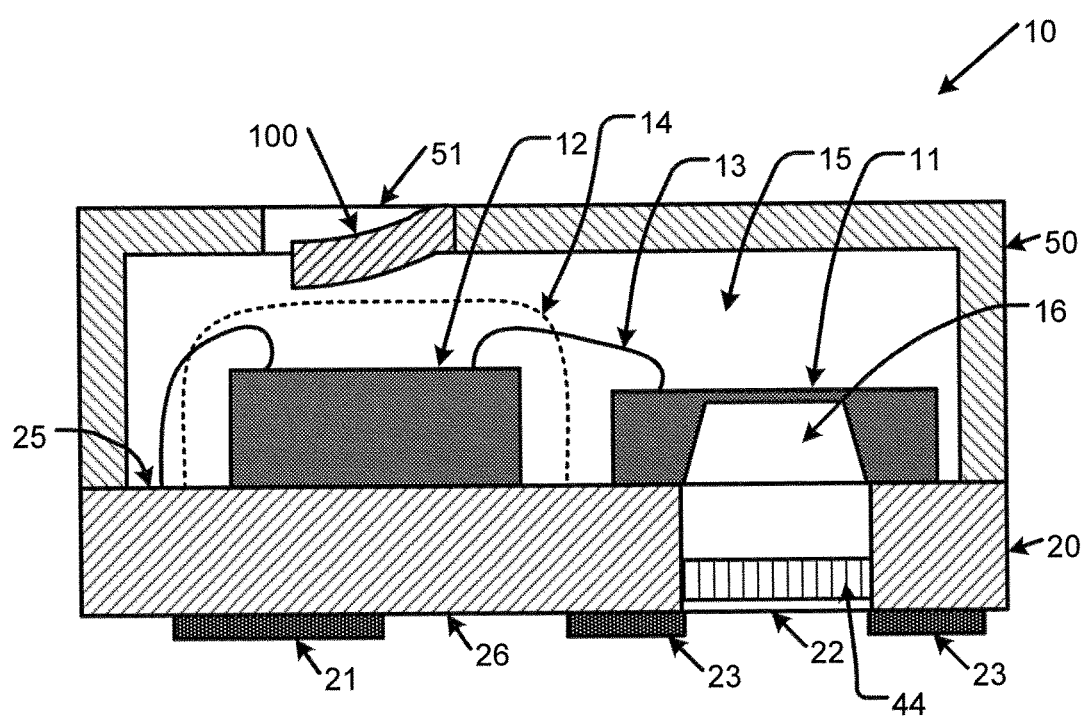
FIG. 2B is a longitudinal cross-sectional view of a fifth embodiment of a MEMS microphone according to the disclosed invention.

Referring to FIGS. 2A and 2B, several additional embodiments of a MEMS microphone 10 are illustrated. The embodiments of FIGS. 2A and 2B are referred to as "bottom-port" MEMS microphones, since these particular embodiments all have an acoustic port 22 (also referred to an "aperture" or "cavity") in the substrate 20. The MEMS microphone 10 preferably comprises a MEMS microphone die 11, e.g., as disclosed in as disclosed in U.S. Pat. Nos. 5,870,482 and 6,535,460, each of which is hereby incorporated by reference in its entirety, a substrate 20, an ASIC 12, and a cover 50.

A substantial number of the features disclosed in FIGS. 2A and 2B are disclosed in U.S. application Ser. Nos. 09/886,854, 10/238,256, 11/112,043, and 11/276,025, each of which is incorporated herein in its entirety and is assigned to Knowles, as well as being implemented in the Knowles SiSonic® product line of surface-mount, land grid array MEMS microphones.

For the embodiments shown in FIGS. 2A and 2B, the substrate 20 comprises an E-glass/epoxy laminate material commonly referred to as FR-4. Since it is very common for the end user printed circuit board to be manufactured from FR-4-type material, embodiments of the MEMS microphone 10 have a substrate 20 that is manufactured from FR-4-type material. Use of FR-4-type material allows for a better match of coefficients of thermal expansion between the substrate 20 and the end user's printed circuit board. Other embodiments of the substrate 20 can use conventional materials such as E-glass/bismaleimide-triazine (BT) resin laminate or aramid/epoxy laminate materials as substrate materials. The use of FR-4 printed circuit board material, or equivalents thereof, for the substrate 20 enables economies of scale in manufacturing the MEMS microphones.

For the embodiments shown in FIGS. 2A and 2B, the MEMS microphone 10 has a plurality of terminal pads 21 (also referred to as "solder pads") on the lower surface 26 of the substrate 20. The terminal pads 21 are flat, and are electrically coupled to wire bond pads 39 (not shown) on the upper surface 25 of the substrate 20. The ASIC 12 is electrically coupled to the wire bond pads 39 (not shown) via wiring 13, and the MEMS microphone die 11 is electrically coupled to the ASIC 12. For the embodiments shown in FIGS. 2A and 2B, both the MEMS microphone die 11 and the ASIC 12 are attached to the substrate 20 with a die attach adhesive, or an equivalent adhesive material. The terminal pads 21 are the power, ground potential, input-output signal, clock signal, and/or control signal connections for the MEMS microphone 10. A sealing ring 23 (also referred to as a "solder ring") is disposed on the lower surface 26 of the substrate 20. The sealing ring 23 can serve as a terminal pad, providing power, signal, control, and/or ground potential connections between the MEMS microphone 10 and an end user PCB 61. The sealing ring 23 is flat, like the terminal pads 21, and is configured to be mechanically coupled to a corresponding sealing ring 64 on the end user PCB 61 (not shown). Preferably, the coupling is made with solder, which, when molten, wicks around both sealing rings 23, 64 and provides an airtight seal between the two sealing rings 23, 64 when hardened. The solder provides electrical continuity between the sealing ring 23 and the corresponding sealing ring 64 on the end user PCB 61.

For the embodiments shown in FIGS. 2A and 2B, an encapsulant 14 (shown in outline form in the Figures for reasons of clarity) covers and protects the ASIC 12. The encapsulant 14 can be an epoxy-type material, or its equivalent, that envelops the ASIC 12 to protect it against light, debris, and corrosion-inducing moisture. The encapsulant 14 is dispensed during the manufacturing process, and the amount and location is controlled so the encapsulant 14 does not interfere with the MEMS microphone die 11 or block the acoustic pathway between the acoustic port 51 and the MEMS microphone die 11.

For the embodiments shown in FIGS. 2A and 2B, the joining of the cover 50 to the upper surface 25 of the substrate 20 creates the acoustic chamber 15. The interface between the cover 50 and the upper surface 25 of the substrate 20 is sealed during the manufacture of the MEMS microphone 10 to prevent leakage of acoustic pressure along the interface, which could result in improper operation of the MEMS microphone die 11. Materials such as solder or silver-impregnated conductive epoxy are used at seal the interface between the cover 50 and the upper surface 25 of the substrate 20. For the embodiments shown in FIGS. 2A and 2B, the base of the MEMS microphone die 11 is sealed to the upper surface 25 of the substrate 20 to prevent pressure leakage from the internal acoustic channel 16. Die attach epoxy, or other equivalent adhesives, are used to seal the base of the MEMS microphone die 11 to the upper surface 25 of the substrate 20.

Referring to FIG. 2A, the substrate 20 has an acoustic port 22 (also referred to as a "cavity") that allows acoustic energy to reach the diaphragm of the MEMS microphone die 11 through transducer's internal acoustic channel 16. The acoustic chamber 15 acts as the back volume for the diaphragm of the MEMS microphone die 11, and the interface between the cover 50 and the upper surface 25 of the substrate 20 is sealed to maintain acoustic pressure in the acoustic chamber 15 and to prevent leakage of acoustic pressure along the interface, which could result in improper operation of the MEMS microphone die 11. Materials such as solder or silver-impregnated conductive epoxy are used at seal the interface between the cover 50 and the upper surface 25 of the substrate 20. The front volume is the internal acoustic channel 16 of the MEMS microphone die 11 and the passage through the substrate 20 for the acoustic port 22.

As shown in FIG. 2A, an optional environmental barrier 44 can be associated with the acoustic port 22 to prevent moisture, dust, dirt particles, debris, and/or light from entering the acoustic port 22 and damaging the MEMS microphone die 11 or the ASIC 12. The environmental barrier 44 is adapted to allow acoustic energy to reach the diaphragm of the MEMS microphone die 11 through the acoustic port 22. In certain embodiments, the environmental barrier 44 can be formed from a sintered metal, fluoropolymer-based films such as polytetrafluoroethylene (PTFE) and expanded PTFE (ePTFE), metal mesh screen, single or multiple fabric layers, porous filter material, or any suitable acoustically transparent material that may be secured within the acoustic port 22, or covering the acoustic port 22, to prevent entry of moisture, dust, dirt particles, debris, and/or light into the acoustic chamber 15. See U.S. application Ser. Nos. 13/960, 392 and 14/354,020, each of which is incorporated by reference in its entirety and is assigned to Knowles. Alternatively, the substrate 20 may comprise a dielectric layer 35 (not shown) that can serve as an environmental barrier for the acoustic port 22. The dielectric layer 35 is an inner layer of the substrate 20, and is an acoustically transparent material. The dielectric layer 35, when functioning as an environmental barrier for the acoustic port 22, prevents the ingress of moisture, dust, dirt, and other types of debris.

Referring to FIG. 2B, the embodiment illustrated therein has two acoustic port, and is referred to as a directional MEMS microphone. In this embodiment, there is an acoustic port 22 in the substrate 20, and an acoustic port 51 in the cover 50. To provide protection for the MEMS microphone die 11 from light, debris, and moisture, the acoustic port 51 is offset from the position of the MEMS microphone die 11 within the acoustic chamber 15. To provide protection for the ASIC 12, the encapsulant 14 can be provided to protect the ASIC 12 against light, debris, and corrosion-inducing moisture. The encapsulant 14 is dispensed during the manufacturing process, and the amount and location is controlled so the encapsulant 14 does not interfere with the MEMS microphone die 11 or block the acoustic pathway between the acoustic port 51 and the MEMS microphone die 11.

The embodiment depicted in FIG. 2B includes an environmental barrier 44 in the acoustic port 22 in the substrate 20. In certain embodiments, the environmental barrier 44 can be formed from a sintered metal, fluoropolymer-based films such as polytetrafluoroethylene (PTFE) and expanded PTFE (ePTFE), metal mesh screen, single or multiple fabric layers, porous filter material, or any suitable acoustically transparent material that may be secured within the acoustic port 22, or covering the acoustic port 22, to prevent entry of moisture, dust, dirt particles, debris, and/or light into the acoustic chamber 15. Alternatively, the dielectric layer 35 (not shown) can be used as an environmental barrier in the acoustic port 22.

In the embodiment shown in FIG. 2B, the acoustic port 51 further comprises an ingress protection element 100 to prevent the ingress of dust and other particles into the acoustic chamber 15. The ingress protection element 100 limits the potential exposure of the MEMS microphone die 11 to debris that might enter the acoustic chamber 15 through the acoustic port 51. The ingress protection element 100 must be sized so it does not unduly interfere or restrict the air flow into the acoustic chamber, or interfere with the encapsulant 14 or the wiring 13 as shown in FIG. 2B. The ingress protection element 100 can be implemented in various ways (FIGS. 3A-3R), and the particular implementation illustrated in FIG. 2B is a formed offset member (FIGS. 3A-3D) embodiment. The ingress protection element is described in greater detail in the disclosure directed to the cover 50 and FIGS. 3A-3R. The embodiment disclosed in FIG. 2A is included to illustrate the difference between a bottom-port microphone (FIG. 2A) and a directional microphone (FIG. 2B) The microphone embodiment in FIG. 2A does not have the acoustic port 51 in its cover 50, and thus no need for the ingress protection element 100.

MEMS Microphone Die and ASIC

Certain components of the MEMS microphone 10 will now be discussed in greater detail. Unless otherwise specifically noted, all embodiments of the top-port, bottom-port, and directional MEMS microphones will include these components, or variations thereof.

Referring to FIGS. 1A and 2A, the MEMS microphone die 11 and the ASIC 12 are shown mounted on the upper surface 25 of the substrate 20. All embodiments of the top-port, bottom-port, and directional MEMS microphones will have a MEMS microphone die 11 and an ASIC 12. The ASIC 12 is any type of integrated circuit that performs any kind of processing function. In some embodiments, the ASIC 12 could be an analog buffer, or an analog amplifier. In other embodiments, the ASIC 12 could be a digital filtering circuit. Although the disclosed embodiments only show a single ASIC 12, it is understood that multiple ASICs could be used as well.

One type of MEMS microphone die 11 is a silicon micro-electro-mechanical system (MEMS) microphone die, as disclosed in U.S. Pat. Nos. 5,870,482 and 6,535,460, wherein the entirety of each patent is hereby incorporated by reference. A MEMS microphone die has a fixed backplate and a diaphragm that is mounted on a hinge, springs, or other structures that allow it to move. Capacitance changes between the fixed backplate and moveable diaphragm are amplified and output as an electrical signal representative of received acoustic energy. Another type of type of MEMS microphone die 11 is a MEMS microphone die as disclosed in U.S. Pat. No. 5,408,731, the entirety of which is hereby incorporated by reference. This type of MEMS microphone die has a fixed backplate and a diaphragm that flexes towards and away from the backplate based on the received acoustic energy. As with the MEMS microphone die, the capacitance changes between the fixed backplate and flexible diaphragm are amplified and output as an electrical signal representative of received acoustic energy.

The ASIC 12 in FIG. 1A detects capacitance changes in the MEMS microphone die 11, and outputs the detected changes as an electrical signal representative of the received acoustic energy. Preferably, the ASIC 12 has at least a power input $V_{DD}$, a ground potential input GND, a signal output $V_{OUT}$, a charge pump voltage output $V_{CP}$, and a signal input $V_{IN}$ from the MEMS microphone die. The ASIC 12 directs input voltage $V_{DD}$ to an internal charge pump, which raises the voltage to a level suitable to bias the fixed backplate of the MEMS microphone die 11. The diaphragm of the MEMS microphone die 11 is coupled to the signal input $V_{IN}$ of the ASIC 12, and processed and filtered using various filtering and amplifying techniques. The ASIC 12 can output an analog signal $V_{OUT}$ that is representative of the acoustic energy received by the MEMS microphone die 11. Alternatively, the ASIC 12 can output a digital signal representative of the acoustic energy received by the MEMS microphone die 11. For some digital output formats, the ASIC 12 may have to receive a clock signal ($CLK_{IN}$) to manage the output of digital data on the signal output $V_{OUT}$ pin. The $CLK_{IN}$ signal may be received on a terminal pad 21. In certain embodiments, the digital output formats use one or more terminal pads 21 to output a digital signal in a pulse-density modulation (PDM) format or an integrated inter-chip sound (I2S) format. The power input, the signal output, the clock (for digital outputs only), and the ground potential are electrically coupled, by wiring and electrical vias, to the terminal pads 21 on the lower surface 26 of the substrate 20. In certain embodiments, one of these electrical signals may be electrically coupled to the sealing ring 23 shown in FIG. 2A.

In an alternative embodiment, the MEMS microphone die 11 and the ASIC 12 are combined together into a single silicon die. More specifically, the circuitry for processing the electrical signal from the MEMS microphone die 11 is implemented on the silicon die that supports the MEMS microphone die 11. This embodiment combines the MEMS microphone die 11 and the ASIC 12 onto the same silicon die has an advantage in terms of saving space with the microphone package. However, one of the drawbacks is the combined MEMS microphone die/integrated circuit is very complex to manufacture, especially if the signal processing circuitry is realized using CMOS processes.

Can-Type Cover

Figure 3A:
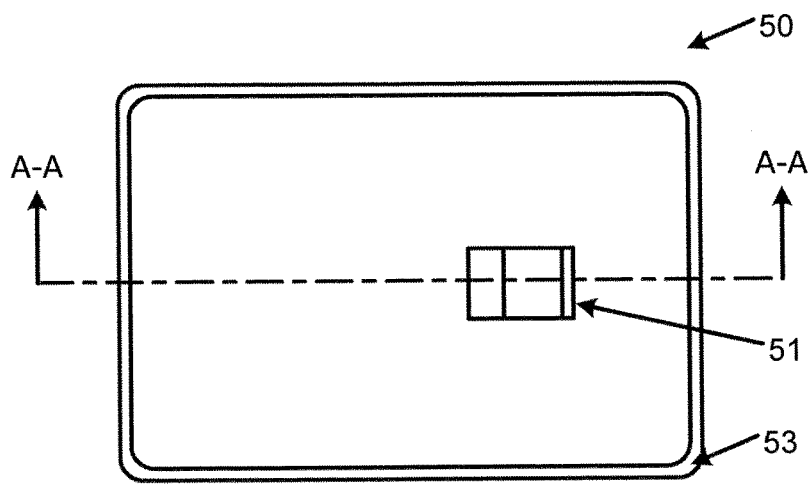
FIG. 3A is a plan view of a first embodiment of a can-type cover for a MEMS microphone according to the disclosed invention.

Referring to FIG. 3A, an embodiment of the cover 50 for the MEMS microphone 10 is shown, and is referred to as a "can" type cover. The can-type cover 50 will have an acoustic port 51 if the can-type cover 50 is being used on a top-port or directional MEMS microphone. The can-type cover 50 will not have an acoustic port 51 if the can-type cover 50 is being used on a bottom-port MEMS microphone product.

Figure 3B:
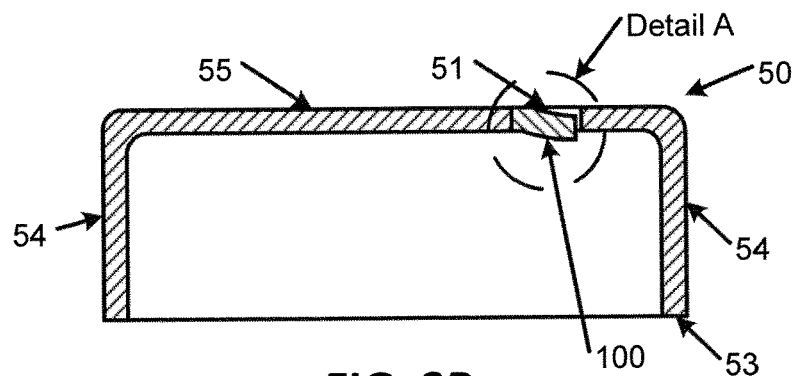
FIG. 3B is a longitudinal cross-sectional view of an embodiment of a can-type cover for a MEMS microphone according to the disclosed invention.
Figure 3C:
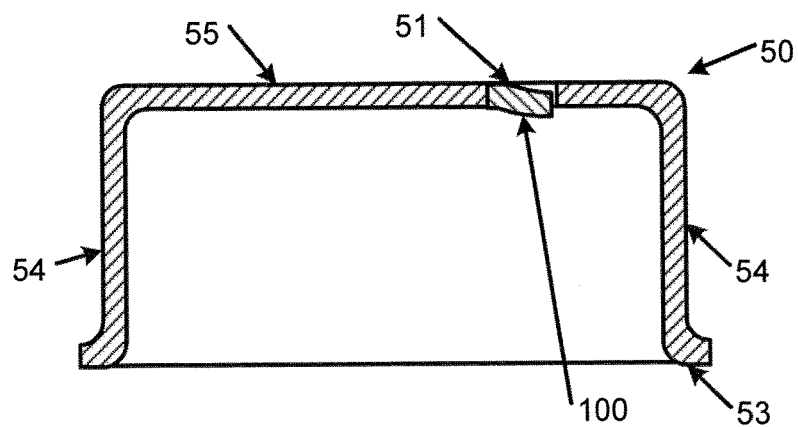
FIG. 3C is a longitudinal cross-sectional view of another embodiment of a can-type cover for a MEMS microphone according to the disclosed invention.

FIGS. 3B and 3C illustrate additional embodiments of the can-type cover 50 along the cross-section A-A of its longitudinal axis. Although the embodiments of the can-type cover 50 shown in FIGS. 3A-3D have substantially perpendicular sidewalls 54 (i.e., perpendicular to the top section 55 of the cover 50), other embodiments of the can-type cover 50 can have sidewalls 54 that are not substantially perpendicular to the top section 55. In addition, the corners between the sidewalls 54 and the top section 55 of the can-type cover 50, and the corners between respective sidewalls, can have a very sharp radius or a more gradual radius.

In FIG. 3B, the attachment surface 53 is a flat surface at the bottom of sidewall 54. During the assembly of a MEMS microphone 10, the attachment surface is mechanically coupled to the attachment ring 40 of the substrate 20. In FIG. 3C, an alternative embodiment of the attachment surface 53 is depicted. The attachment surface 53 is flared or curved to increase the surface area that is available for the attachment to the attachment ring 40 of the substrate 20.

In some embodiments of the can-type cover, the cover 50 is manufactured from one or more metals, or metal alloys, to help suppress electromagnetic interference and to lessen the electrical interference caused by such radiation. During the MEMS microphone assembly process, a metal can-type cover 50 is electrically coupled to the ground plane (or planes) in the substrate 20, and the ground plane in the substrate 20 is electrically coupled to a ground potential through the terminal pads 21 when mounted on a PCB 61. Electrical noise from nearby electronic components and currents induced in the metal can-type cover 50 by dynamically changing magnetic fields are conducted to ground potential. The metal can-type cover 50 operates in a manner similar to a Faraday cage to protect the MEMS microphone die 11 from potentially damaging electrical and magnetic fields. Suitable materials for the metal can-type cover 50 include copper, brass (copper-zinc alloy), stainless steel, or copper-nickel-zinc alloy, and, in a preferred embodiment, a stamping process is used to form the metal can-type cover 50 into the shape shown in FIGS. 3A-3D.

In some embodiments, a metal can-type cover 50 is plated with one or more metals to protect against corrosion and to facilitate the mechanical attachment of the metal can-type cover 50 to the substrate 20 during the assembly process. With the widespread use of lead-free solder, other materials may be plated (either electroless or electroplating) onto the base metal of the metal can-type cover 50 to facilitate a solid solder connection at the interface between the metal can-type cover 50 and the substrate 20. The plating materials include gold, nickel, palladium, tin, phosphorus, combinations of the foregoing list of metals, or other suitable metals. In some embodiments, the plating in on both sides of the metal can-type cover 50 (interior and exterior), and in other embodiments, the plating is only on one side (either exterior or interior). In other embodiments, the metal can-type cover 50 is partially plated to control solder creep. Referring to FIG. 3B, the partial plating on the metal can-type cover 50 would extend a predetermined distance above the attachment surface 53 (preferably 15-35% of the height of the cover 50). This partial plating allows control of the solder in its liquid form during the MEMS microphone manufacturing process. In some embodiments, not fully plating the metal can-type cover 50 prevents unwanted joint material (i.e., solder, silver-impregnated epoxy, or other conductive adhesive material) from entering areas or volumes that are desirably kept free of this unwanted material, thereby preventing damage to internal components. For example, if a partially plated metal can-type cover 50 is being attached to a substrate 20 with solder as the joint material, the solder, when liquefied, will not be wicked across the surfaces of the metal can-type cover 50 beyond those portions that are plated. In other embodiments of the metal can-type cover 50, instead of plating, portions of the metal can-type cover 50 are constructed using materials that will limit the creeping of liquid solder and thus prevent the solder from entering areas or volumes that are desirably kept solder-free. For example, the attachment surface 53 (and the area immediately adjacent) could be constructed from a copper-nickel-zinc alloy, while the remainder of the metal can-type cover 50 could be constructed from brass. See U.S. application Ser. Nos. 13/949,337 and 14/220,614, each of which is incorporated by reference in its entirety and is assigned to Knowles.

Other embodiments of the can-type cover 50 may be constructed from non-metallic materials, such as injection-molded plastic or ceramics. In order to provide electromagnetic shielding similar to the shielding provided by a metal can-type cover, a non-metallic can-type cover 50 would have to be plated with one or more plating materials, such as gold, nickel, palladium, tin, phosphorus, combinations of the foregoing list of metals, or other suitable metals to provide sufficient electromagnetic shielding for the MEMS microphone die 11 and the ASIC 12. The plating would assist in the mechanical coupling of the non-metallic can-type cover 50 to the substrate 20, as the attachment surface 53 of the non-metallic can-type cover 50 would be plated with metal. The plating on attachment surface 53 would allow the non-metallic can-type cover 50 to be attached to the attachment ring 40 of the substrate 20 with solder.

Figure 3D:
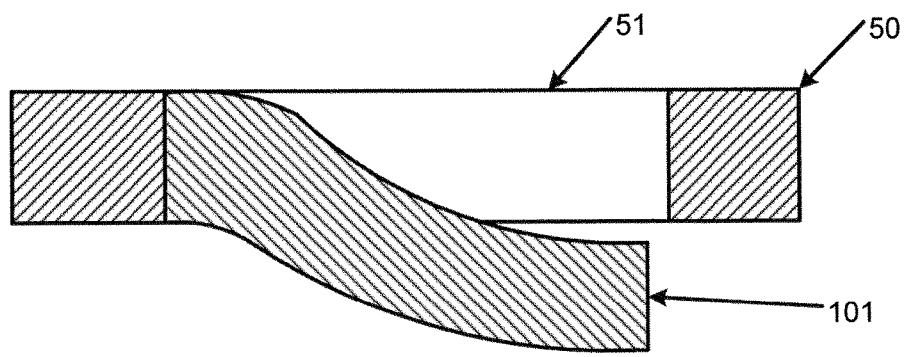
FIG. 3D is a longitudinal cross-sectional view of another embodiment of a can-type cover for a MEMS microphone according to the disclosed invention.
Figure 3E:
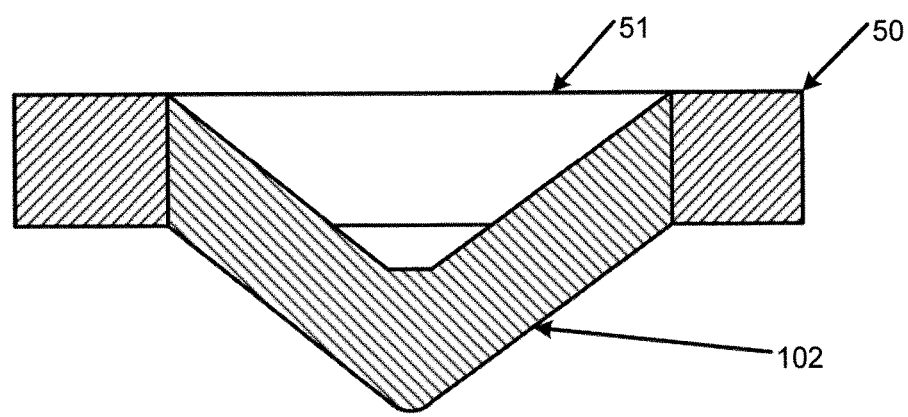
FIG. 3E is a longitudinal cross-sectional view of another embodiment of a can-type cover for a MEMS microphone according to the disclosed invention.
Figure 3F:
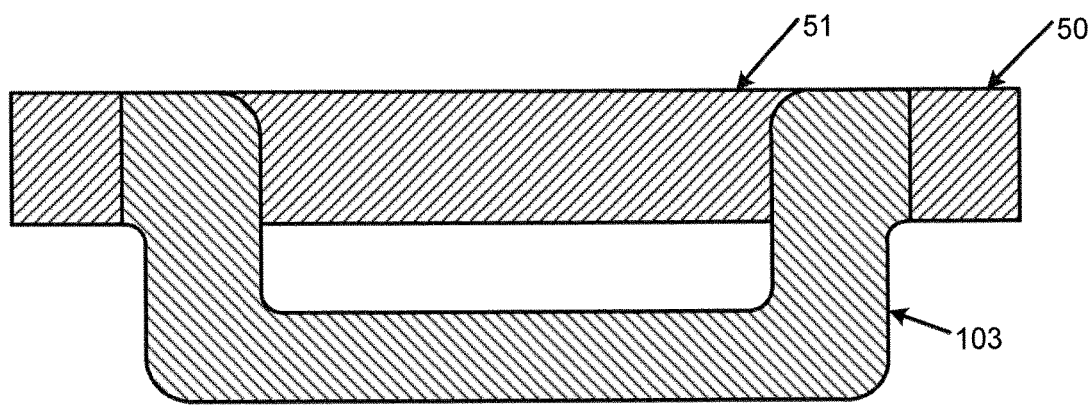
FIG. 3F is a longitudinal cross-sectional view of another embodiment of a can-type cover for a MEMS microphone according to the disclosed invention.
Figures 1, 3G:
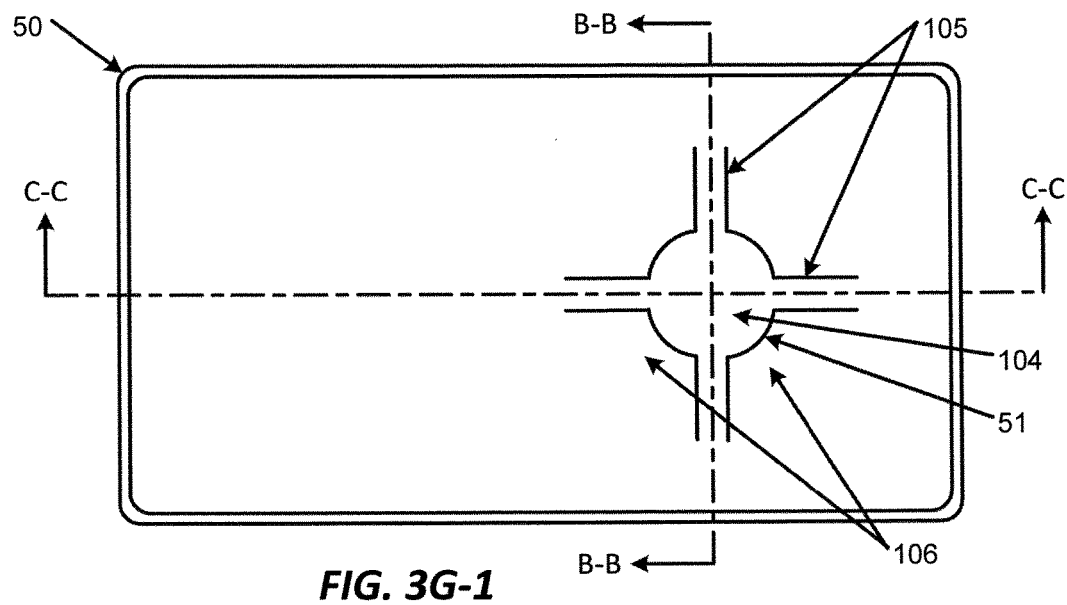
FIGS. 3G-1 to 3G-3 are views of another embodiment of a can-type cover for a MEMS microphone according to the disclosed invention.
Figures 2, 3G:
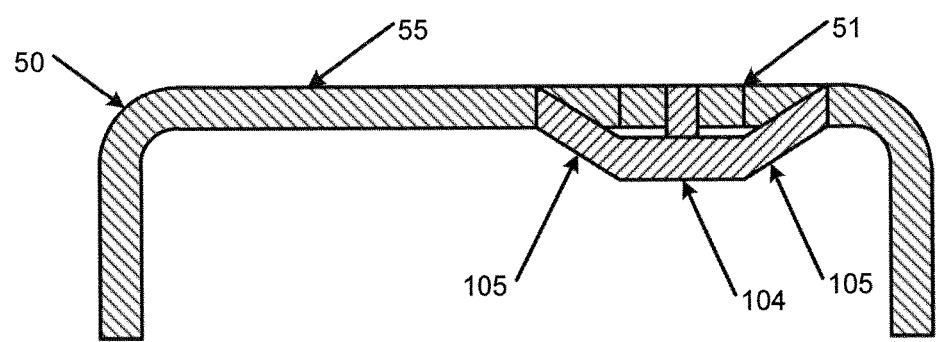
Figures 3, 3G:
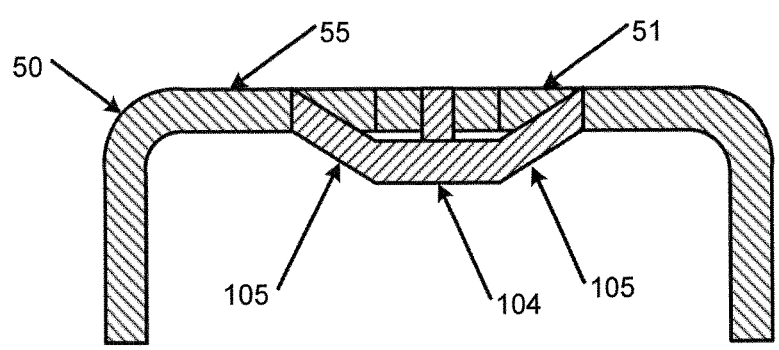
Figures 1, 3H:
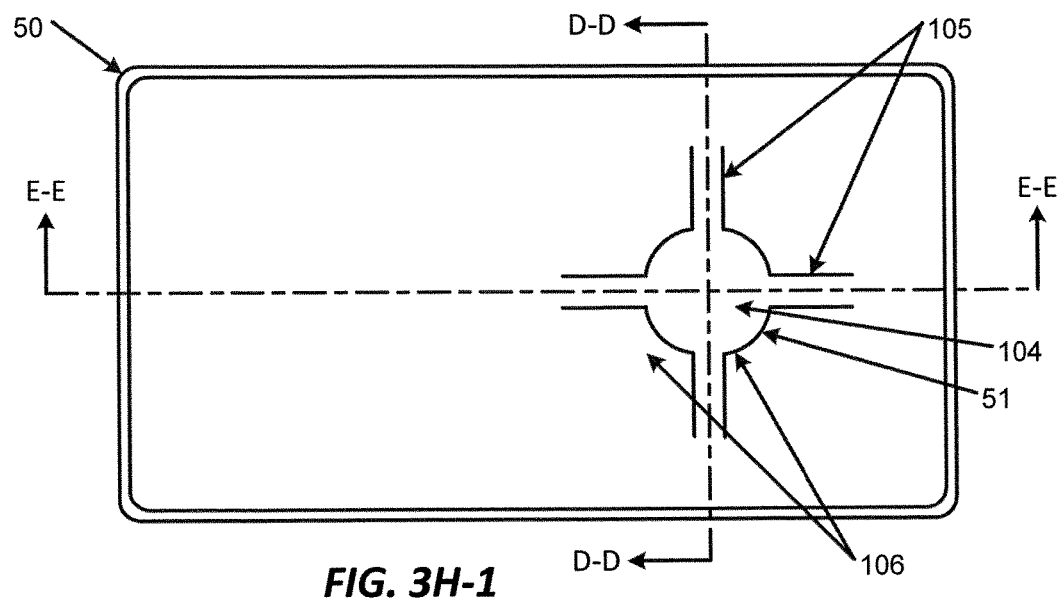
Figures 2, 3H:
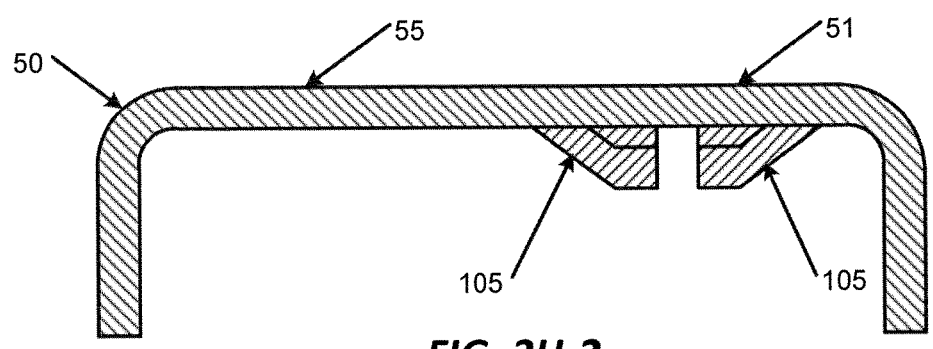
Figures 3, 3H:
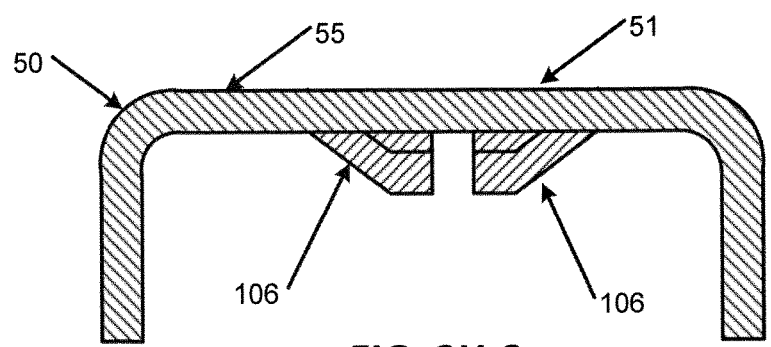
Figures 1, 3J:
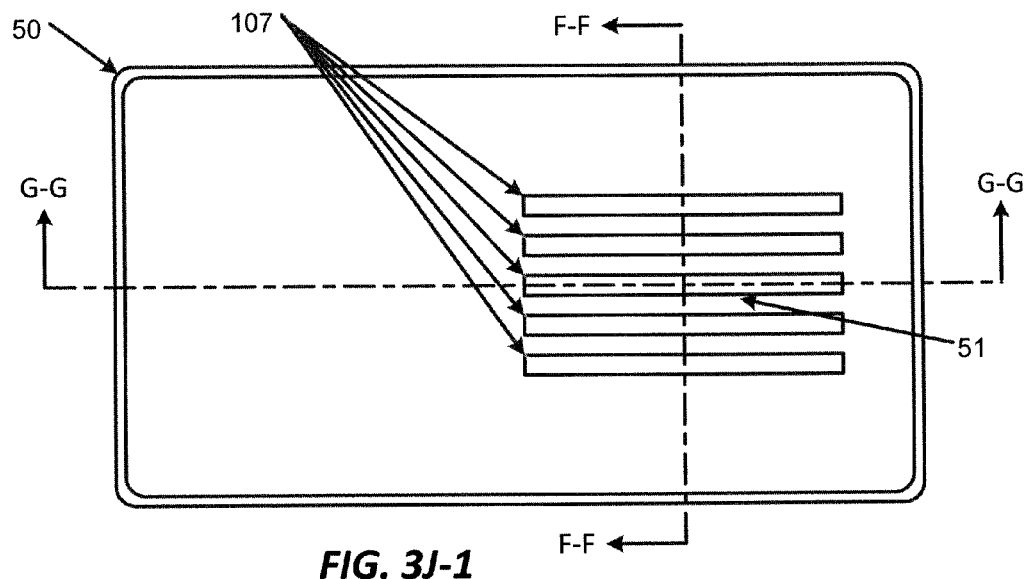
Figures 2, 3J:
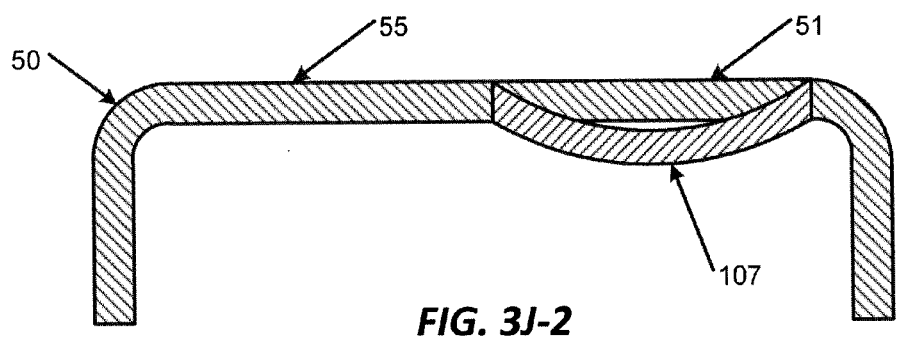
Figures 3, 3J:
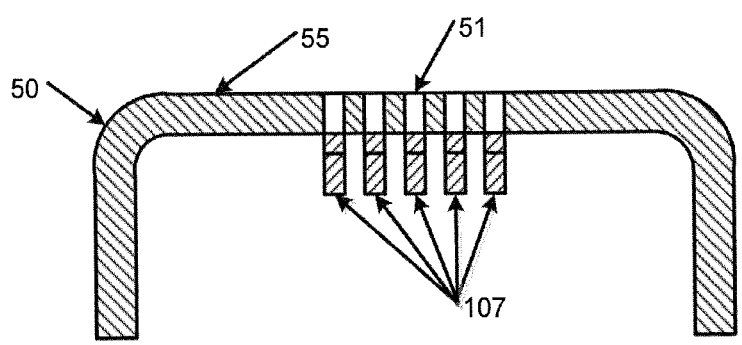
Figures 1, 3K:
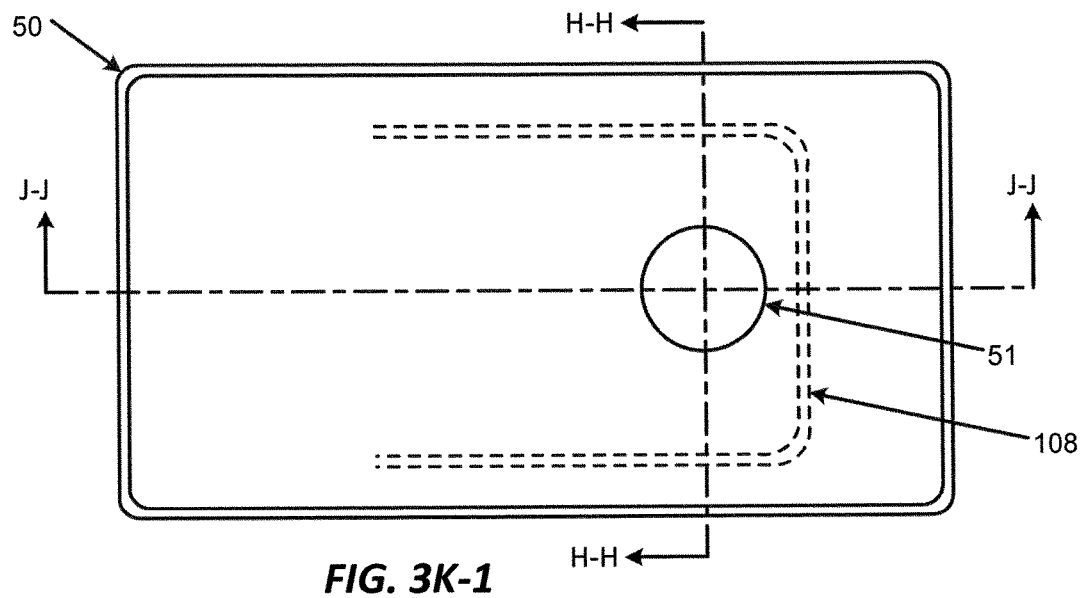
Figures 2, 3K:
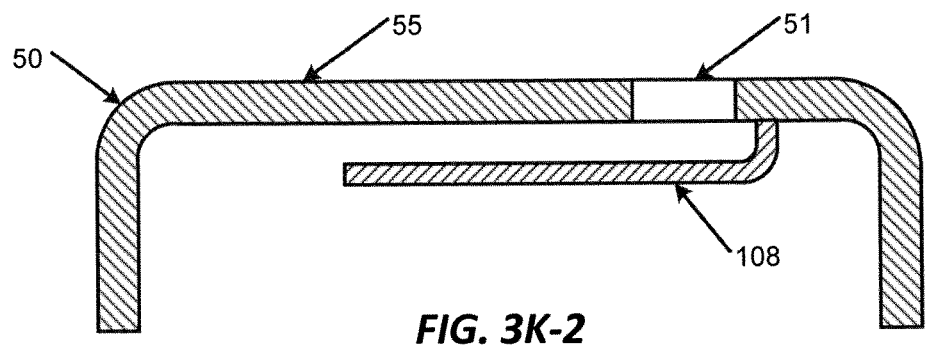
Figures 3, 3K:
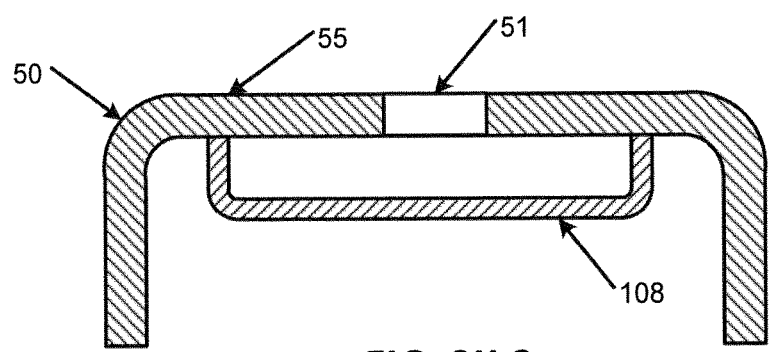
Figures 1, 3L:
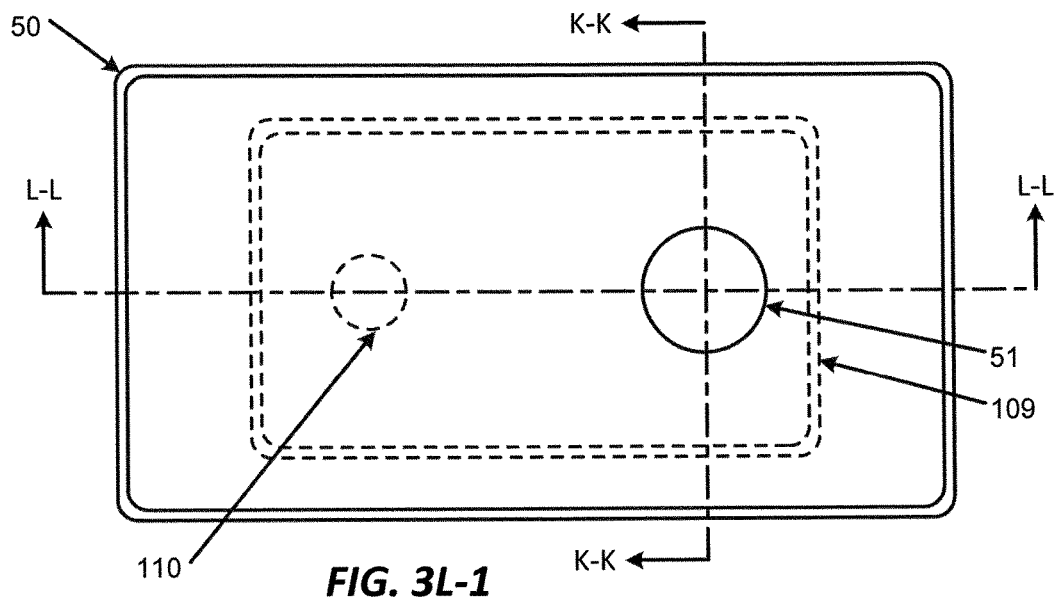
Figures 2, 3L:
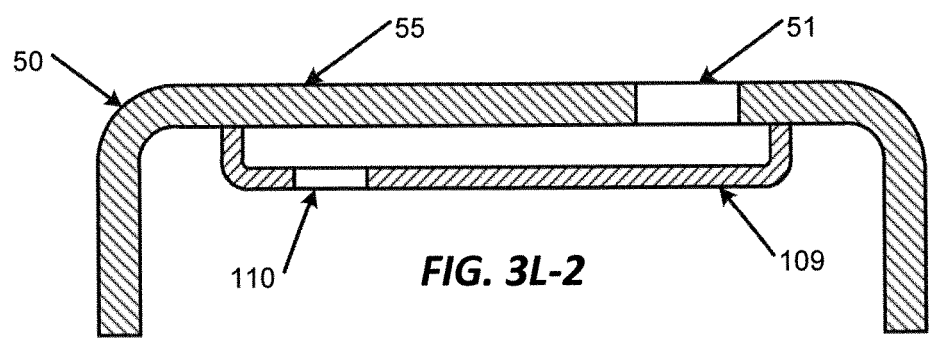
Figures 3, 3L:
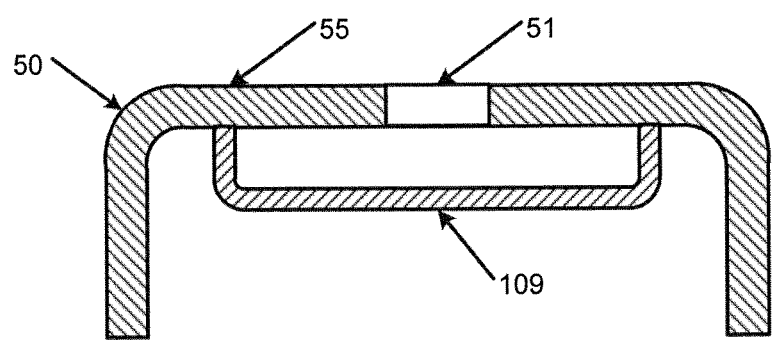
Figures 1, 3M:
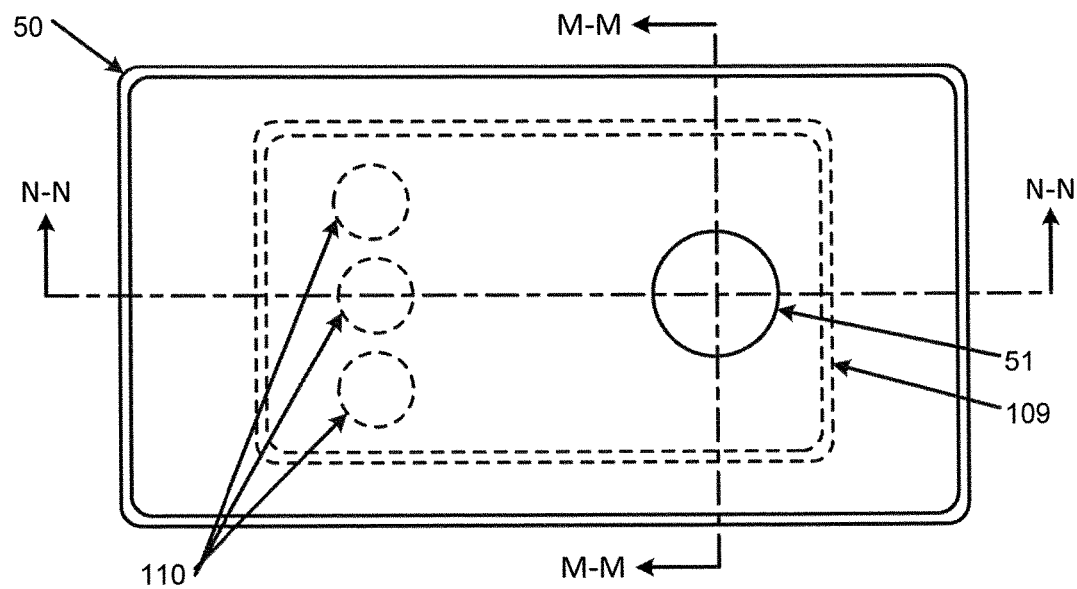
Figures 2, 3M:
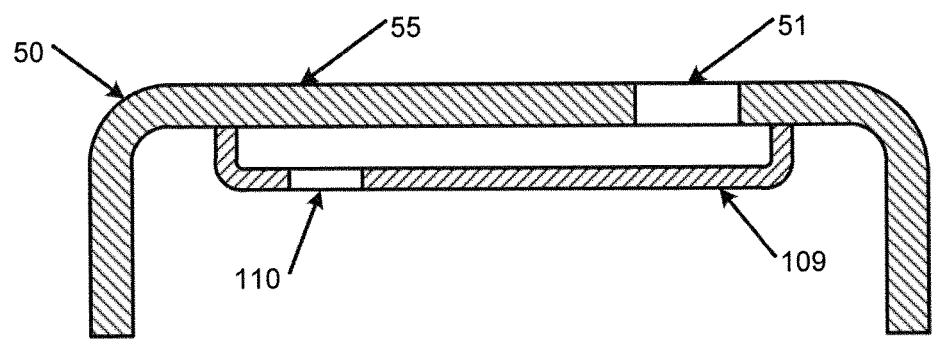
Figures 3, 3M:
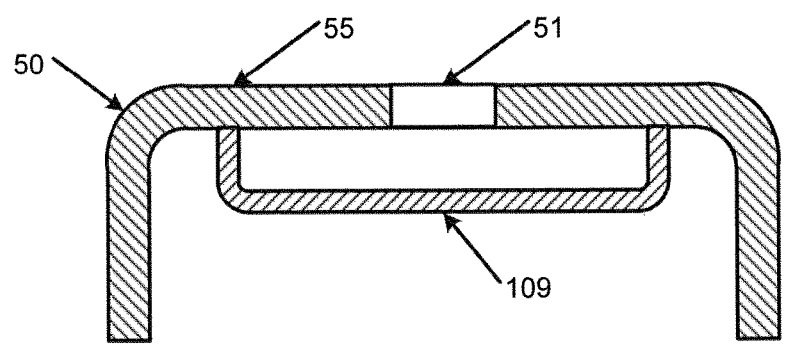
Figures 1, 3N:
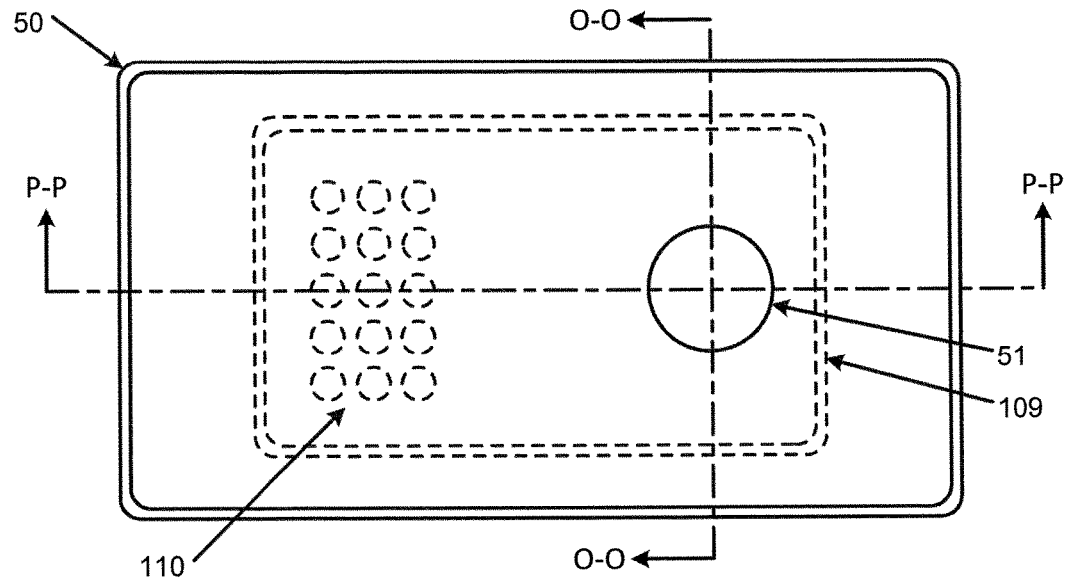
Figures 2, 3N:
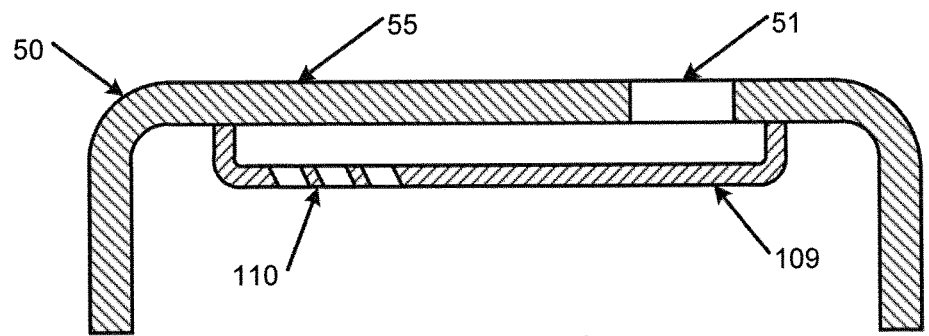
Figures 3, 3N:
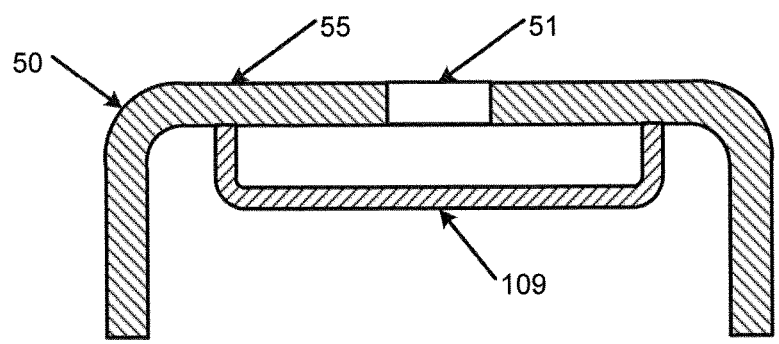
Figures 1, 3P:
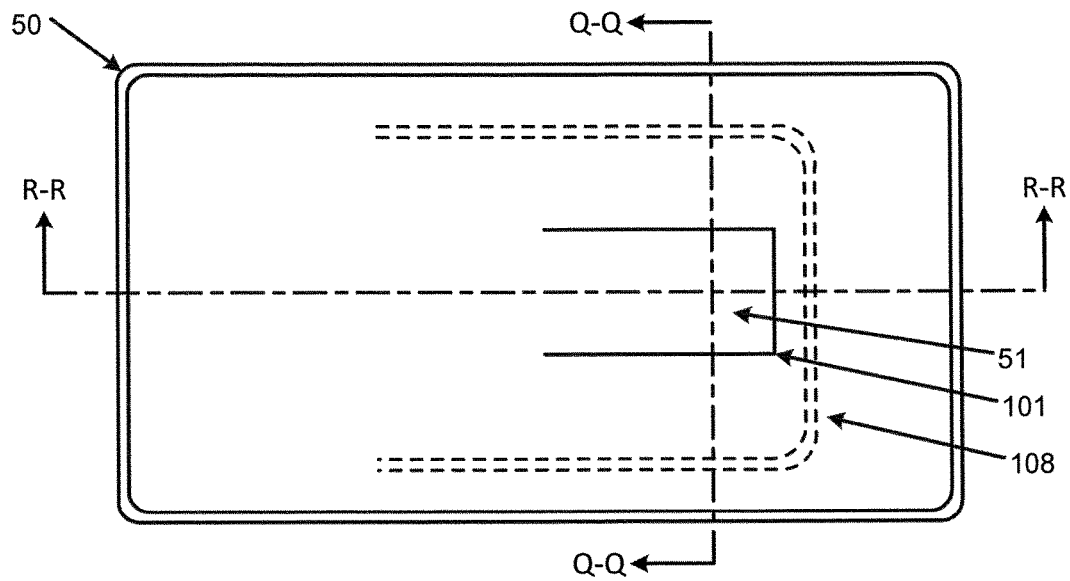
Figures 2, 3P:
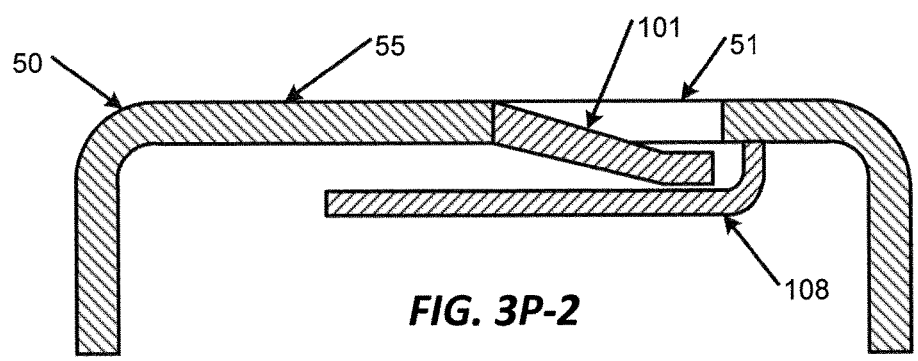
Figures 3, 3P:
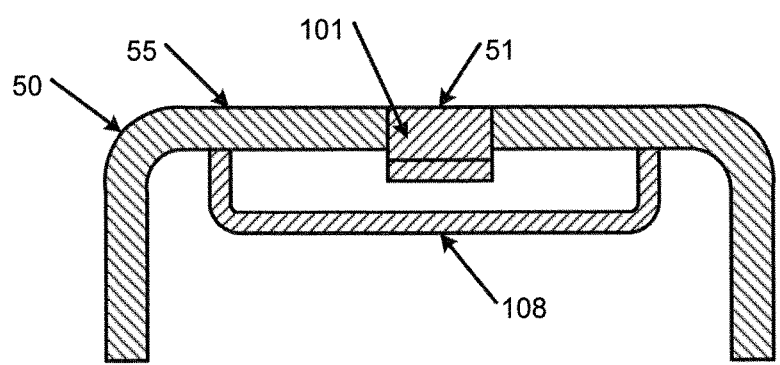
Figures 1, 3Q:
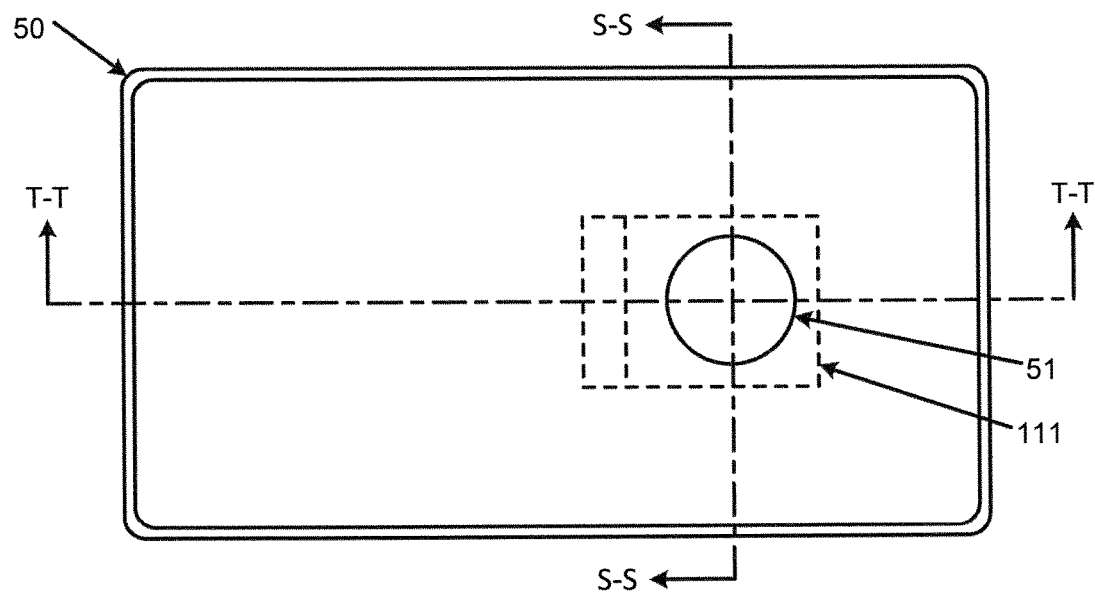
Figures 2, 3Q:
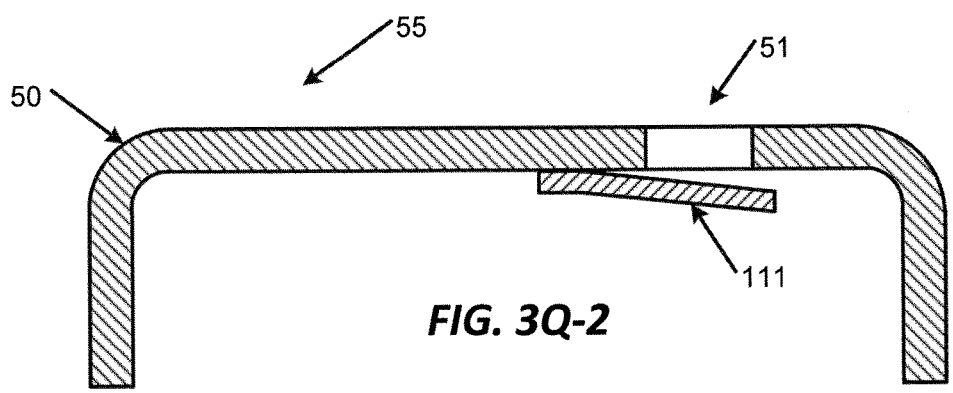
Figures 3, 3Q:
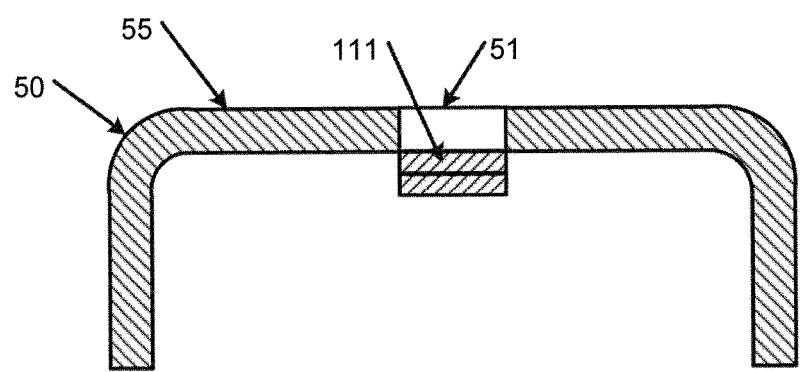
Figures 1, 3R:
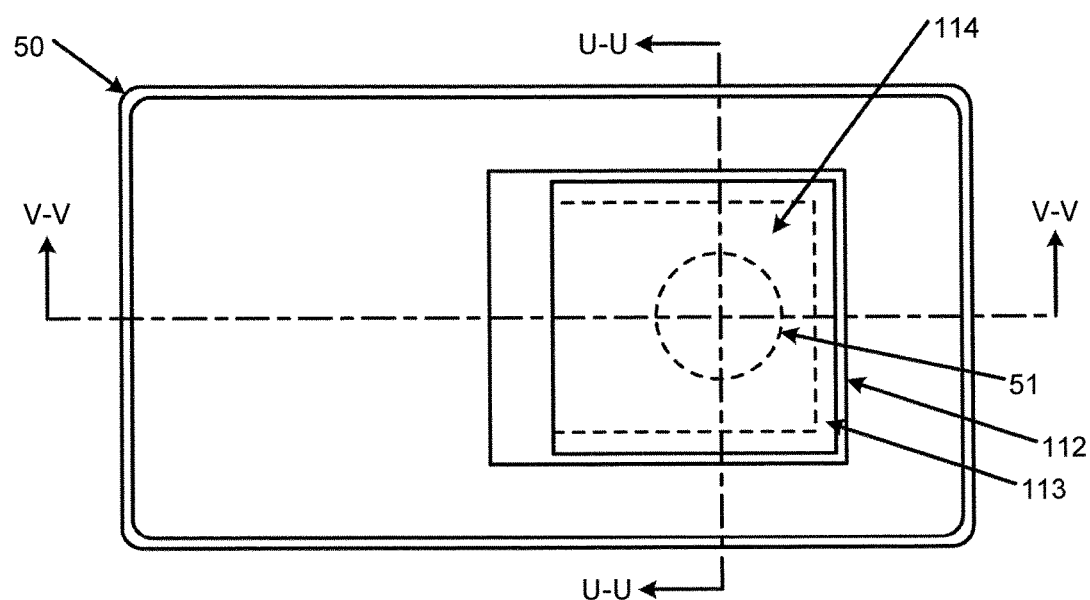
Figures 2, 3R:
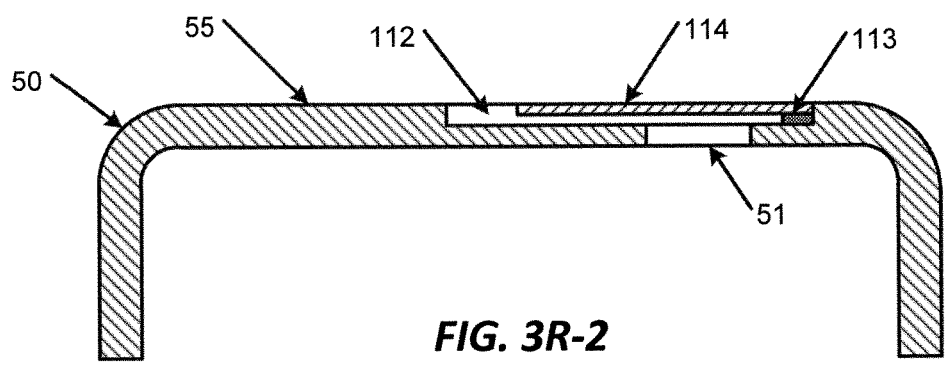
Figures 3, 3R:
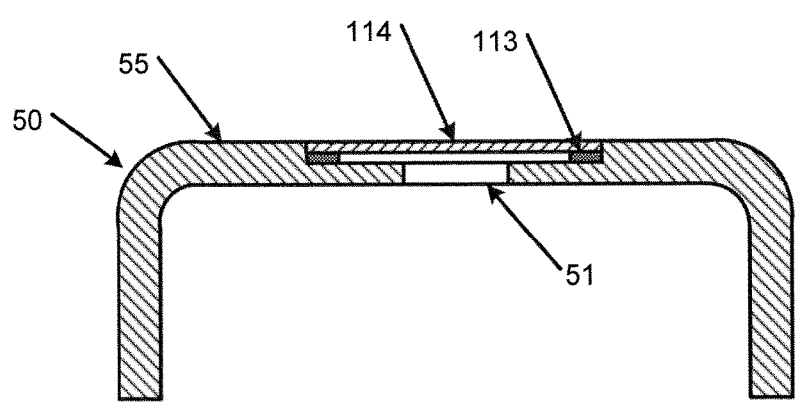

As shown in FIGS. 3A through 3R, an ingress protection element 100 has been implemented in, or around, the acoustic port 51 in the can-type cover 50. There are many embodiments of the ingress protection element 100, and its function is to make it more difficult for contaminants, such as dust, dirt, fibers, and other debris, from passing though the acoustic port 51, into the acoustic chamber 15, and damage the MEMS microphone die 10 or the integrated circuit 12. Unlike an environmental barrier 44 (FIG. 2A) that completely covers an acoustic port, the ingress protection element 100 creates a more difficult path for the contaminant to first traverse before reaching the acoustic chamber 15. As will be shown in the following Figures, the ingress protection element 100 can be formed from the material the comprises the can-type cover 50, the ingress protection element 100 can be a separate component (or components) attached to the can-type cover 50, or the ingress protection element 100 can be a combination of the two types, e.g., formed from the material comprising the can-type cover 50 and a separately attached component (or components).

Referring to FIGS. 3A to 3C, a first embodiment of the ingress protection element 100 is illustrated. This type of ingress protection element 100 is referred to as a formed step offset member 101. The formed step offset member 101 is manufactured by using a specially formed punch that will create the formed step offset member 101 from the material of the can-type cover 50. The formed step offset member 101 can be formed in materials that are suitable for punch-type operations. If the can-type cover 50 is formed from a material that is not suitable for punch-type operations, such as plastic or ceramic, the formed step offset member 101 could be formed by machining the mold for the plastic or ceramic can-type cover 50 such that a formed step offset member 101 will be realized in the can-type cover 50 after the molding process is complete.

Referring to FIG. 3A, a top view of the can-type cover 50 with a formed step offset member 101 is shown. A can-type cover 50 will usually have a round acoustic port 51, preferably with a diameter of approximately 0.5 millimeters and a surface area of approximately 0.19 square millimeters. In an embodiment of a can-type cover 50 with a formed step offset member 101, preferably the measurements of the formed step offset member 101 are 0.800 millimeters×0.450 millimeters, and the acoustic port 51 now has a rectangular, as opposed to circular, shape. Referring to FIGS. 3B and 3C, the cross-sectional view along section line A-A shows the formed step offset member 101 bent down towards the interior of two different embodiments of the can-type cover 50.

Referring to FIG. 3D, the Detail A of FIG. 3B is shown. Preferably, the formed step offset member 101 is bent down at an angle of 15 degrees, but other angles can be used as well. Preferably, the bottom surface of the formed step offset member 101 does not intrude into the interior of the can-type cover 50 by more than 0.2 millimeters. A larger intrusion into the interior of the can-type cover 50 could interfere with the encapsulant 14 over the ASIC 12, or lessen the effectiveness of the formed step offset member 101.

Referring to FIG. 3E, another embodiment of the ingress protection element 100 is illustrated. This type of ingress protection element 100 is referred to as a V-side shear member 102. The V-side shear member 102 is manufactured by using a specially formed punch that will create the V-side shear member 102 from the material of the can-type cover 50. The V-side shear member 102 can be formed in materials that are suitable for punch-type operations. If the can-type cover 50 is formed from a material that is not suitable for punch-type operations, such as plastic or ceramic, the V-side shear member 102 could be formed by machining the mold for the plastic or ceramic can-type cover 50 such that a V-side shear member 102 will be realized in the can-type cover 50 after the molding process is complete.

In an embodiment of a can-type cover 50 with a V-side shear member 102, preferably the measurements of the V-side shear member 102 are 0.800 millimeters×0.500 millimeters, and the acoustic port 51 now has a rectangular, as opposed to circular, shape. Preferably, the V-side shear member 102 is bent down at an angle of 15 degrees, but other angles can be used as well. Preferably, the bottom point of the V-side shear member 102 does not intrude into the interior of the can-type cover 50 by more than 0.36 millimeters. A larger intrusion into the interior of the can-type cover 50 could lessen the effectiveness of the V-side shear member 102. An intrusion this deep into the interior of the can-type cover 50 usually means that no encapsulant 14 will be used on the ASIC 12. However, the width and length of the V-side shear member 102 does provide protection to the ASIC 12, at least in the form of limiting the amount of light that can impinge on the ASIC 12.

Referring to FIG. 3F, another embodiment of the ingress protection element 100 is illustrated. This type of ingress protection element 100 is referred to as a flat-bottom side shear member 103. The flat-bottom side shear member 103 is manufactured by using a specially formed punch that will create the flat-bottom side shear member 103 from the material of the can-type cover 50. The flat-bottom side shear member 103 can be formed in materials that are suitable for punch-type operations. If the can-type cover 50 is formed from a material that is not suitable for punch-type operations, such as plastic or ceramic, the flat-bottom side shear member 103 could be formed by machining the mold for the plastic or ceramic can-type cover 50 such that a flat-bottom side shear member 103 will be realized in the can-type cover 50 after the molding process is complete.

In an embodiment of a can-type cover 50 with a flat-bottom side shear member 103, preferably the measurements of the flat-bottom side shear member 103 are 0.800 millimeters×0.500 millimeters, and the acoustic port 51 now has a rectangular, as opposed to circular, shape. Preferably, the flat-bottom side shear member 103 is bent down at an angle of 90 degrees. Preferably, the flat bottom of the flat-bottom side shear member 103 does not intrude into the interior of the can-type cover 50 by more than 0.30 millimeters. A larger intrusion into the interior of the can-type cover 50 could lessen the effectiveness of the flat-bottom side shear member 103. An intrusion this deep the interior of the can-type cover 50 usually means that no encapsulant 14 will be used on the ASIC 12. However, the width and length of the flat-bottom side shear member 103 does provide protection to the ASIC 12, at least in the form of limiting the amount of light that can impinge on the ASIC 12.

Referring to FIGS. 3G-1 to 3G-3, another embodiment of the ingress protection element 100 is illustrated. This type of ingress protection element 100 is referred to as a center-cross member 104. The center-cross member 104 is manufactured by using a specially formed punch that will create the center-cross member 104 from the material of the can-type cover 50. The center portion of the center-cross member 104 will have multiple center-cross legs 105 that attach the center portion of the center-cross member 104 to the can-type cover 50. The center-cross tabs 106 are the result of the center-cross member 104 being pressed towards the interior of the can-type cover 50. The center-cross tabs 106 remain in the same surface plane as the top section 55 of the can-type cover 50. This embodiment of the center-cross member 104 can be formed in materials that are suitable for punch-type operations. If the can-type cover 50 is formed from a material that is not suitable for punch-type operations, such as plastic or ceramic, the center-cross member 104 could be formed by machining the mold for the plastic or ceramic can-type cover 50 such that a center-cross member 104 will be realized in the can-type cover 50 after the molding process is complete.

In an embodiment of a can-type cover 50 with a center-cross member 104, preferably the bottom of the center-cross member 104 does not intrude into the interior of the can-type cover 50 by more than 0.30 millimeters. The cross-sectional views along section lines B-B and C-C, as shown in FIGS. 3G-2 and 3G-3, depict the intrusion into the interior of the can-type cover 50 by the center-cross member 104. A larger intrusion into the interior of the can-type cover 50 could lessen the effectiveness of the center-cross member 104. An intrusion this deep the interior of the can-type cover 50 usually means that no encapsulant 14 will be used on the ASIC 12. However, the width and length of the center-cross member 104 does provide protection to the ASIC 12, at least in the form of limiting the amount of light that can impinge on the ASIC 12.

Referring to FIGS. 3H-1 to 3H-3, another embodiment of the ingress protection element 100 is illustrated. This type of ingress protection element 100 is referred to as a center-cross member 104. The center-cross member 104 is manufactured by using a specially formed punch that will create the center-cross member 104 from the material of the can-type cover 50. The center portion of the center-cross member 104 will have multiple center-cross legs 105 that attach the center portion of the center-cross member 104 to the can-type cover 50. This embodiment differs from the center-cross member 104 shown in FIGS. 3G-1 to 3G-3 in that the center-cross member 104 and the center-cross legs 105 remain in the same surface plane as the top section 55 of the can-type cover 50. The center-cross tabs 106 are pressed towards the interior of the can-type cover 50. This embodiment of the center-cross member 104 can be formed in materials that are suitable for punch-type operations. If the can-type cover 50 is formed from a material that is not suitable for punch-type operations, such as plastic or ceramic, the center-cross member 104 could be formed by machining the mold for the plastic or ceramic can-type cover 50 such that a center-cross member 104 will be realized in the can-type cover 50 after the molding process is complete.

In an embodiment of a can-type cover 50 with a center-cross member 104, preferably the bottom tips of the center-cross tabs 106 do not intrude into the interior of the can-type cover 50 by more than 0.30 millimeters. The cross-sectional views along section lines D-D and E-E, as shown in FIGS. 3H-2 and 3H-3, depict the intrusion into the interior of the can-type cover 50 by the center-cross tabs 106. A larger intrusion into the interior of the can-type cover 50 could lessen the effectiveness of the center-cross member 104. An intrusion this deep the interior of the can-type cover 50 usually means that no encapsulant 14 will be used on the ASIC 12. However, the width and length of the center-cross member 104 does provide protection to the ASIC 12, at least in the form of limiting the amount of light that can impinge on the ASIC 12.

Referring to FIGS. 3J-1 to 3J-3, another embodiment of the ingress protection element 100 is illustrated. This type of ingress protection element 100 is referred to as a half-circle shear member 107. As shown in FIGS. 3J-1 to 3J-3, multiple half-circle shear members 107 are used to form the acoustic port 51. Embodiments of this ingress protection element 100 can have one half-circle shear member 107, or can have a plurality of half-circle shear members 107 spaced out across the top section 55 of the can-type cover 50. The half-circle shear member 107 is manufactured by using a specially formed punch that will create the half-circle shear member 107 from the material of the can-type cover 50. This embodiment of the ingress protection element 100 can be formed in materials that are suitable for punch-type operations. If the can-type cover 50 is formed from a material that is not suitable for punch-type operations, such as plastic or ceramic, one or more half-circle shear members 107 could be formed by machining the mold for the plastic or ceramic can-type cover 50 such that one or more half-circle shear members 107 will be realized in the can-type cover 50 after the molding process is complete.

In an embodiment of a can-type cover 50 with one or more half-circle shear members 107, preferably the bottom curve of the half-circle shear member 107 does not intrude into the interior of the can-type cover 50 by more than 0.20 millimeters. The cross-sectional views along section lines F-F and G-G, as shown in FIGS. 3J-2 and 3J-3, depict the intrusion into the interior of the can-type cover 50 by a plurality of half-circle shear members 107. A larger intrusion into the interior of the can-type cover 50 could interfere with the encapsulant 14 over the ASIC 12, or lessen the effectiveness of the half-circle shear member 107.

Referring to FIGS. 3K-1 to 3K-3, another embodiment of the ingress protection element 100 is illustrated. In FIG. 3K-1, the top view of the can-type cover 50 is shown, with the acoustic port 51 having a three-quarters shield 108 being mounted on the interior surface of the top section 55 of the can-type cover 50. The three-quarters shield 108 has three sides, and the portion of the three-quarters shield 108 disposed adjacent to the ASIC die 12 is open to allow acoustic pressure to reach the MEMS microphone die 11. The purpose of the three-quarters shield 108 is to create an enclosed path into the acoustic chamber 15, so dirt, dust, and other particulates entering through the acoustic port 51 have to reach the open end of the three-quarters shield 108 before they could potentially damage the MEMS microphone die 11. In FIG. 3K-1, the dotted lines indicate the location of the three-quarters shield 108 with respect to the acoustic port 51. The width and length of the three-quarters shield 108 should be such that the three-quarters shield 108 fits within the confines of the can-type cover 50, and does not interfere with air flow into the acoustic chamber 15. As shown in FIG. 3K-2, the cross-sectional view along section lines J-J shows that the three-quarters shield 108 extends from the acoustic port 51 towards the location of the ASIC die 12 in the acoustic chamber 15. The open-end portion of the three-quarters shield 108 is positioned above or near the ASIC die 12, and the positioning is a function of the length of the three-quarters shield 108, and its positional relationship with the acoustic port 51. As shown in FIG. 3K-3, the cross-sectional view along section lines H-H shows the preferred positioning of the three-quarters shield 108 with respect to the acoustic port 51. Although not shown in FIGS. 3K-2 and 3K-3, the three-quarters shield 108 should not interfere with the wiring 13 or the encapsulant 14 that will be present in the acoustic chamber 15.

The three-quarters shield 108 can be constructed from metals, plastics, polymers, or other suitable materials. The three-quarters shield 108 can be attached to the interior surface of the top section 55 of the can-type cover 50 with solders, epoxy, or other suitable adhesives. If an adhesive is used, it preferably does not have any outgassing characteristics that could damage other components mounted inside the acoustic chamber 15, such as the MEMS microphone die 11. If the three-quarters shield 108 is constructed from a metal material, preferably it is mounted to the interior surface of the top section 55 of the can-type cover 50 with solder or epoxy. If the three-quarters shield 108 is constructed from a plastic or polymer material, preferably it is mounted to the interior surface of the top section 55 of the can-type cover 50 with a suitable epoxy or other similar adhesive. If the can-type cover 50 is constructed from a plastic or polymer, or is a laminate-type cover, then a suitable epoxy or other similar adhesive is the preferable method for mounting the three-quarters shield 108 to the interior surface of the top section 55 of the can-type cover 50.

Referring to FIGS. 3L-1 to 3L-3, another embodiment of the ingress protection element 100 is illustrated. In FIG. 3L-1, the top view of the can-type cover 50 is shown, with the acoustic port 51 having a full shield 109 being mounted on the interior surface of the top section 55 of the can-type cover 50. The full shield 109 has four sides, and the portion of the full shield 109 disposed adjacent to the ASIC die 12 has a shield aperture 110 to allow acoustic pressure to reach the MEMS microphone die 11. In the embodiment shown, the shield aperture 110 is disposed along the centerline of the full shield 109, although, in other embodiments, the shield aperture 110 can be disposed in offset positions from the centerline of the full shield 109. The purpose of the full shield 109 is to create an enclosed path into the acoustic chamber 15, so dirt, dust, and other particulates entering through the acoustic port 51 have to reach the shield aperture 110 before they could potentially damage the MEMS microphone die 11. In FIG. 3L-1, the dotted lines indicate the location of the full shield 109 with respect to the acoustic port 51. The width and length of the full shield 109 should be such that the full shield 109 fits within the confines of the can-type cover 50, and does not interfere with air flow into the acoustic chamber 15. As shown in FIG. 3L-2, the cross-sectional view along section lines L-L shows that the full shield 109 extends from the acoustic port 51 towards the location of the ASIC die 12 in the acoustic chamber 15. The shield aperture 110 of the full shield 109 is positioned directly above or near the ASIC die 12, and the positioning is a function of the length of the full shield 109, and its positional relationship with the acoustic port 51. As shown in FIG. 3L-3, the cross-sectional view along section lines K-K shows the preferred positioning of the full shield 109 with respect to the acoustic port 51. Although not shown in FIGS. 3L-2 and 3L-3, the full shield 109 should not interfere with the wiring 13 or the encapsulant 14 that will be present in the acoustic chamber 15.

The full shield 109 can be constructed from metals, plastics, polymers, or other suitable materials. The full shield 109 can be attached to the interior surface of the top section 55 of the can-type cover 50 with solders, epoxy, or other suitable adhesives. If an adhesive is used, it preferably does not have any outgassing characteristics that could damage other components mounted inside the acoustic chamber 15, such as the MEMS microphone die 11. If the full shield 109 is constructed from a metal material, preferably it is mounted to the interior surface of the top section 55 of the can-type cover 50 with solder or epoxy. If the full shield 109 is constructed from a plastic or polymer material, preferably it is mounted to the interior surface of the top section 55 of the can-type cover 50 with a suitable epoxy or other similar adhesive. If the can-type cover 50 is constructed from a plastic or polymer, or is a laminate-type cover, then a suitable epoxy or other similar adhesive is the preferable method for mounting the full shield 109 to the interior surface of the top section 55 of the can-type cover 50.

Referring to FIGS. 3M-1 to 3M-3, another embodiment of the ingress protection element 100 is illustrated. In FIG. 3M-1, the top view of the can-type cover 50 is shown, with the acoustic port 51 having a full shield 109 being mounted on the interior surface of the top section 55 of the can-type cover 50. The full shield 109 has four sides, and the portion of the full shield 109 disposed adjacent to the ASIC die 12 has a plurality of shield apertures no to allow acoustic pressure to reach the MEMS microphone die 11. The embodiment of the ingress protection invention is illustrated in FIGS. 3L-1 to 3L-3 had a single shield aperture no disposed along the centerline of the full shield 109. The purpose of the full shield 109 is to create an enclosed path into the acoustic chamber is, so dirt, dust, and other particulates entering through the acoustic port 51 have to reach the shield apertures no before they could potentially damage the MEMS microphone die 11. In FIG. 3M-1, the dotted lines indicate the location of the full shield 109 with respect to the acoustic port 51. The width and length of the full shield 109 should be such that the full shield 109 fits within the confines of the can-type cover 50, and does not interfere with air flow into the acoustic chamber 15. As shown in FIG. 3M-2, the cross-sectional view along section lines L-L shows that the full shield 109 extends from the acoustic port 51 towards the location of the ASIC die 12 in the acoustic chamber 15. The shield apertures no of the full shield 109 are positioned directly above or near the ASIC die 12, and the positioning is a function of the length of the full shield 109, and its positional relationship with the acoustic port 51. As shown in FIG. 3M-3, the cross-sectional view along section lines K-K shows the preferred positioning of the full shield 109 with respect to the acoustic port 51. Although not shown in FIGS. 3M-2 and 3M-3, the full shield 109 should not interfere with the wiring 13 or the encapsulant 14 that will be present in the acoustic chamber is.

This embodiment of the full shield 109 can be constructed from metals, plastics, polymers, or other suitable materials. The full shield 109 can be attached to the interior surface of the top section 55 of the can-type cover 50 with solders, epoxy, or other suitable adhesives. If an adhesive is used, it preferably does not have any outgassing characteristics that could damage other components mounted inside the acoustic chamber 15, such as the MEMS microphone die 11. If the full shield 109 is constructed from a metal material, preferably it is mounted to the interior surface of the top section 55 of the can-type cover 50 with solder or epoxy. If the full shield 109 is constructed from a plastic or polymer material, preferably it is mounted to the interior surface of the top section 55 of the can-type cover 50 with a suitable epoxy or other similar adhesive. If the can-type cover 50 is constructed from a plastic or polymer, or is a laminate-type cover, then a suitable epoxy or other similar adhesive is the preferable method for mounting the full shield 109 to the interior surface of the top section 55 of the can-type cover 50.

Referring to FIGS. 3N-1 to 3N-3, another embodiment of the ingress protection element 100 is illustrated. In FIG. 3N-1, the top view of the can-type cover 50 is shown, with the acoustic port 51 having another embodiment of the full shield 109 being mounted on the interior surface of the top section 55 of the can-type cover 50. This embodiment of the full shield 109 has four sides, and the portion of the full shield 109 disposed adjacent to the ASIC die 12 has a plurality of shield apertures 110 to allow acoustic pressure to reach the MEMS microphone die 11. This embodiment of the full shield 109 has a plurality of shield apertures 110 disposed in rows and columns. The plurality of shield apertures 110 are shown in FIG. 3N-1 are angled with respect to the surfaces of the full shield 109, but in other embodiments, the plurality of shield apertures 110 can be arranged to be perpendicular to the surfaces of the full shield 109. The purpose of the full shield 109 is to create an enclosed path into the acoustic chamber 15, so dirt, dust, and other particulates entering through the acoustic port 51 have to reach the plurality of shield apertures 110 before they could potentially damage the MEMS microphone die 11. In addition, if any contaminants reach the plurality of shield apertures 110, the small size of the shield apertures 110 will lessen the possibility that the contaminants will pass through the shield apertures 110 and into the acoustic chamber 15. In FIG. 3N-1, the dotted lines indicate the location of the full shield 109 with respect to the acoustic port 51. The width and length of the full shield 109 should be such that the full shield 109 fits within the confines of the can-type cover 50, and does not interfere with air flow into the acoustic chamber 15. As shown in FIG. 3N-2, the cross-sectional view along section lines P-P shows that the full shield 109 extends from the acoustic port 51 towards the location of the ASIC die 12 in the acoustic chamber 15. The plurality of shield apertures 110 of the full shield 109 are positioned directly above or near the ASIC die 12, and the positioning is a function of the length of the full shield 109, and its positional relationship with the acoustic port 51. As shown in FIG. 3N-3, the cross-sectional view along section lines O-O shows the preferred positioning of the full shield 109 with respect to the acoustic port 51. Although not shown in FIGS. 3N-2 and 3N-3, the full shield 109 should not interfere with the wiring 13 or the encapsulant 14 that will be present in the acoustic chamber 15.

This embodiment of the full shield 109 with multiple rows of shield apertures 110 can be constructed from metals, plastics, polymers, or other suitable materials. The full shield 109 can be attached to the interior surface of the top section 55 of the can-type cover 50 with solders, epoxy, or other suitable adhesives. If an adhesive is used, it preferably does not have any outgassing characteristics that could damage other components mounted inside the acoustic chamber 15, such as the MEMS microphone die 11. If the full shield 109 is constructed from a metal material, preferably it is mounted to the interior surface of the top section 55 of the can-type cover 50 with solder or epoxy. If the full shield 109 is constructed from a plastic or polymer material, preferably it is mounted to the interior surface of the top section 55 of the can-type cover 50 with a suitable epoxy or other similar adhesive. If the can-type cover 50 is constructed from a plastic or polymer, or is a laminate-type cover, then a suitable epoxy or other similar adhesive is the preferable method for mounting the full shield 109 to the interior surface of the top section 55 of the can-type cover 50.

Referring to FIGS. 3P-1 to 3P-3, another embodiment of the ingress protection element 100 is illustrated. The particular embodiment of the ingress protection element 100 is comprised of two components, a three-quarters shield 109 and a formed step offset member 101. However, any previously described ingress protection element 100 that is formed or molded into the material of the can-type cover 50 could be substituted for the formed step offset member 101. More specifically, the V-side shear member 102, the flat-bottom side shear member 103, the center-cross member 104 (both embodiments), and the half-circle shear member 107 could be substituted for the formed step offset member 101, with the limitation that the intrusion of the member into the interior of the can-type cover 50 be limited so as not to interfere with the attachment of the three-quarters shield 109 to the interior of the can-type cover 50. In other embodiments of the ingress protection element 100, the full shield 109 (in all its shield aperture 110 variations) can be combined with the formed step offset member 101, the V-side shear member 102, the flat-bottom side shear member 103, the center-cross member 104 (both embodiments), and the half-circle shear member 107 as well. Again, one limitation is that the intrusion of the member into the interior of the can-type cover 50 be limited so as not to interfere with the attachment of the full shield 110 to the interior of the can-type cover 50.

In FIG. 3P-1, the top view of the can-type cover 50 is shown, with the acoustic port 51 having a three-quarters shield 108 being mounted on the interior surface of the top section 55 of the can-type cover 50. The three-quarters shield 108 has three sides, and the portion of the three-quarters shield 108 disposed adjacent to the ASIC die 12 is open to allow acoustic pressure to reach the MEMS microphone die 11. The purpose of the three-quarters shield 108 is to create an enclosed path into the acoustic chamber 15, so dirt, dust, and other particulates entering through the acoustic port 51 have to reach the open end of the three-quarters shield 108 before they could potentially damage the MEMS microphone die 11. In FIG. 3P-1, the dotted lines indicate the location of the three-quarters shield 108 with respect to the acoustic port 51, which is also protected with the formed step offset member 101. The width and length of the three-quarters shield 108 should be such that the three-quarters shield 108 fits within the confines of the can-type cover 50, and does not interfere with air flow into the acoustic chamber 15. As shown in FIG. 3P-2, the cross-sectional view along section lines P-P shows that the three-quarters shield 108 extends from the acoustic port 51 towards the location of the ASIC die 12 in the acoustic chamber 15. The open-end portion of the three-quarters shield 108 is positioned above or near the MEMS microphone die 11, and the positioning is a function of the length of the three-quarters shield 108, and its positional relationship with the acoustic port 51 and the formed step offset member 101. As shown in FIG. 3P-3, the cross-sectional view along section lines Q-Q shows the preferred positioning of the three-quarters shield 108 with respect to the acoustic port 51 and the formed step offset member 101. Although not shown in FIGS. 3P-2 and 3P-3, the three-quarters shield 108 should not interfere with the wiring 13 or the encapsulant 14 that will be present in the acoustic chamber 15. In some embodiments, the formed step offset member 101 can touch the interior surface of the three-quarters shield 108. In other embodiments, the formed step offset member 101 is manufactured such that there is a small clearance between the formed step offset member 101 and the interior surface of the three-quarters shield 108.

The three-quarters shield 108 can be constructed from metals, plastics, polymers, or other suitable materials. The three-quarters shield 108 can be attached to the interior surface of the top section 55 of the can-type cover 50 with solders, epoxy, or other suitable adhesives. If an adhesive is used, it preferably does not have any outgassing characteristics that could damage other components mounted inside the acoustic chamber 15, such as the MEMS microphone die 11. If the three-quarters shield 108 is constructed from a metal material, preferably it is mounted to the interior surface of the top section 55 of the can-type cover 50 with solder or epoxy. If the three-quarters shield 108 is constructed from a plastic or polymer material, preferably it is mounted to the interior surface of the top section 55 of the can-type cover 50 with a suitable epoxy or other similar adhesive.

Referring to FIGS. 3Q-1 to 3Q-3, another embodiment of the ingress protection element 100 is illustrated. This type of ingress protection element 100 is referred to as an attached formed step offset member 111. The attached formed step offset member 111 is manufactured, and then attached to the interior surface of the can-type cover 50 adjacent to the acoustic port 51. Referring to FIG. 3Q-1, a top view of the can-type cover 50 with an attached formed step offset member 111 is shown. A can-type cover 50 will usually have a round acoustic port 51, preferably with a diameter of approximately 0.5 millimeters and a surface area of approximately 0.19 square millimeters. The attached formed step offset member 111 should completely cover the acoustic port 51 as shown in FIG. 3Q-1. Referring to FIGS. 3Q-3 and 3Q-3, the cross-sectional view along section lines T-T and S-S shows the attached formed step offset member 111 bent down towards the interior of the can-type cover 50.

Preferably, the attached formed step offset member 111 is bent down at an angle of 15 degrees, but other angles can be used as well. Preferably, the bottom surface of the attached formed step offset member 111 does not intrude into the interior of the can-type cover 50 by more than 0.2 millimeters. A larger intrusion into the interior of the can-type cover 50 could interfere with the encapsulant 14 over the ASIC 12, or lessen the effectiveness of the attached formed step offset member 111. Similar to the other formed ingress protection elements, the attached formed step offset member 111 can be used in conjunction with a three-quarters shield 109 or a full shield 110 to improve protection for the MEMS microphone die 11.

Referring to FIGS. 3R-1 to 3R-3, another embodiment of the ingress protection element 100 is illustrated. This embodiment of the ingress protection element 100 is comprised of a cavity shield 114 that is set in a step cavity 112 that is flush with the surface of the top section 55 of the can-type cover 50. The cavity shield 114 is mounted on an adhesive 113 that is disposed around the edges of the step cavity 112. In the embodiment shown in FIG. 3R-1, the step cavity 112 has sufficient depth such that the combined thickness of the adhesive 113 and the cavity shield 114 does not raise the profile of the cavity shield 114 above the surface profile of the top section 55 of the can-type cover 50. In other embodiments, the step cavity 112 might not have sufficient depth such that the combined thickness of the adhesive 113 and the cavity shield 114 does raise the profile of the cavity shield 114 above the surface profile of the top section 55 of the can-type cover 50. This is acceptable as long as the higher profile of the cavity shield 114 will not interfere or cause fit problems in the device in which a MEMS microphone 10 includes this type of ingress protection element 100. Looking at FIGS. 3R-1 and 3R-2, the cavity shield 114 is shorter in length than the length of the step cavity 112. This allows air flow into the exposed portion of the step cavity 112 and into the acoustic port 51. Referring to FIG. 3R-2, the cross-sectional view along section line V-V shows the narrow path between the bottom of the step cavity 112 and the cavity shield 114. The thickness of the adhesive 113 is a factor in determining the profile of the cavity shield 114 with respect to the top section 55 of the can-type cover 50, so care in placement of the adhesive 113 is recommended. Referring to FIG. 3R-3, the cross-section view along section line U-U shows the arrangement of the adhesive 113 and the cavity shield 114 in the step cavity 112. Care must be taken that the adhesive 113 does not enter the acoustic port 51. Similar to the other embodiments of the ingress protection element 100, the purpose of the step cavity 112 and the cavity shield 114 is to create an enclosed path into the acoustic chamber 15, so dirt, dust, and other particulates attempting to enter the acoustic port 51 will potentially be caught along the long path prior to entering the acoustic chamber 15 and potentially damaging the MEMS microphone die 11.

The cavity shield 114 can be constructed from metals, plastics, polymers, or other suitable materials. Preferably, the adhesive 113 for mounting the cavity shield 114 does not have any outgassing characteristics that could damage other components mounted inside the acoustic chamber 15, such as the MEMS microphone die 11. If the cavity shield 114 is constructed from a metal material, preferably it is mounted to the step cavity 113 of the top section 55 of the can-type cover 50 with epoxy, as it might be difficult to prevent solder from entering or partially blocking the acoustic port 51.

Substrate Composition

FIG. 4 is table showing an exemplary stackup for the substrate 20, including the order of the various material layers and their composition. The substrate 20 layers shown in FIG. 4 can be added to, or subtracted from, as design requirements dictate. For example, if a substrate 20 having only a single layer of FR-4 material is desired, then a designer could use only Layers 1, C1, and 2 with the bottom solder mask 37, plating, and finish used in Layer 4.

Using FIGS. 4, 6, and 9-11 as illustrative embodiments, the material used for the non-conductive layers 34 is preferably FR-4 printed circuit board material, although equivalent materials can be used. The non-conductive material layers 34 serve to insulate the top metal layer 31, the upper conductive layer 32, the lower conductive layer 33, and the bottom metal layer 36 from each other. During the substrate assembly, a panel of FR-4 printed circuit board material is provided that already has a copper layer on both sides of the panel of material. Alternatively, a panel of bare FR-4 printed circuit board material can be provided as a starting point, and a copper layer can be either laminated or electroplated onto each surface of the panel of printed circuit board material.

In an embodiment of the substrate 20, the top metal layer 31 of the substrate 20 is a patterned metal layer, preferably copper, that provides the electrical traces, the wire bond pads 39, and the attachment ring 40. During the manufacturing process, the top metal layer 31 is etched in a predetermined pattern or configuration to form the outlines of the electrical traces, the wire bond pads 39, electrical vias 38, electrical traces between the wire bond pads 39 and electrical vias 38, and the attachment ring 40. In certain embodiments, to provide as much protection as possible against electromagnetic interference, only a small portion of the top metal layer 31 is patterned and etched, and the remaining portion of the top metal layer 31 can be used for suppression or reduction of electromagnetic interference. The portion of the top metal layer 31 to be used as a ground plane is electrically coupled by an electrical via 38 to the terminal pad 21 that will be electrically coupled to ground potential. The top solder mask 30 is applied to the top metal layer 31 to further define the wire bond pads 39 and the attachment ring 40. Preferably, the top solder mask 30 will substantially or completely cover the electrical traces and electrical vias 38 to insulate them, and the top solder mask 30 will cover a substantial portion of the top metal layer 31 that is being used as a ground plane. The color of the top solder mask 30 is preferably green, but other colors such as black, blue, red, yellow, white, and mixtures and shade variations thereof, can be used. The top solder mask 30 can be clear if desired.

In the embodiment disclosed in FIG. 4 (also see FIGS. 6 and 9-11), a non-conductive layer 34 is underneath the top metal layer 31, and separates the top metal layer 31 from the upper conductive layer 32. As noted above, the upper conductive layer 32 can be used as another ground plane, or can be patterned for passive components (e.g., capacitor electrode plates, resistor terminals, wiring, etc.). The placement of conductive layers on both sides of the dielectric layer 35 allows for the embedding of passive elements, such as resistors or capacitors, internally in the substrate 20 and saves space on the upper surface 25 of the substrate 20. In addition, the embedding of passive elements reduces the electrical wiring complexity in the top metal layer 31 of the substrate 20, and reduces the overall parts count for the MEMS microphone 10.

If an embedded capacitor is desired, the capacitance will depend on the material used for the dielectric layer 35, and the size of the electrode plate (if the upper conductive layer 32 is used as an electrode). The lower conductive layer 33 on the other side of the dielectric layer 35 will be patterned accordingly, i.e., if the upper conductive layer 32 is configured as an electrode, then the lower conductive layer 33 will be configured as a ground plane. Suitable materials for the dielectric layer 35 include embedded capacitance materials such as FaradFlex® by Oak-Mitsui Technologies, or C-Ply from 3M. These materials are configured to have given capacitance density (picoFarads/cm$^2$) and dielectric constant values that a designer can use to implement a capacitor embedded in the substrate 20.

In an alternative embodiment, a resistive material could be substituted for the dielectric material, and the upper conductive layer 32 can be patterned to act as a terminal (or terminals) for a resistor. The lower conductive layer 33 on the other side of the resistive material can be patterned as a terminal.

In the substrate embodiment of FIG. 4 (also see FIGS. 6 and 9-11), if the dielectric layer 35 will also be the environmental barrier, the material used for the dielectric layer 35 should be acoustically transparent as well. In certain embodiments, the dielectric layer 35 may comprise two portions, one portion an acoustically transparent material and the other portion a non-acoustically transparent portion, to achieve the desired capacitance (or resistance) and environmental protection.

In the substrate embodiment of FIG. 4 (also see FIGS. 6 and 9-11), the bottom metal layer 36 is patterned and etched to provide the terminal pads 21, and if desired, the sealing ring 23 and the ground ring 24. Preferably, only a small portion of the bottom metal layer 36 is patterned and etched to define the sections of the bottom metal layer 36 that will serve as the terminal pads 21 and, if desired, the sealing ring 23 and the ground ring 24. The bottom solder mask 37 is patterned on top of the patterned and etched bottom metal layer 36, and defines the perimeters of the terminal pads 21 and, if desired, the sealing ring 23 and the ground ring 24. In certain embodiments of the substrate 20, the sealing ring 23 is electrically active, and serves as a ground potential terminal. Preferably, during fabrication of the substrate 20, the terminal pads 21 and, if desired, the sealing ring 23 and the ground ring 24 are not actually be etched to form their final shapes, but instead the pattern of the bottom solder mask 37 determines the final shapes of those elements. The color of the bottom solder mask 37 is preferably green, but other colors such as black, blue, red, yellow, white, and mixtures and shade variations thereof, can be used. The bottom solder mask 37 can be clear if desired.

Terminal Pads, Sealing Ring, and Ground Ring

Referring to FIGS. 5A-5L, several embodiments of the terminal pads 21, the sealing ring 23, and the ground ring 24 are depicted. For all embodiments of top-port, bottom-port, and directional MEMS microphones, the exemplary layouts of terminal pads 21 and ground ring 24 can be implemented on the lower surface 26 of the substrate 20. For all embodiments of bottom-port and directional MEMS microphones, a sealing ring 23 can be implemented on the lower surface 26 of the substrate 20. As discussed in more detail below, the sealing ring 23, in conjunction with other components, facilitates the implementation of sealed acoustic pathway between the MEMS microphone 10 and the end user PCB 61. The types of acoustic pathways, and the manner of implementing the pathways, will be explained in more detail with reference to FIGS. 23A-23C. The bottom metal layer 36 of the substrate 20 provides the conductive layer needed for the terminal pads 21, the sealing ring 23, and the ground ring 24. Preferably, the terminal pads 21, the sealing ring 23, and the ground ring 24 are copper with alloy plating that allows lead-free solder to be used during the mounting operation. The alloy plating can comprise gold, silver, tin, nickel, palladium, or other suitable materials. The bottom metal layer 36 is etched to electrically separate one or more of the terminal pads 21, and, if required, the sealing ring 23, and the ground ring 24. In one embodiment, the bottom metal layer 36 is etched such that electrical continuity exists between one terminal pad 21, the sealing ring 23, and the ground ring 24, and the remainder of the terminal pads 21 are electrically isolated. In this particular embodiment, the single terminal pad 21, the sealing ring 23, and the ground ring 24 would be electrically coupled to the ground plane (or planes) within the MEMS microphone 10, and assist in suppressing electromagnetic interference by providing pathways to a ground potential. The remainder of the terminal pads 21 would be electrically isolated in this embodiment, as these terminal pads 21 would be for input power, clock and data signals, and control signals. In another embodiment, the bottom metal layer 36 is etched such that electrical continuity exists between the ground ring 24 and the sealing ring 23, and all the terminal pads 21 are electrically isolated. As is evident, various combinations of terminal pads 21, sealing ring 23, and ground ring 24 can be realized by the substrate designer. It is not needed that every embodiment of the MEMS microphone 10 have a sealing ring 23 and/or a ground ring 24. These are electrical structures that can be added to a substrate 20, in conjunction with the terminal pads 21, to provide additional electrical interfaces between an end user PCB 61 and the MEMS microphone 10.

Figure 5A:
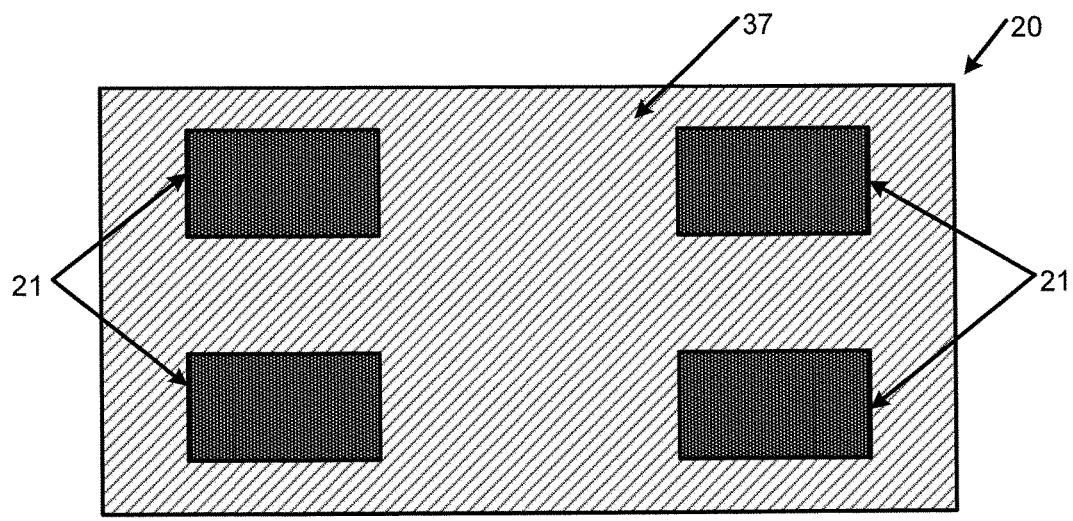
FIG. 5A is a plan view of a first embodiment of terminal pads on the lower surface of a microphone substrate for a MEMS microphone according to the disclosed invention.

Referring to FIG. 5A, an embodiment of the terminal pads 21 is shown. The bottom metal layer 36 has been patterned and etched, and the bottom solder mask 37 has been patterned onto the etched bottom metal layer 36, defining the perimeter edges of the terminal pads 21 (also referred to as solder pads). For this particular embodiment, the MEMS microphone 10 is a top-port microphone, since there is no acoustic port 22 in the substrate 20.

Figure 5B:
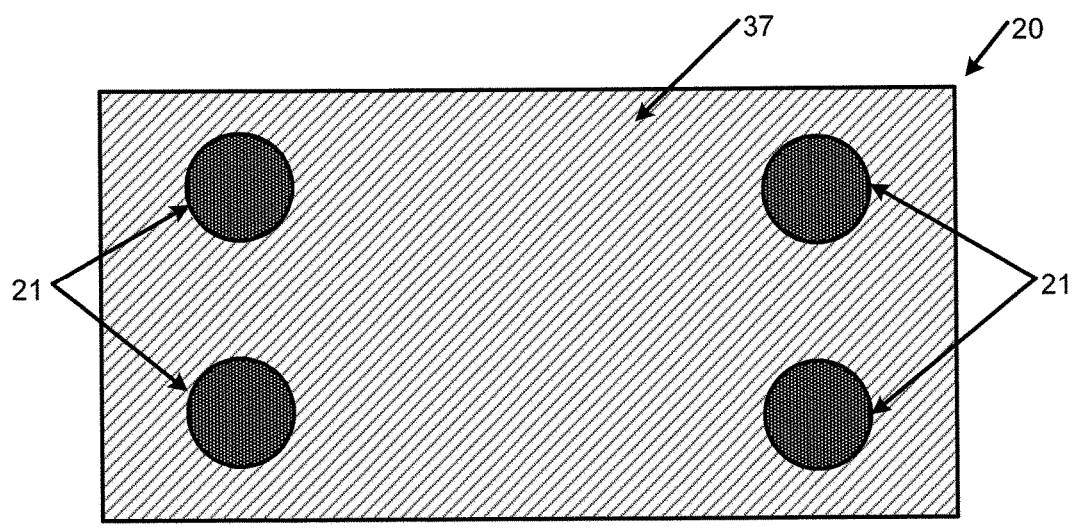
FIG. 5B is a plan view of a second embodiment of terminal pads on the lower surface of a microphone substrate for a MEMS microphone according to the disclosed invention.

Referring to FIG. 5B, another embodiment of the terminal pads 21 is shown. The bottom metal layer 36 has been patterned and etched, and the bottom solder mask 37 has been patterned onto the etched bottom metal layer 36, defining the perimeter edges of the terminal pads 21 as having rectangular or square outlines. In this embodiment, the terminal pads 21 have round outlines, as opposed to having a rectangular or square outline.

Figure 5C:
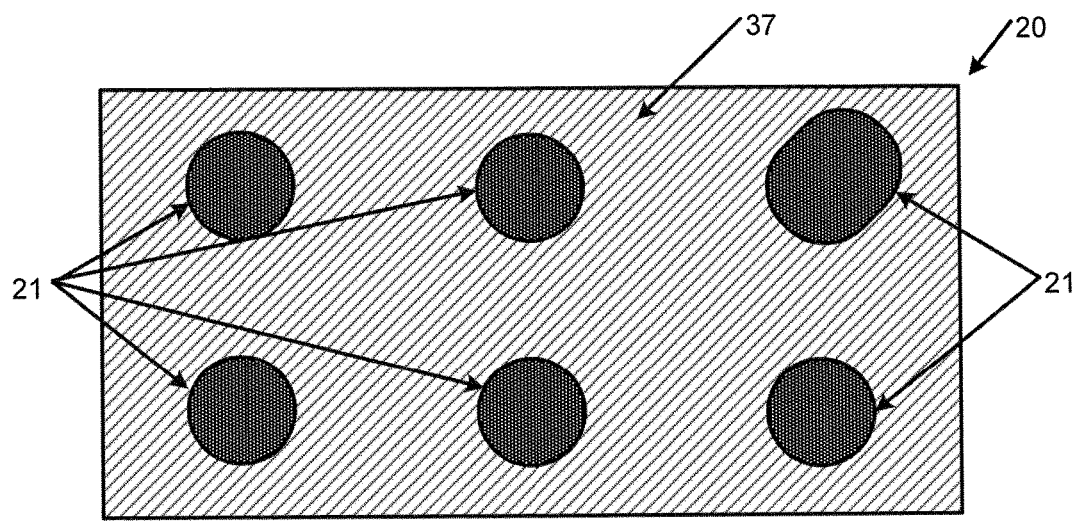
FIG. 5C is a plan view of a third embodiment of terminal pads on the lower surface of a microphone substrate for a MEMS microphone according to the disclosed invention.

Referring to FIG. 5C, another embodiment of the terminal pads 21 is shown. The bottom metal layer 36 has been patterned and etched, and the bottom solder mask 37 has been patterned onto the etched bottom metal layer 36, defining the perimeter edges of the terminal pads 21. This particular embodiment has additional terminal pads 21 (see FIGS. 5A and 5B) and is preferably used for digital MEMS microphones that use clock and control signals. The oblong-shaped terminal pad 21 is also functions to identify the terminal pads for the end user.

Figure 5D:
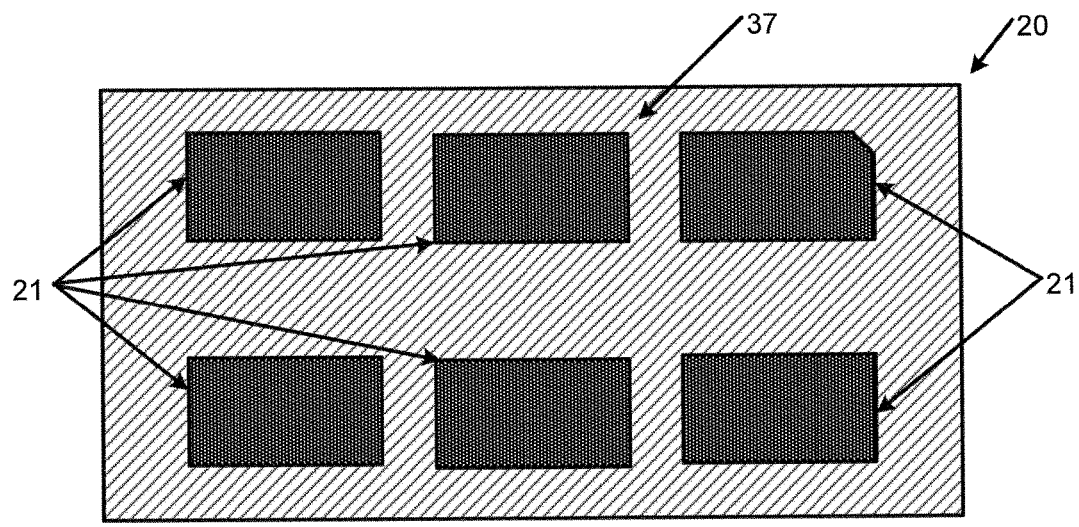
FIG. 5D is a plan view of a fourth embodiment of terminal pads on the lower surface of a microphone substrate for a MEMS microphone according to the disclosed invention.

Referring to FIG. 5D, another embodiment of the terminal pads 21 is shown. The bottom metal layer 36 has been patterned and etched, and the bottom solder mask 37 has been patterned onto the etched bottom metal layer 36, defining the perimeter edges of the terminal pads 21 as having rectangular or square outlines. This particular embodiment has additional terminal pads 21 (see FIGS. 5A and 5B) and is preferably used for digital MEMS microphones that use clock and control signals. The terminal pad 21 with the clipped corner also functions to identify the terminal pads for the end user.

Figure 5E:
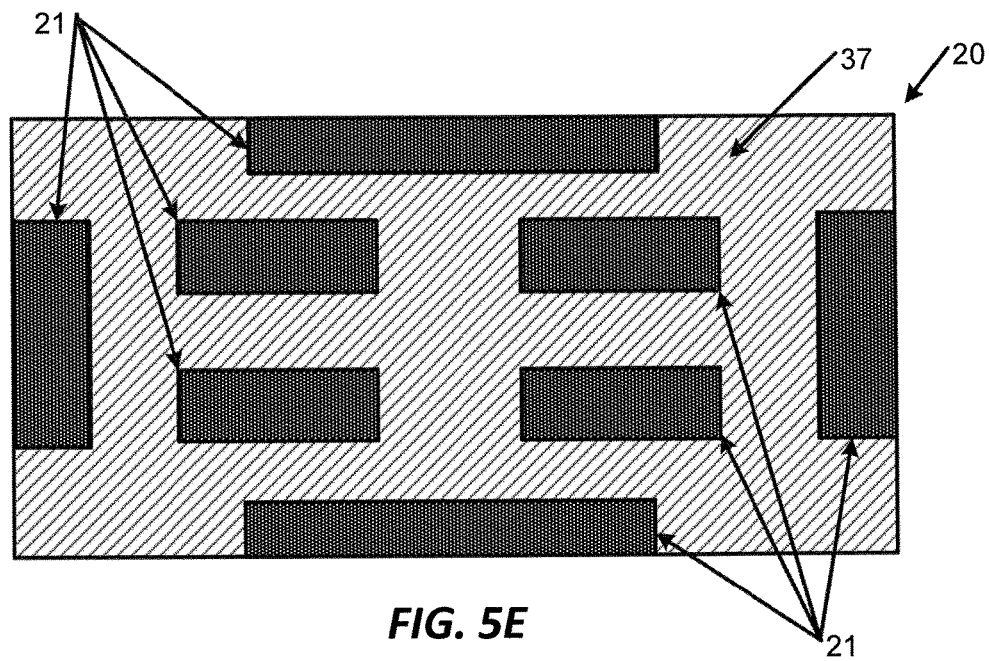
FIG. 5E is a plan view of a fifth embodiment of terminal pads on the lower surface of a microphone substrate for a MEMS microphone according to the disclosed invention.

Referring to FIG. 5E, another embodiment of the terminal pads 21 is shown. The bottom metal layer 36 has been patterned and etched, and the bottom solder mask 37 has been patterned onto the etched bottom metal layer 36, defining the perimeter edges of the terminal pads 21 as having rectangular or square outlines. This particular embodiment has terminal pads 21 disposed around the substrate edges, and in the interior region of the substrate. The particular embodiment of terminal pads 21 is preferably used for digital MEMS microphones that use clock and control signals.

Figure 5F:
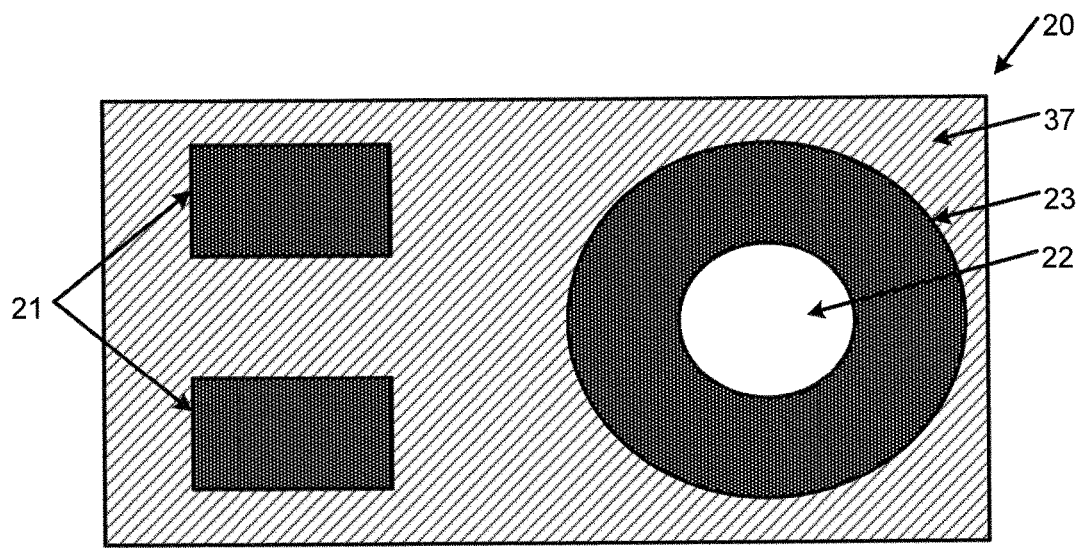
FIG. 5F is a plan view of a first embodiment of terminal pads and a sealing ring on the lower surface of a microphone substrate for a MEMS microphone according to the disclosed invention.

Referring to FIG. 5F, an embodiment of the terminal pads 21 and the sealing ring 23 is shown. The bottom metal layer 36 has been patterned and etched, and the bottom solder mask 37 has been patterned onto the etched bottom metal layer 36, defining the perimeter edges of the terminal pads 21 as having rectangular or square outlines. The bottom solder mask 37 defines the outer perimeter edge of the sealing ring 23 encircling the acoustic port 22, and the inner edge of the sealing ring 23 is defined by the acoustic port 22. For this particular embodiment, the MEMS microphone 10 is a bottom-port or directional microphone, due to the acoustic port 22 in the substrate 20.

Figure 5G:
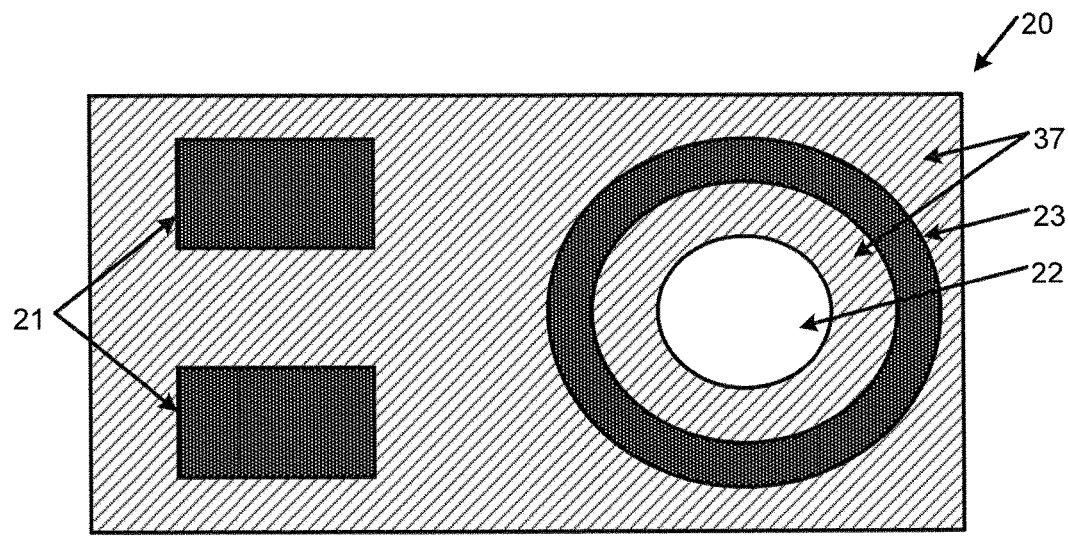
FIG. 5G is a plan view of a second embodiment of terminal pads and a sealing ring on the lower surface of a microphone substrate for a MEMS microphone according to the disclosed invention.

Referring to FIG. 5G, another embodiment of the terminal pads 21 and the sealing ring 23 is shown. The bottom metal layer 36 has been patterned and etched, and the bottom solder mask 37 has been patterned onto the etched bottom metal layer 36, defining the perimeter edges of the terminal pads 21 as having rectangular or square outlines. The bottom solder mask 37 defines the inner and outer perimeter edges of the sealing ring 23 encircling the acoustic port 22. In this embodiment, the sealing ring 23 is spaced away from the acoustic port 22 to lessen the possibility of liquefied solder (or solder flux) intruding into the acoustic port 22 and possibly damaging the MEMS microphone die 11. An alternative embodiment of the sealing ring 23 in FIG. 5G may have the inner perimeter edge of the sealing ring 23 be formed by etching, while the outer perimeter edge would be defined by the bottom solder mask 37. In this manner, there is exposed substrate material (i.e., non-conductive FR-4 material) between the acoustic port 22 and the inner perimeter edge of the sealing ring 23. The lack of any metallic material between the sealing ring 23 and the acoustic port 22 will reduce the possibility of liquefied solder or solder flux reaching the acoustic port 22 and potentially damaging the MEMS microphone die 11.

Figure 5H:
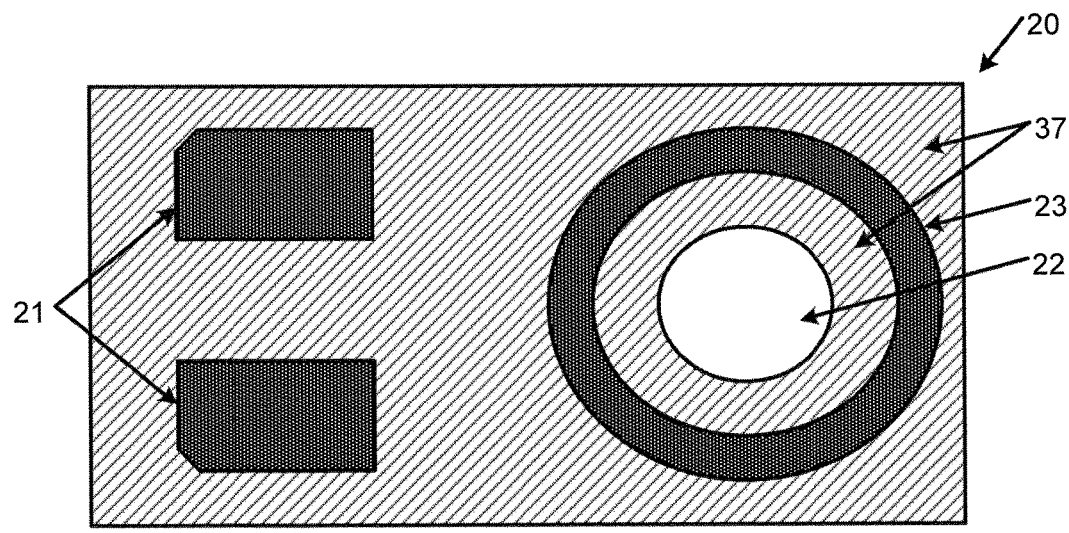
FIG. 5H is a plan view of a third embodiment of terminal pads and a sealing ring on the lower surface of a microphone substrate for a MEMS microphone according to the disclosed invention.

Referring to FIG. 5H, another embodiment of the terminal pads 21 and the sealing ring 23 is shown. The bottom metal layer 36 has been patterned and etched, and the bottom solder mask 37 has been patterned onto the etched bottom metal layer 36, defining the perimeter edges of the terminal pads 21 as having rectangular or square outlines. The bottom solder mask 37 defines the inner and outer perimeter edges of the sealing ring 23 encircling the acoustic port 22. Certain corners of each terminal pad 21 have been clipped by the patterned bottom solder mask 37.

Figure 5I:
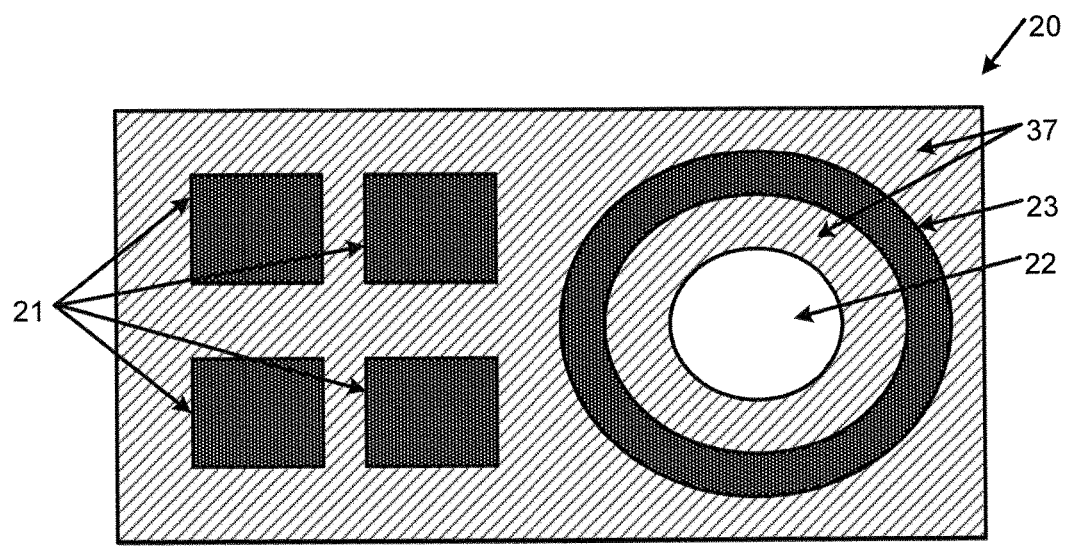
FIG. 5I is a plan view of a fourth embodiment of terminal pads and a sealing ring on the lower surface of a microphone substrate for a MEMS microphone according to the disclosed invention.

Referring to FIG. 5I, another embodiment of the terminal pads 21 and the sealing ring 23 is shown. The bottom metal layer 36 has been patterned and etched, and the bottom solder mask 37 has been patterned onto the etched bottom metal layer 36, defining the perimeter edges of the terminal pads 21 as having rectangular or square outlines. The bottom solder mask 37 defines the inner and outer perimeter edges of the sealing ring 23 encircling the acoustic port 22. This particular embodiment has additional terminal pads 21 (see FIGS. 5G and 5H) and is preferably used for digital MEMS microphones that use clock and control signals.

Figure 5J:
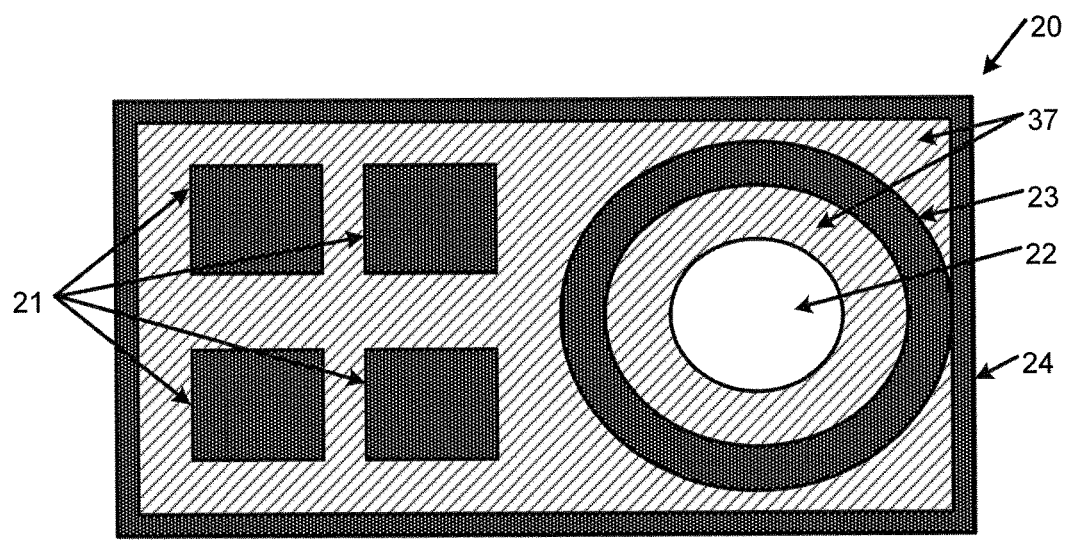
FIG. 5J is a plan view of an embodiment of terminal pads, a sealing ring, and a ground ring on the lower surface of a microphone substrate for a MEMS microphone according to the disclosed invention.

Referring to FIG. 5J, another embodiment of the terminal pads 21, the sealing ring 23, and ground ring 24 is shown. The bottom metal layer 36 has been patterned and etched, and the bottom solder mask 37 has been patterned onto the etched bottom metal layer 36, defining the perimeter edges of the terminal pads 21 as having rectangular or square outlines. The bottom solder mask 37 defines the inner and outer perimeter edges of the sealing ring 23 encircling the acoustic port 22, and defines the ground ring 24 around the periphery of the substrate 20. This particular embodiment has additional terminal pads 21 (see FIGS. 5G and 5H) and is preferably used for digital MEMS microphones that use clock and control signals.

Figure 5K:
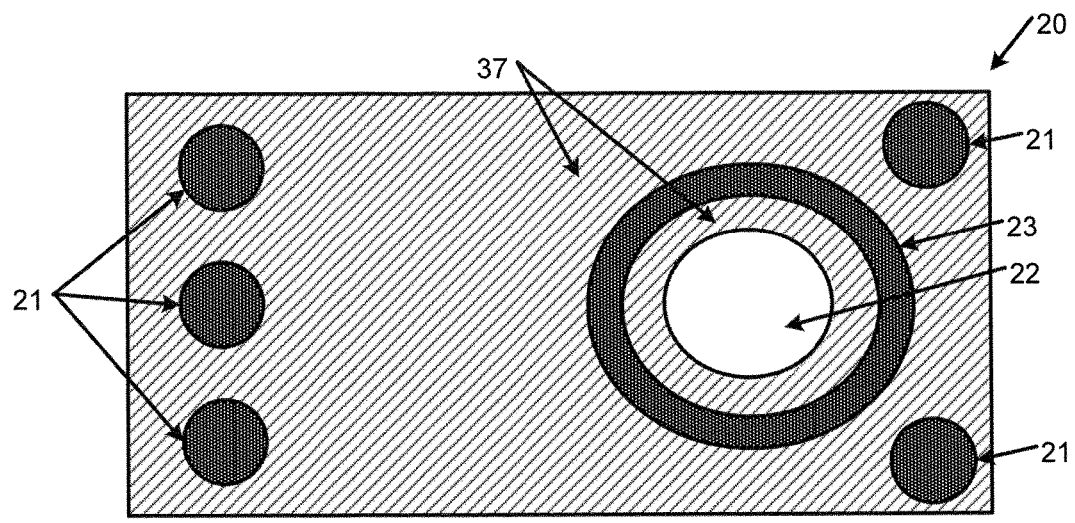
FIG. 5K is a plan view of a fifth embodiment terminal pads and a sealing ring on the lower surface of a microphone substrate for a MEMS microphone according to the disclosed invention.

Referring to FIG. 5K, another embodiment of the terminal pads 21 and the sealing ring 23 is shown. The bottom metal layer 36 has been patterned and etched, and the bottom solder mask 37 has been patterned onto the etched bottom metal layer 36, defining the perimeter edges of the terminal pads 21 as having round outlines. The bottom solder mask 37 defines the inner and outer perimeter edges of the sealing ring 23 encircling the acoustic port 22. This particular embodiment has additional terminal pads 21 positioned next to the sealing ring, which can be used as additional signal, power, clock, control, or ground terminal pads.

Figure 5L:
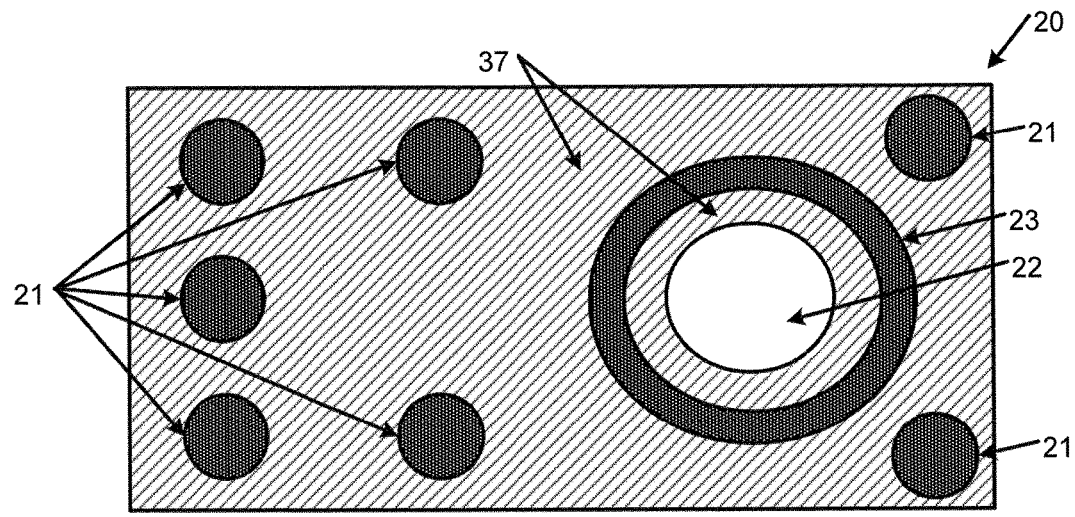
FIG. 5L is a plan view of a sixth embodiment terminal pads and a sealing ring on the lower surface of a microphone substrate for a MEMS microphone according to the disclosed invention.

Referring to FIG. 5L, another embodiment of the terminal pads 21 and the sealing ring 23 is shown. The bottom metal layer 36 has been patterned and etched, and the bottom solder mask 37 has been patterned onto the etched bottom metal layer 36, defining the perimeter edges of the terminal pads 21 as having round outlines. The bottom solder mask 37 defines the inner and outer perimeter edges of the sealing ring 23 encircling the acoustic port 22. This particular embodiment has additional terminal pads 21 positioned next to the sealing ring, which can be used as additional signal, power, clock, control, or ground terminal pads.

Substrate Core

Figure 6:
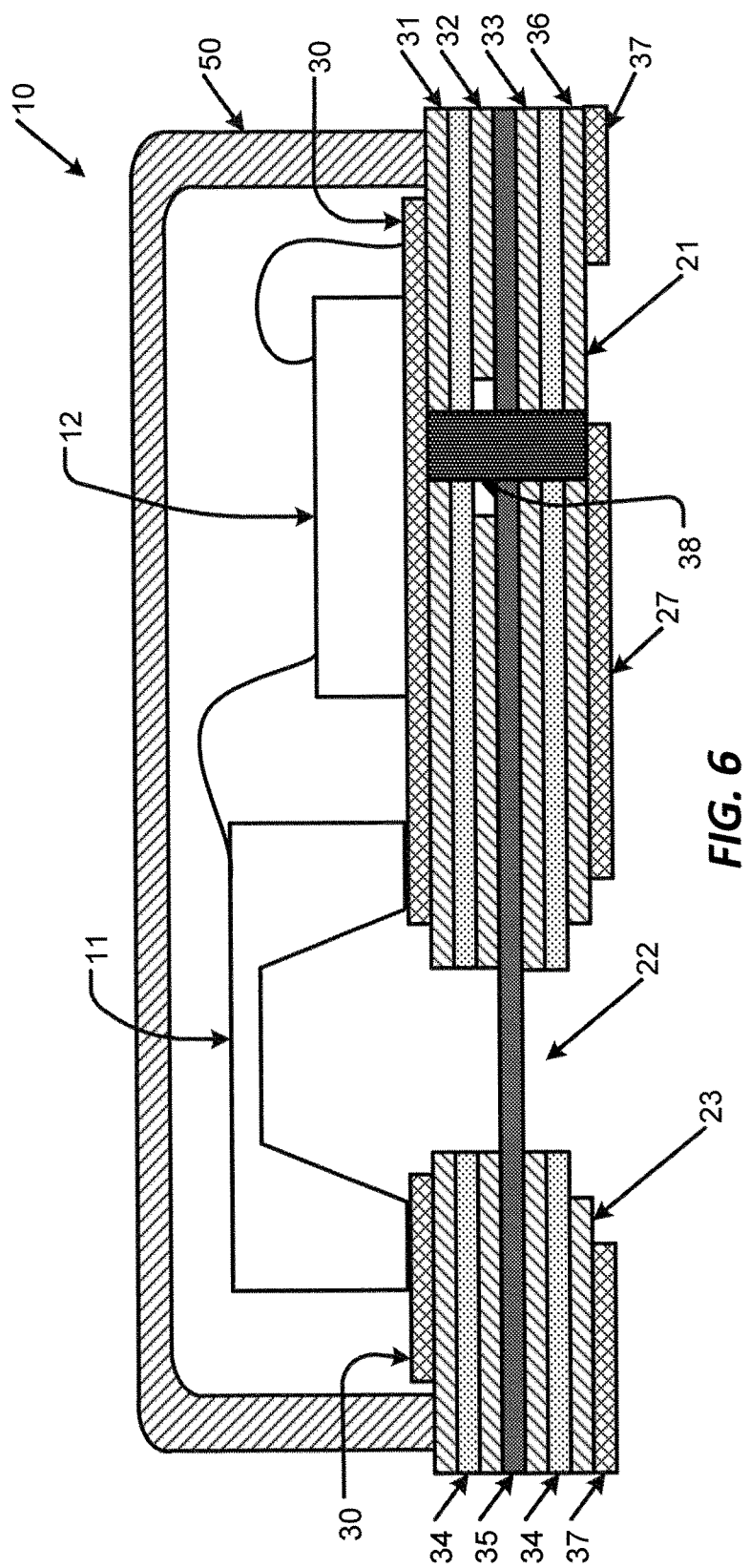
FIG. 6 is a longitudinal cross-sectional view of a first embodiment of a substrate for a MEMS microphone according to the disclosed invention.

Referring to FIG. 6, an exemplary embodiment of the substrate 20 is illustrated. While the substrate 20 is shown with multiple layers of conductive and non-conductive material, a dielectric layer, and solder mask layers, other embodiments of the substrate 20 can have different arrangements of these layers. The embodiment of the substrate 20 depicted in FIG. 6 comprises a top solder mask 30, a top metal layer 31, a non-conductive layer 34, an upper conductive layer 32 (i.e., a ground plane or an electrode), a dielectric layer 35, a lower conductive layer 33 (i.e., a ground plane or an electrode), another non-conductive layer 34, a bottom metal layer 36, and a bottom solder mask 37.

The material used for the non-conductive layers 34 is preferably FR-4 printed circuit board material, although equivalent materials can be used as well. One non-conductive material layer 34 serves to insulate the top metal layer 31 and the upper conductive layer 32 from each other, and another non-conductive material layer 34 insulates the lower conductive layer 33 and the bottom metal layer 36 from each other. Preferably, during the assembly process, a panel of FR-4 printed circuit board material is provided that already has a copper layer on both sides of the panel of material. Alternatively, a panel of bare FR-4 printed circuit board material can be provided as a starting point, and a copper layer can be either laminated or electroplated onto each surface of the panel of material.

In the embodiment of the substrate 20 shown in FIG. 6, the top metal layer 31 of the substrate 20 is a patterned layer of copper that provides the electrical traces, the wire bond pads 39, and the attachment ring 40. During the manufacturing process, the top metal layer 31 is etched in a predetermined pattern to form the outlines of the electrical traces, the electrical vias 38, the wire bond pads 39, and the attachment ring 40. To provide as much protection as possible against electromagnetic interference, a substantial portion of the top metal layer 31 is not etched and is utilized as a ground plane. By etching or patterning only a small portion of the top metal layer 31, a substantial portion of the top metal layer 31 can be used for suppression or reduction of electromagnetic interference. The portion of the top metal layer 31 to be used as a ground plane is electrically coupled by an electrical via 38 to the terminal pad 21 that will be electrically coupled to ground potential. The top solder mask 30 is applied to the top metal layer 31 and further defines the outlines of the wire bond pads 39 and the attachment ring 4o. Preferably, the top solder mask 30 will substantially or completely cover the electrical traces to insulate them, and will cover a substantial portion of the top metal layer 31 that is being used as a ground plane.

In the substrate embodiment disclosed in FIG. 6, the non-conductive layer 34 insulates the top metal layer 31 from the upper conductive layer 32. The upper conductive layer 32 can be used as another ground plane, can be patterned into an electrode for a capacitor (or multiple electrodes for multiple capacitors), can be patterned into resistor terminals, or can be pattered into electrical traces. The placement of conductive layers on both sides of the dielectric layer 35 allows for the embedding of passive elements, such as resistors or capacitors, internally in the substrate 20 and save space on the upper surface 25 of the substrate 20. In addition, the embedding of passive elements reduces the electrical wiring complexity in the top metal layer 31 of the substrate 20, and reduces the overall parts count for the MEMS microphone 10. If an embedded capacitor is desired, the capacitance will depend on the material used for the dielectric layer 35, and the size of the electrode (if the upper conductive layer 32 is used as an electrode). The lower conductive layer 33 on the other side of the dielectric layer 35 will be patterned accordingly, i.e., if the upper conductive layer 32 is configured as an electrode, then the lower conductive layer 33 will be configured as a ground plane. In an alternative embodiment, a resistive material could be substituted for the dielectric material, and the upper conductive layer 32 patterned to act as a terminal for a resistor. The lower conductive layer 33 on the other side of the resistive material may be patterned as a resistor terminal as well.

In the substrate embodiment disclosed in FIG. 6, the bottom metal layer 36 is patterned and etched to provide the terminal pads 21, and if desired, the sealing ring 23 and the ground ring 24. As shown in FIG. 6, the sealing ring 23 surrounds the acoustic port 22. As with the top metal layer 31, the bottom metal layer 36 may be patterned and etched to define the sections of the bottom metal layer 36 that will serve as the terminal pads 21, the sealing ring 23, and the ground ring 24. The bottom solder mask 37 is patterned on top of the patterned and etched bottom metal layer 36, and defines the perimeters of the terminal pads 21, the sealing ring 23, and the ground ring 24. In certain embodiments of the substrate 20, the sealing ring 23 and/or the ground ring 24 is electrically active, and serve as a ground potential terminals. During construction of the substrate 20, the sealing ring 23 might not actually be etched to form a "ring" but instead its final shape is determined by the pattern of the bottom solder mask 37 formed on top of the bottom metal layer 36. As shown in FIG. 6, the bottom metal layer 36 is etched back from the acoustic port 22, such that the bottom metal layer 36 does not reach the edges of the acoustic port 22. The portion of the bottom metal layer 36 that is exposed by the bottom solder mask 37 around the acoustic port 22 is the sealing ring 23.

The embodiment disclosed in FIG. 6 depicts an electrical via 38 for internal interconnections between the top metal layer 31, upper conductive layer 32, the lower conductive layer 33, and/or the bottom metal layer 36. As shown, the electrical via 38 is electrically coupling the top metal layer 31, the lower conductive layer 33, and the bottom metal layer 36. The hole shown in the upper conductive layer 32 is allowing the electrical via 38 to pass through the upper conductive layer 32 without electrically contacting the upper conductive layer 32. In certain embodiments, the electrical vias are formed by electroplating a hole (or holes) drilled or formed in some manner through the layers of the substrate. Depending upon the arrangement of the electrical vias, the electroplating can be done in one process step, or it may done in multiple electroplating steps as the layers of the substrate 20 are assembled.

Figure 7:
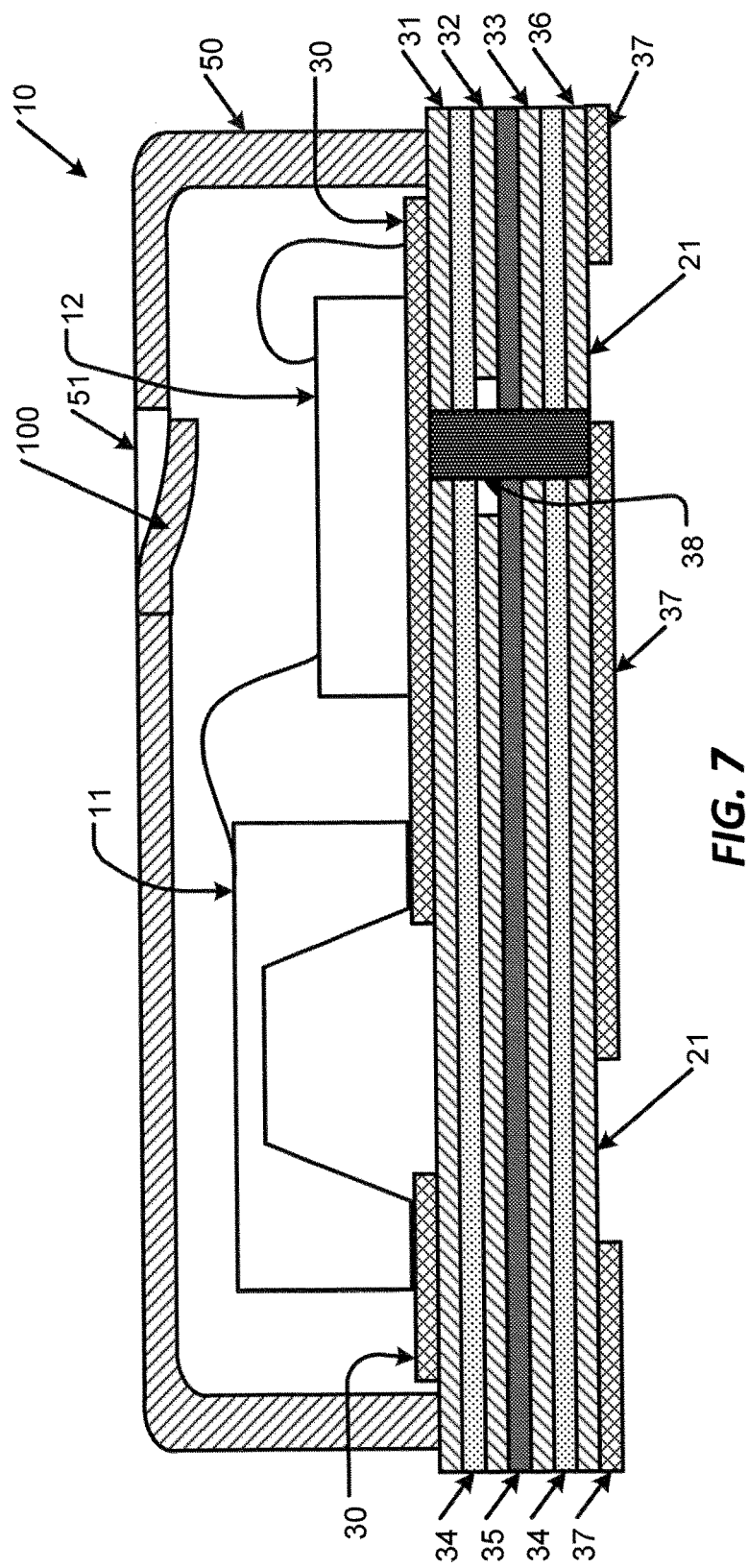
FIG. 7 is a longitudinal cross-sectional view of another embodiment of a substrate for a MEMS microphone according to the disclosed invention.

Referring to FIG. 7, another embodiment of the substrate 20 is illustrated. The MEMS microphone 10 is a top-port implementation. The bottom solder mask 37 defines the perimeters of the terminal pads 21 by exposing portions of the bottom metal layer 36. The microphone embodiment in FIG. 7 also as an ingress protection element 100 disposed in the acoustic port 51 in the cover 50. The ingress protection element 100 limits the potential exposure of the MEMS microphone die 11 to debris that might enter the acoustic chamber 15 through the acoustic port 51. The ingress protection element 100 must be sized so it does not unduly interfere or restrict the air flow into the acoustic chamber, or interfere with the encapsulant 14 or the wiring 13 as shown in FIG. 7. The ingress protection element 100 can be implemented in various ways (FIGS. 3A-3R), and the particular implementation illustrated in FIG. 7 is a formed offset member (FIGS. 3A-3D) embodiment. The ingress protection element is described in greater detail in the disclosure directed to the cover 50 and FIGS. 3A-3R.

Figure 8:
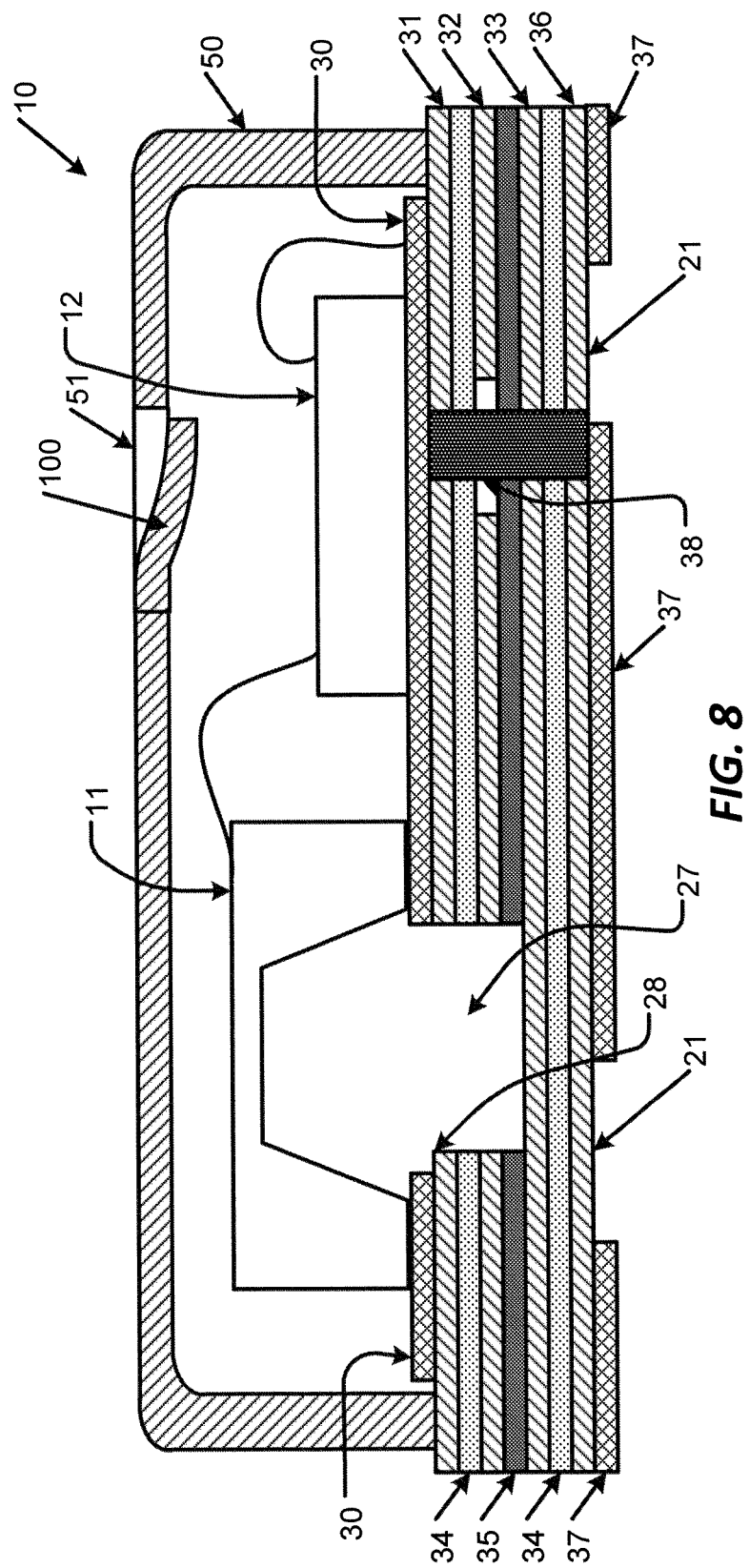
FIG. 8 is a longitudinal cross-sectional view of a third embodiment of a substrate for a MEMS microphone according to the disclosed invention.

Referring to FIG. 8, another embodiment of the substrate 20 is illustrated. The MEMS microphone 10 is a top-port implementation. The bottom solder mask 37 defines the perimeters of the terminal pads 21 by exposing portions of the bottom metal layer 36. This embodiment of the substrate 20 has a recess 27 and the internal acoustic channel 16 of the MEMS microphone die 11 is aligned with the recess aperture 28. Enlarging the back volume available to the MEMS microphone die 11 improves the performance of the MEMS microphone die 11. The microphone embodiment in FIG. 8 also as an ingress protection element 100 disposed in the acoustic port 51 in the cover 50. The ingress protection element 100 must be sized so it does not unduly interfere or restrict the air flow into the acoustic chamber, or interfere with the encapsulant 14 or the wiring 13 as shown in FIG. 8.

Wire Bond Pads, Electrical Vias, and Attachment Ring

Figure 9:
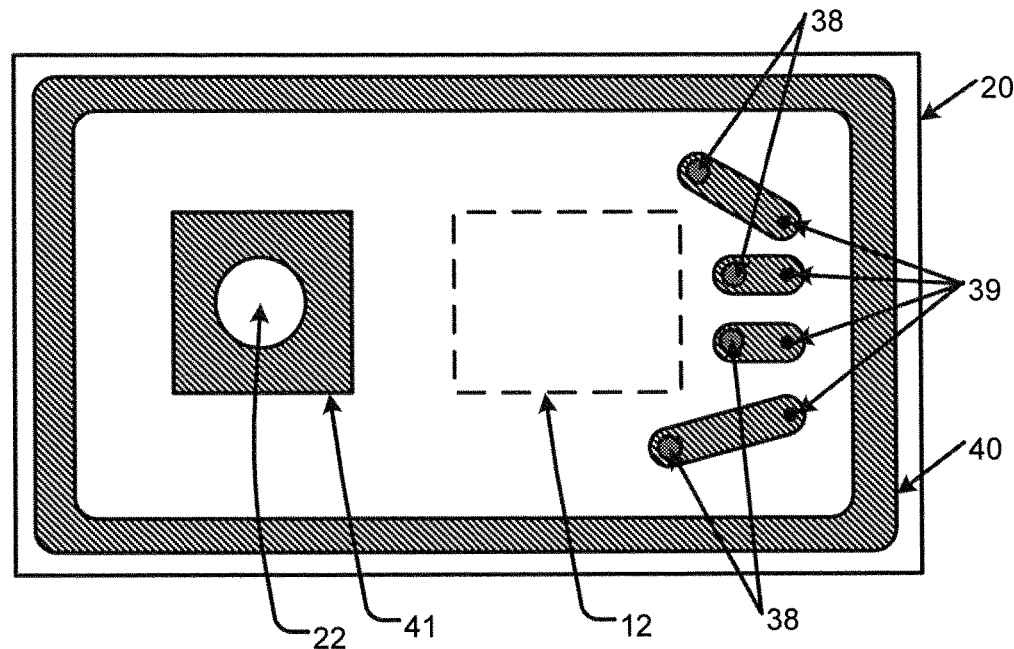
FIG. 9 is a plan view of the top surface of an embodiment of a substrate for a MEMS microphone according to the disclosed invention.

Referring to FIG. 9, a view of the upper surface 25 of an embodiment of the substrate 20 is depicted. The top solder mask 30 is not shown, as it would obscure some of the details of the upper surface 25. The embodiment shown in FIG. 9 has an acoustic port 22, and this particular embodiment can be used with bottom-port or directional MEMS microphones. In this embodiment, a transducer plate 41 is shown surrounding the acoustic port 22. This plate is the top metal layer 31 left exposed by the top solder mask 30. The MEMS microphone die 11 may be mounted on this plate preferably using a die attach epoxy or other suitable material. If the substrate 20 does not have an acoustic port 22 (i.e., the substrate is for a top-port microphone), the transducer plate 41 would not have an opening at its centerpoint. Alternatively, the top solder mask 30 can completely cover the area identified as the transducer plate 41, and the MEMS microphone die 11 may be mounted on the top solder mask 30 using a die attach epoxy or other suitable material.

Figure 10:
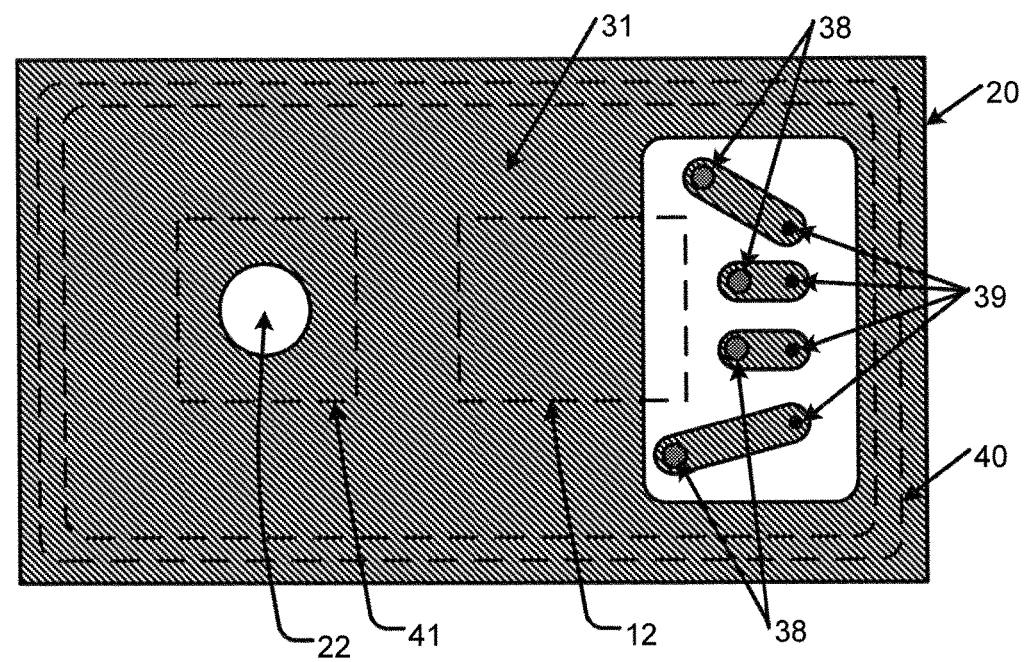
FIG. 10 is a plan view of an etched metal surface of the embodiment of FIG. 9 of a substrate for a MEMS microphone according to the disclosed invention.

An attachment ring 40 surrounds the interior region of the substrate 20 and is used for the suppression or reduction of electromagnetic interference. During the assembly of an embodiment of a MEMS microphone, the attachment surface 53 of the cover 50 may be mechanically attached to the attachment ring 40 with solder or a conductive epoxy. During the manufacture of an embodiment of the substrate 20, the attachment ring 40 is electrically coupled to the terminal pad 21 that will be the designated ground potential connection. In that way, the attachment ring 40 will direct any electrical noise or currents induced in the cover 50 to ground potential. In FIG. 9, an embodiment of the attachment ring 40 is illustrated as an oblong ring structure that is formed from the top metal layer 31. In some embodiments, the attachment ring 40 can be a standalone continuous pad (as shown in FIG. 10), etched from the top metal layer 31, that is electrically coupled to the terminal pad 21 that will be the designated ground potential connection. In other embodiments, the top solder mask 30 defines the attachment ring 40 by exposing an oblong ring-like portion of the top metal layer 31 for connection to the attachment surface 53 of the cover 50. The top solder mask 30 covers other portions of the top metal layer 31 adjacent to the exposed metal that constitutes the attachment ring 40. In these embodiments, the top solder mask 30 serves to confine the solder or conductive epoxy used to effect the mechanical and electrical connection between the attachment surface 53 of the cover 50 and the attachment ring 40 within the area defined for the attachment ring 40. The top solder mask 30 assists in preventing liquefied solder or conductive epoxy from creeping or wicking across the upper surface 25 of the substrate 20 or up the sidewalls 54 of the cover 50.

In FIG. 9, the dashed lines represent the location of the ASIC 12 on the upper surface 25 of the substrate 20. Adjacent to the location of the ASIC 12, there are several wire bond pads 39. More specifically, there are multiple wire bond pads 39 that are connected by electrical traces to multiple electrical vias 38. As noted before, an electrical via in the substrate 20 is formed by drilling or other processes through one or more of the material layers of the substrate 20, and then electroplating to form an electrical pathway and, if required, electrical connections between the various metal layers of the substrate 20. The ASIC 12, and, depending upon its design, the MEMS microphone die 11 are electrically coupled to the wire bond pads 39 via gold wiring that is bonded to the wire bond pads 39 and to pads on the ASIC 12 and the MEMS microphone die 11.

Referring to FIG. 10, the substrate 20 of FIG. 9 is shown without the top solder mask 30 in place. The top metal layer 31 has been patterned, which results in the top metal layer 31 covering a substantial portion of the upper surface 25 of the substrate 20. The dashed lines represent the positions of the MEMS microphone die 11 and the ASIC 12 when mounted on the substrate 20. The wire bond pads 39, the electrical vias 38, and their respective patterned electrical traces are shown as well, and the patterning of the top metal layer 31 shows that they are electrically isolated (at least in the top metal layer 31) from the other portions of the top metal layer 31 that will serve as the attachment ring 40 and preferably as a ground plane. The attachment ring 40 is shown by dashed lines that replicate the position of the attachment ring as shown in FIG. 9.

Figure 11:
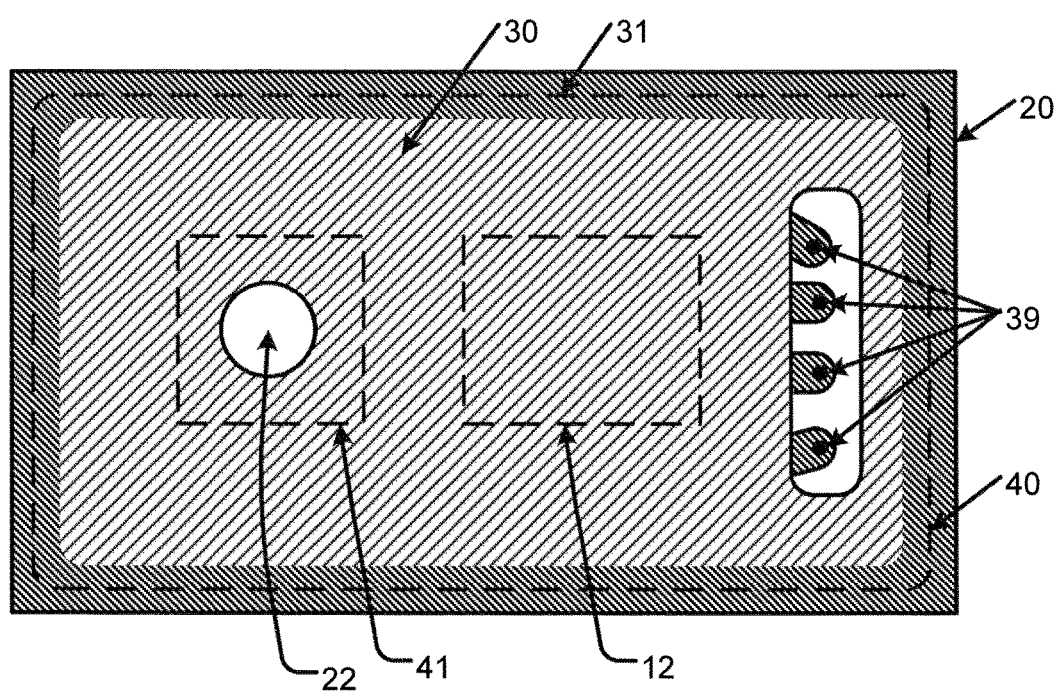
FIG. 11 is a plan view of a solder mask applied to the etched metal surface of the embodiment of FIG. 1i of a substrate for a MEMS microphone according to the disclosed invention.

Referring to FIG. 1i, the embodiment of FIG. 9 is shown with the top solder mask 30 formed and patterned on top of the top metal layer 31. Again, the dashed lines represent the positions of the MEMS microphone die 11 and the ASIC 12 when mounted on the substrate 20. The top solder mask 30 covers the electrical vias 38, and a substantial portion of their respective patterned electrical traces. Only the wire bond pads 39, and a portion of their respective patterned electrical traces, are visible in the window in the top solder mask 30. The attachment ring 40 is shown on the perimeter of the substrate 20. Although FIG. 9 illustrates the attachment ring 40 as an oblong ring arranged around the perimeter of the substrate 20, certain embodiments of the substrate 20 may not have any top solder mask 30 material arranged between the outer edge of the attachment ring 40 (as shown in FIG. 9) and the edges of the substrate 20. In actual practice, it may be more cost effective to implement an attachment ring 40 as shown in FIG. 11, as this implementation allows for the use of either metal can-type or laminate type covers 50. Preferably, the attachment surface 53 of the cover 50 is mechanically and electrically attached to the attachment ring 40 with solder, conductive epoxy, or other suitable material. For all types of MEMS microphones (e.g., top-port, bottom-port, and directional), the interface between the attachment surface 53 of the cover 50 and the attachment ring 40 needs to be sealed to prevent the leakage of acoustic pressure. The material chosen for attaching the cover 50 to the substrate 20 can include such materials as solder, conductive epoxy, etc., and should have the capability to seal the interface between the cover 50 and the substrate 20.

Retaining Ring

Figure 12A:
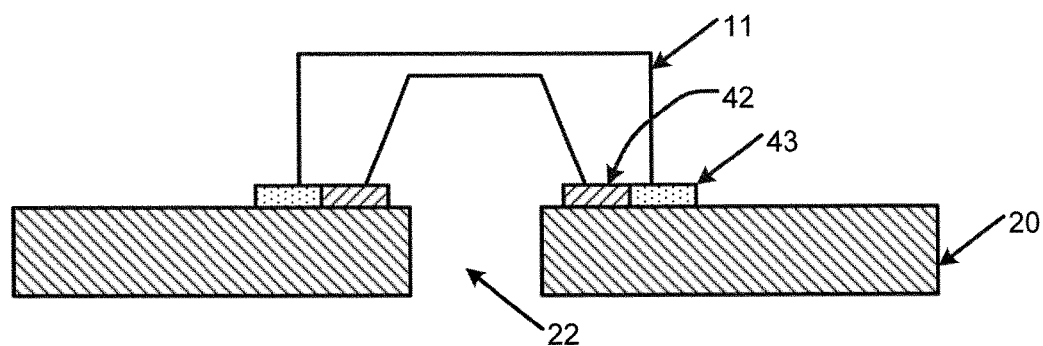
FIG. 12A is a cross-sectional view of a first embodiment of a retaining ring disposed on the surface of a substrate for a MEMS microphone according to the disclosed invention.
Figure 12B:
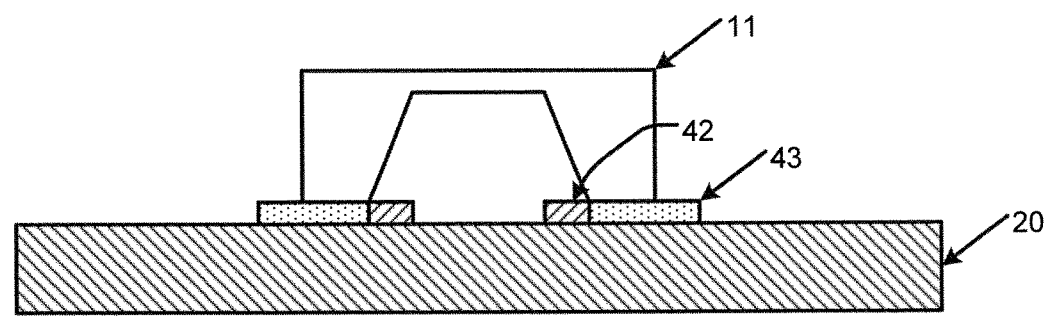
FIG. 12B is a cross-sectional view of another embodiment of a retaining ring disposed on the surface of a substrate for a MEMS microphone according to the disclosed invention.
Figure 12C:
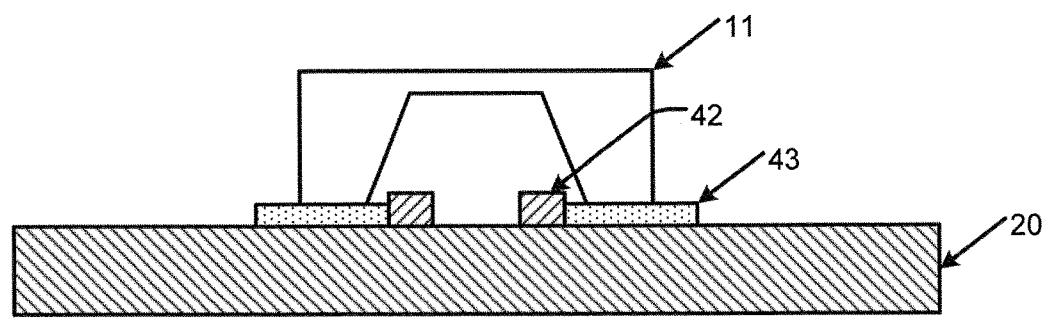
FIG. 12C is a cross-sectional view of a third embodiment of a retaining ring disposed on the surface of a substrate for a MEMS microphone according to the disclosed invention.

Referring to FIGS. 12A-12C, the portion of the substrate 20 on which the MEMS microphone die 11 is mounted may include a retaining ring 42. The retaining ring 42 prevents wicking of a die attach epoxy 43 into the MEMS microphone die 11 and from flowing into the acoustic port 22. Accordingly, the shape of the retaining ring 42 will preferably match the shape of the footprint of the MEMS microphone die 11. The retaining ring 42 comprises a conductive material (e.g., 3 mil. thick copper) on a non-conductive layer material. In certain embodiments, the retaining ring 42 is formed on the top metal layer 31, and the retaining ring 42 is electrically coupled to the ground planes in the substrate 20.

Referring to FIG. 12A, an embodiment of the retaining ring 42 is disposed onto a non-conductive layer of the substrate 20. A die attach epoxy 43 is applied outside the perimeter of the retaining ring 42, and the MEMS microphone die 11 arranged onto the retaining ring 42 such that the MEMS microphone die 11 overlaps the die attach epoxy 43 and the retaining ring 42. This reduces the possibility of die attach epoxy 43 wicking up the sides of the internal acoustic channel 16 of the MEMS microphone die 11 (in the case of a silicon die microphone) and/or wicking into the acoustic port 22.

Referring to FIG. 12B, in an alternative embodiment, the retaining ring 42 can be located so that the MEMS microphone die 11 does not contact the retaining ring 42. In this embodiment, the retaining ring 42 is slightly smaller than the footprint of the MEMS microphone die 11 so that the die attach epoxy 43 has a restricted path and is, thus, less likely to wick. Preferably, the embodiment is used for top-port MEMS microphones, since the placement of the retaining ring 42 would interfere with the size of the acoustic port 22. In FIG. 12B, the retaining ring 42 is fabricated so that it contacts the sides of the internal acoustic channel 16 of the MEMS microphone die 11. For both of these alternative embodiments, the retaining ring 42 is electrically coupled to the ground planes in the substrate 20.

Alternatively, referring to FIG. 12C, in another alternative embodiment, the retaining ring 42 can be located so that the MEMS microphone die 11 does not contact the retaining ring 42. In this embodiment, the retaining ring 42 is slightly smaller than the footprint of the MEMS microphone die 11 so that the epoxy 43 has a restricted path and is, thus, less likely to wick. In FIG. 12C, the retaining ring 42 is fabricated so that it does not contact the internal acoustic channel 16 of the MEMS microphone die 11. In another embodiment (not shown), the retaining ring 42 can be fabricated to be slightly smaller than the footprint of the MEMS microphone die 11, but having sufficient height to contact the walls of the internal acoustic channel 16 of the MEMS microphone die 11 at a point well above the base of the MEMS microphone die.

Substrate Panel

Figure 13:
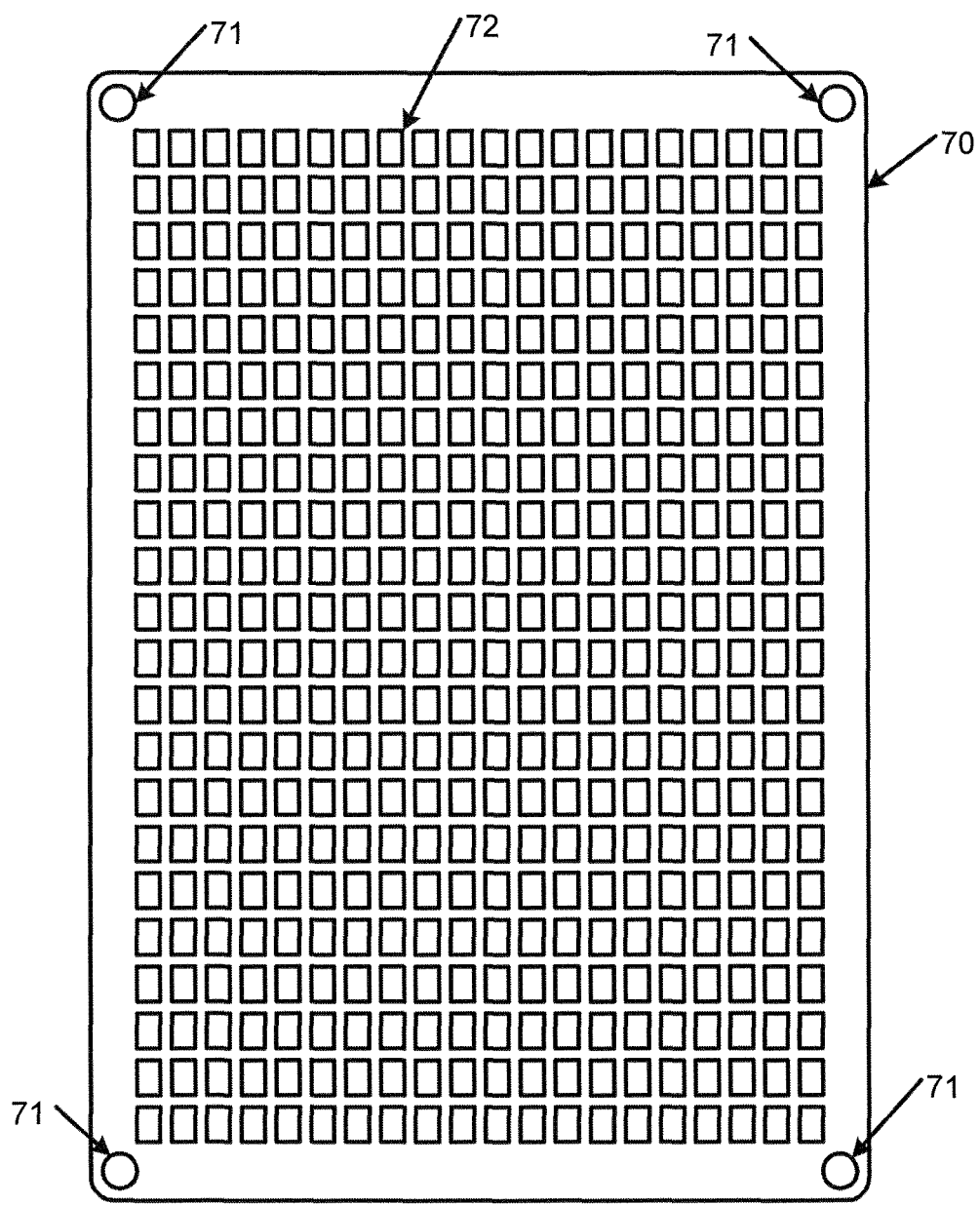
FIG. 13 is a plan view of a panel of individual substrates for a plurality of MEMS microphones according to the disclosed invention.

FIG. 13 is a plan view illustrating a PCB panel 70 of individual substrates 72 in unsingulated form. As shown in FIG. 13, the individual substrates 72 are arranged on the PCB panel 70 in a 20×22 array, or 440 individual substrates total. The number of rows and columns of individual substrates 72 is exemplary, and fewer or more individual substrates may be disposed on the PCB panel 70, or the PCB panel 70 can be smaller or larger in each dimension. As described herein with respect to the various embodiments of the disclosed invention, the individual substrates 72 can each comprise one or more of FR-4 layers, ground layers, electrical vias, an acoustic port (if the PCB panel 70 is intended for bottom-port or directional MEMS microphones), a dielectric layer acting as an environmental barrier, an attachment ring, wire bonding pads, terminal pads, sealing ring, internally embedded passive elements, and solder masks. To assure alignment during the manufacturing process, the PCB panel 70 preferably includes a plurality of alignment apertures 71 used by various computer-controlled machines to ensure proper alignment during the manufacture of the MEMS microphones.

Laminate-Type Microphones

Figure 14:
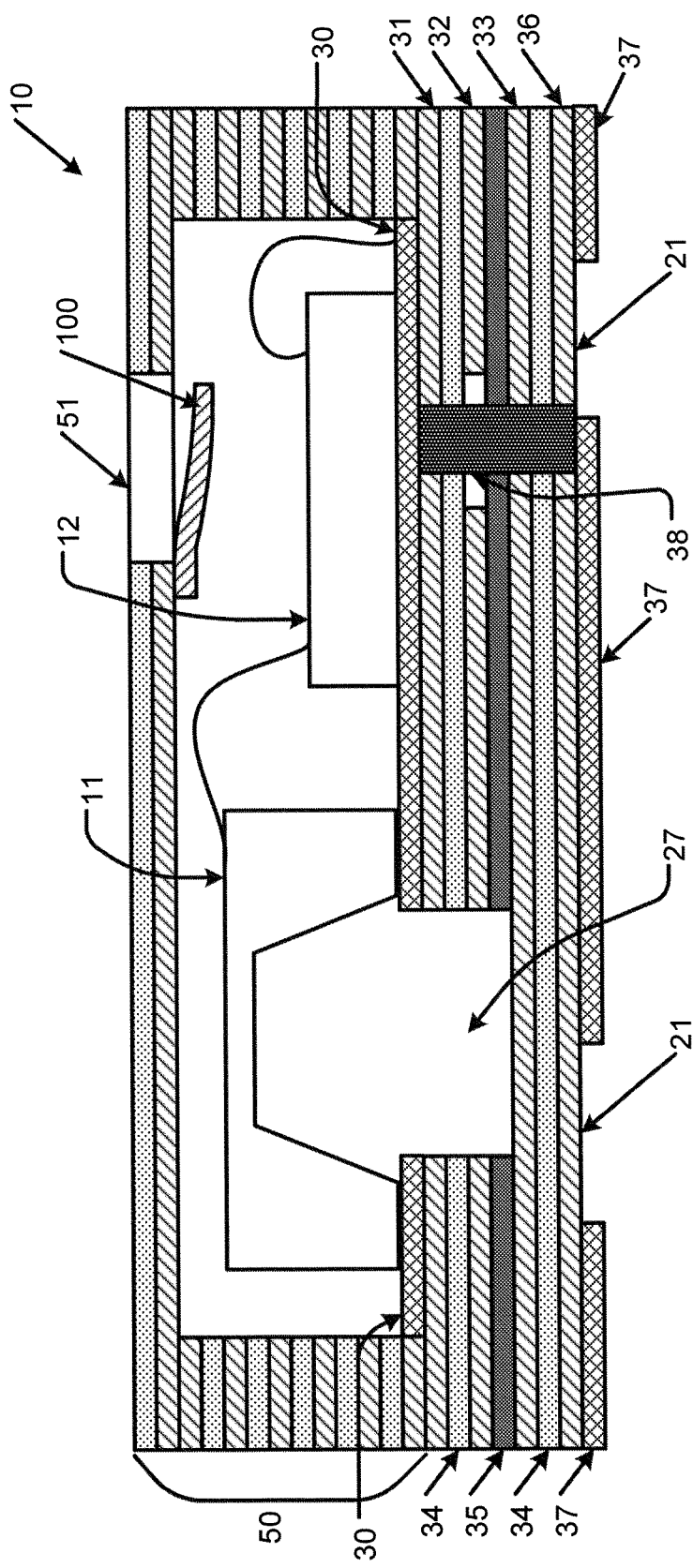
FIG. 14 is a longitudinal cross-sectional view of a first embodiment of a laminate-type cover MEMS microphone according to the disclosed invention.

Referring to FIG. 14, another embodiment of the MEMS microphone 10 is illustrated. The MEMS microphone 10 of FIG. 14 is a top-port microphone, and is similar to the MEMS microphone 10 of FIG. 1A, the main difference being that the cover 50 in FIG. 14 is comprised of laminated layers of conductive and non-conductive material. The cover 50 shown in FIG. 14 has an attachment surface 53 (not shown) that is coupled to the attachment ring 40 formed from the top metal layer 31 of the substrate 20. Solder, conductive epoxy, or other conductive adhesives are preferably used to mechanically attach the laminate-type cover 50 to the substrate 20, and to electrically couple the cover 50 to the ground plane of the substrate 20. The cover 50 disclosed for this particular embodiment only has two layers (one conductive and one non-conductive), but other embodiments of the laminate-type cover 50 may have multiple conductive and non-conductive layers. In FIG. 14, the laminate-type cover 50 further comprises an ingress protection element 100. The ingress protection element 100 limits the potential exposure of the MEMS microphone die 11 to debris that might enter the acoustic chamber 15 through the acoustic port 51. The ingress protection element 100 must be sized so it does not unduly interfere or restrict the air flow into the acoustic chamber, or interfere with the encapsulant 14 or the wiring 13 as shown in FIG. 14. The ingress protection element 100 can be implemented in various ways (FIGS. 3A-3R), and the particular implementation illustrated in FIG. 14 is an attached step offset member (FIGS. 3Q-1 to 3Q-3) embodiment. Unlike the metal can-type cover, the laminate-type cover 50 may comprise one or more layers of non-metallic material that would not be suitable for creating an ingress protection element as shown in FIGS. 3D-3I, and 3N. Thus, the ingress protection element 100 for the laminate-type cover 50 is limited to the type of ingress protection elements shown in FIGS. 3J, 3K, 3L, 3M, 3O, and 3P, which utilize members that would be attached to the laminate-type cover 50, instead of formed from the material that comprises the laminate-type cover 50.

Figure 15:
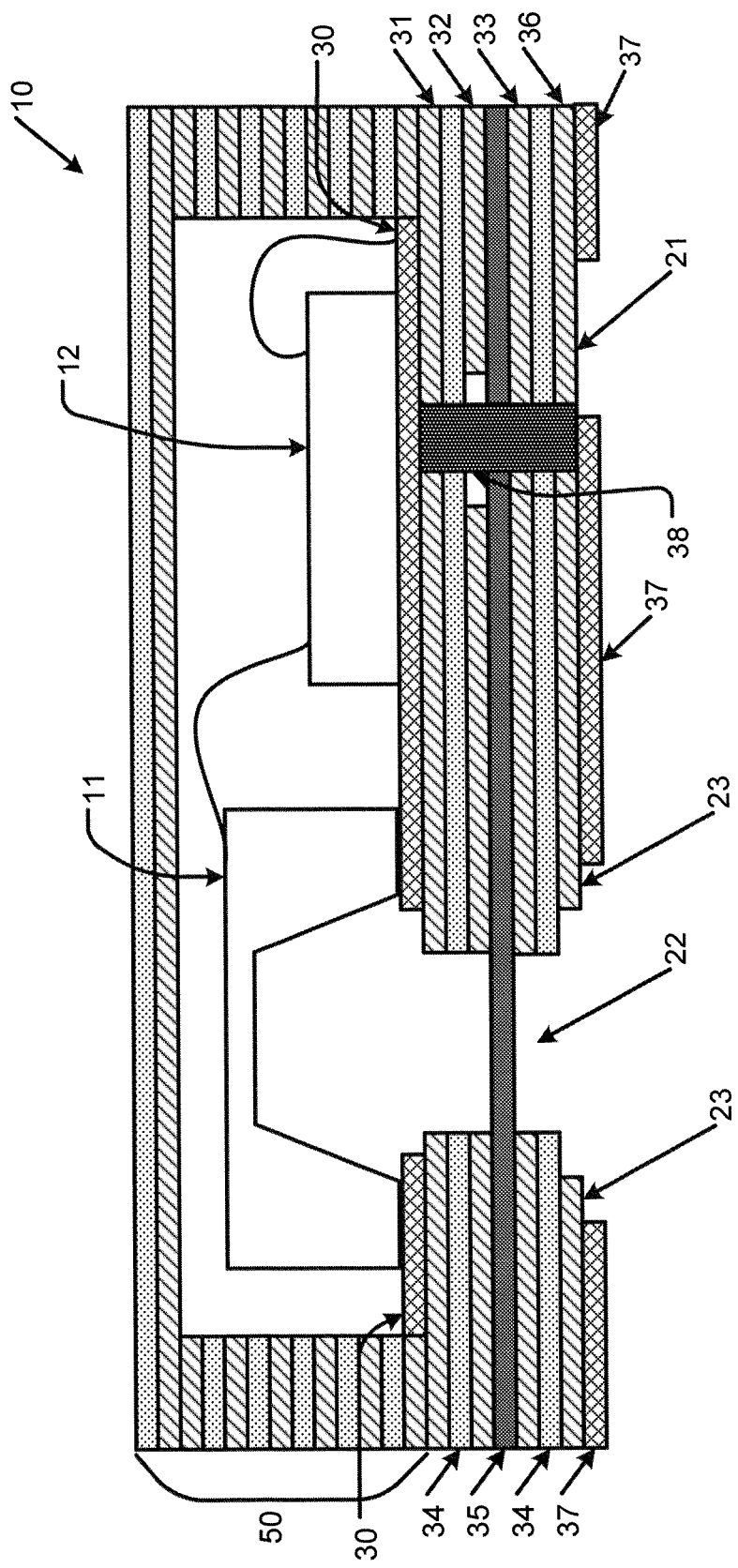
FIG. 15 is a longitudinal cross-sectional view of another embodiment of a laminate-type cover MEMS microphone according to the disclosed invention.

Referring to FIG. 15, another embodiment of the MEMS microphone 10 is illustrated. The MEMS microphone 10 of FIG. 15 is a bottom-port microphone, and is similar to the MEMS microphone 10 of FIG. 2A. The differences are that the substrate 20 in FIG. 15 has a dielectric layer 35 that is protecting the acoustic port 22 (instead of the environmental barrier 44), and the cover 50 is comprised of laminated layers of conductive and non-conductive material. The cover 50 shown in FIG. 15 has an attachment surface 53 (not shown) that is coupled to the attachment ring 40 formed from the top metal layer 31 of the substrate 20. Solder, conductive epoxy, or other conductive adhesives are used to mechanically attach the laminate-type cover 50 to the substrate 20, and to electrically couple the cover 50 to the ground plane of the substrate 20. The laminate-type cover 50 disclosed for this particular embodiment only has two layers (one conductive and one non-conductive), but other embodiments of laminate-type cover 50 may have multiple conductive and non-conductive layers. Since the embodiment shown in FIG. 15 is a bottom-port microphone, it does not require an ingress protection member.

Figure 16:
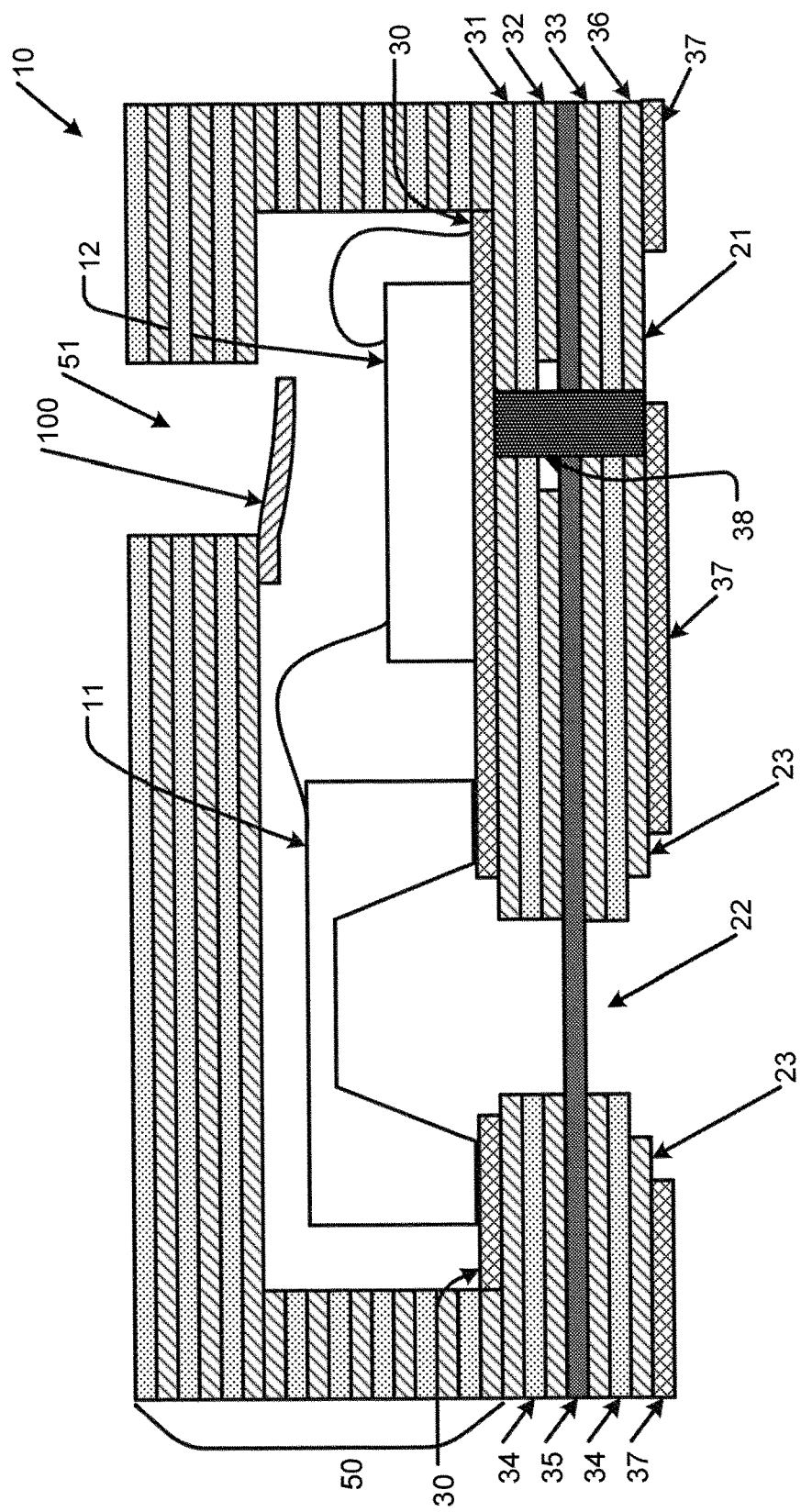
FIG. 16 is a longitudinal cross-sectional view of a third embodiment of a laminate-type cover MEMS microphone according to the disclosed invention.
Figure 17:
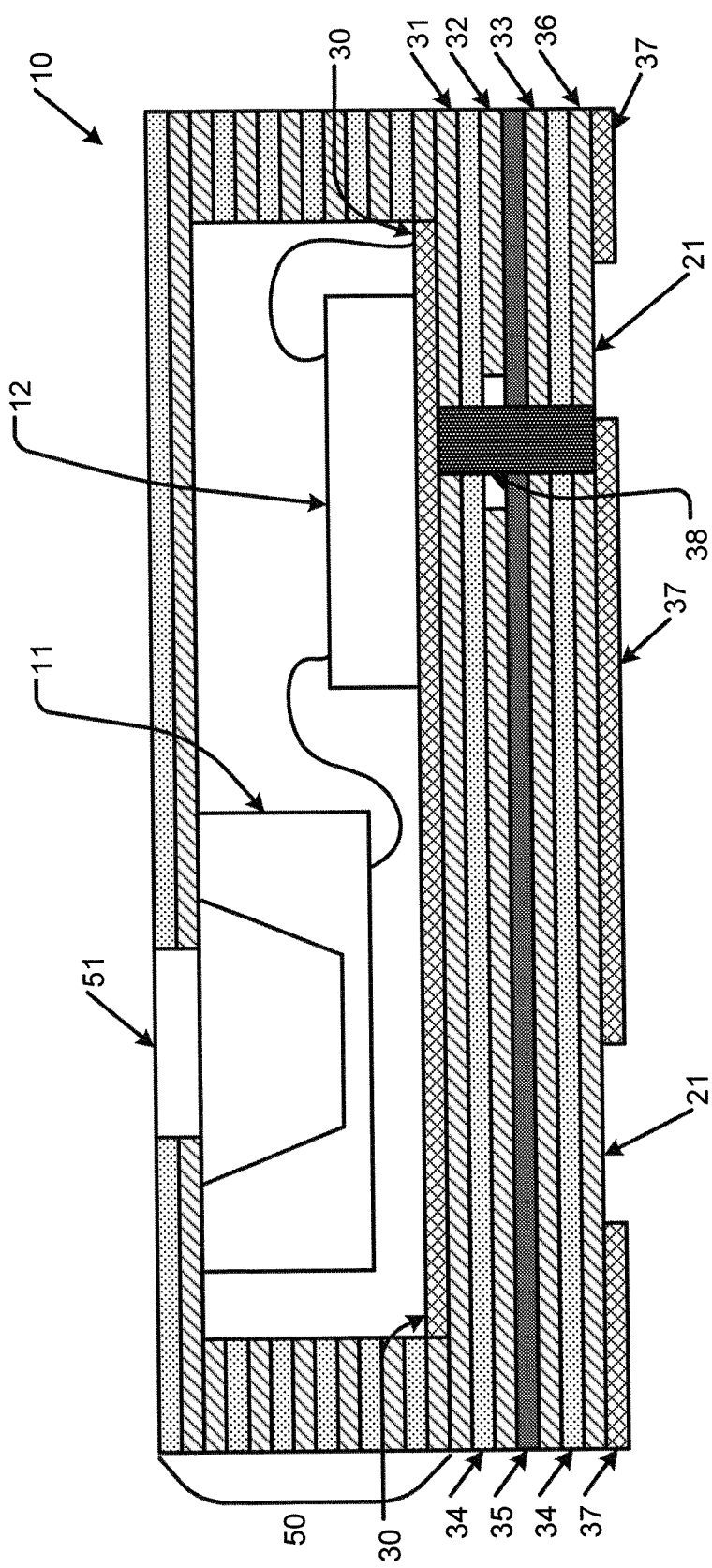
FIG. 17 is a longitudinal cross-sectional view of a fourth embodiment of a laminate-type cover MEMS microphone according to the disclosed invention.

Referring to FIG. 16, another embodiment of the MEMS microphone 10 is illustrated. The MEMS microphone 10 of FIG. 16 is a directional microphone, and is similar to the MEMS microphone 10 of FIG. 2B. One difference is that the substrate 20 in FIG. 16 has a dielectric layer 35 protecting the acoustic port 22, instead of the environmental barrier 44. In addition, the cover 50 is comprised of laminated layers of conductive and non-conductive material. The laminate-type cover 50 shown in FIG. 16 has an attachment surface 53 (not shown) that is coupled to the attachment ring 40 formed from the top metal layer 31 of the substrate 20. Solder, conductive epoxy, or other conductive adhesives are preferably used to mechanically attach the laminate-type cover 50 to the substrate 20, and to electrically couple the laminate-type cover 50 to the ground plane of the substrate 20. The laminate-type cover 50 disclosed for this particular embodiment has multiple conductive and non-conductive layers, in addition to a layer to protect the MEMS microphone die 11 and the ASIC 12 from moisture and debris. In FIG. 16, the laminate-type cover 50 further comprises an ingress protection element 100. The ingress protection element 100 limits the potential exposure of the MEMS microphone die 11 to debris that might enter the acoustic chamber 15 through the acoustic port 51. The ingress protection element 100 must be sized so it does not unduly interfere or restrict the air flow into the acoustic chamber, or interfere with the encapsulant 14 or the wiring 13 as shown in FIG. 16. The ingress protection element 100 can be implemented in various ways (FIGS. 3A-3R), and the particular implementation illustrated in FIG. 16 is an attached step offset member (FIGS. 3Q-1 to 3Q-3) embodiment. Unlike the metal can-type cover, the laminate-type cover 50 may comprise one or more layers of non-metallic material that would not be suitable for creating an ingress protection element as shown in FIGS. 3D-3I, and 3N. Thus, the ingress protection element 100 for the laminate-type cover 50 is limited to the type of ingress protection elements shown in FIGS. 3J, 3K, 3L, 3M, 3O, and 3P, which utilize members that would be attached to the laminate-type cover 50, instead of formed from the material that comprises the laminate-type cover 50.

Laminate-Type Covers

Referring to FIG. 18, an embodiment of the laminate-type cover 50 that comprises laminated layers of conductive and non-conductive material is shown. The laminate-type cover 50 comprises two main components, the lid 80 and the sidewall spacer 90. Both the lid 80 and the sidewall spacer 90 are comprised of multiple layers of conductive material (e.g., copper) and non-conductive material (e.g., FR-4 glass epoxy printed circuit board). The lid 80 and the sidewall spacer 90 are mechanically joined to each other with a conductive adhesive or material (e.g., solder, silver impregnated epoxy) that electrically connects the lid 80 and sidewall spacer 90. In some embodiments, after the joint has been made with a conductive material, the joint is then plated to ensure electrical continuity. The sidewall spacer 90 has an attachment surface 53, which is aligned with the attachment ring 40 on the substrate 20, and coupled thereto. On the interior of the laminate-type cover 50, the sidewall spacer 90 further comprises sidewall plating 94 that electrically couples all the conductive layers in the sidewall spacer 90. The sidewall plating 94 can ensure electrical continuity to the conductive layer (or layers) in the lid 80. In FIG. 18, the laminate-type cover 50 further comprises an ingress protection element 100. The ingress protection element 100 can be implemented in various ways (FIGS. 3A-3R), and the particular implementation illustrated in FIG. 18 is an attached step offset member (FIGS. 3Q-1 to 3Q-3) embodiment. The ingress protection element 100 for the laminate-type cover 50 is limited to the type of ingress protection elements shown in FIGS. 3J, 3K, 3L, 3M, 3O, and 3P, which utilize members that would be attached to the laminate-type cover 50, instead of formed from the material that comprises the laminate-type cover 50.

Referring to FIG. 19, another embodiment of the laminate-type cover 50 comprising laminated layers of conductive and non-conductive material is shown. The laminate-type cover 50 shown in FIG. 19 does not have an acoustic port 51, and no ingress protection element. The laminate-type cover 50 does have sidewall plating 94 that is in electrical contact with the conductive layer in the lid 80.

Figure 20A:
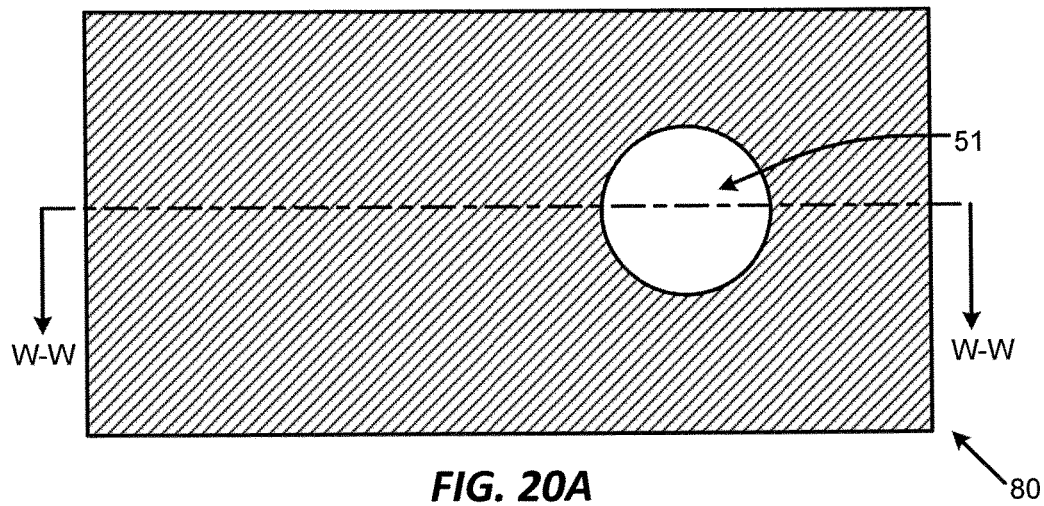
FIG. 20A is a plan view of a lid component for an embodiment of a laminate-type cover for a MEMS microphone according to the disclosed invention.

Referring to FIG. 20A, a top view of the lid 80 component of an embodiment of the laminate-type cover 50 is shown. FIG. 20A depicts a lid 80 with an acoustic port 51 that would be suitable for use as a top-port or directional MEMS microphone 10. The acoustic port 51 is disposed in an offset position from the centerpoint of the lid 80 (i.e., arranged so the acoustic port 51 is positioned over the MEMS microphone die 11). The exposed top surface of the lid 80 is non-conductive material, and that material may be coated with solder mask material, paint, or other materials to improve its appearance.

Figure 20B:
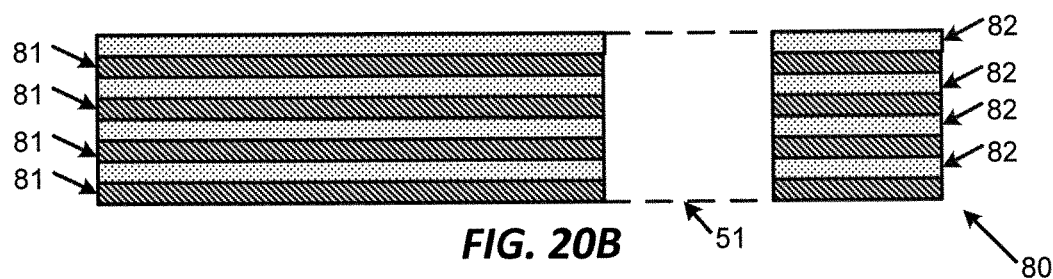
FIG. 20B is a longitudinal cross-sectional view of a first embodiment of a lid component for a laminate-type cover for a MEMS microphone according to the disclosed invention.
Figure 20C:
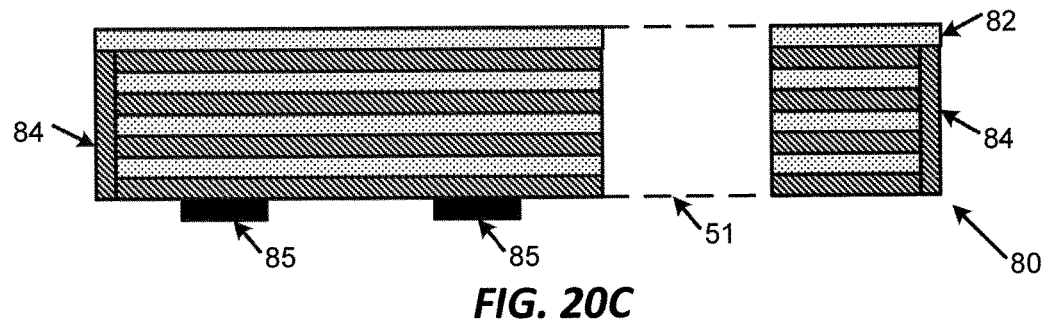
FIG. 20C is a longitudinal cross-sectional view of another embodiment of a lid component for a laminate-type cover for a MEMS microphone according to the disclosed invention.
Figure 20D:
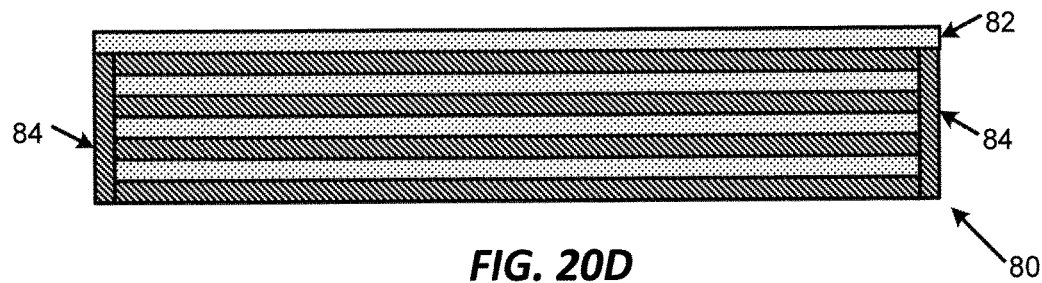
FIG. 20D is a longitudinal cross-sectional view of a third embodiment of a lid component for a laminate-type cover for a MEMS microphone according to the disclosed invention.

Referring to FIGS. 20B-20D, various embodiments of the lid 80 are illustrated along cross-section B-B are illustrated. In each of these embodiments, there are alternating conductive layers 81 and non-conductive layers 82 laminated together. The lid 80 does not necessarily need all the material layers shown in FIGS. 20B-20D, and, in some embodiments, the lid 80 may comprise only a single non-conductive layer 82. Other embodiments may comprise only a single non-conductive layer 82 and a single conductive layer 81. In other embodiments, while the non-conductive layers 82 and the conductive layers 81 alternate in the lid 80, the specific order of the different layers and the actual number of layers used in the lid 80 will be determined by standard design methods based on design goals (e.g., thickness, electromagnetic environment, cost, etc.) for the particular application.

The conductive layers 81 in the lid 80 can serve many functions. The topmost conductive layer 81 can serve as an electromagnetic shield to minimize and suppress electromagnetic interference in a manner similar to a Faraday cage. The lowermost conductive layer 81 can serve as an inner lining for the acoustic chamber 15, and this inner lining can operate as an element of the electromagnetic shield. The lowermost conductive layer 81 can also be patterned into electrical traces. All the conductive layers 81 can be electrically coupled together by internal electrical vias (not shown) or by the sidewall plating 84.

Referring to FIG. 20C, another embodiment of the lid 80 is illustrated. This embodiment comprises terminal bumps 85 patterned on the bottom side of the lid 80 to provide electrical contacts for MEMS microphone die 11 mounted over the acoustic port 51. In this embodiment, electrical traces could be patterned in one of the conductive layers 81 so electrical connections between the terminal bumps 85 and other circuitry in the microphone package can be facilitated. The terminal bumps would be plated with gold, nickel, tin, silver, palladium or other metals to facilitate wire bond connections to the MEMS microphone die 11.

The lid 80 embodiments shown in FIGS. 20A-20C can further comprise an ingress protection element 100. Although not shown in FIGS. 20A-20C, the type of ingress protection elements shown in FIGS. 3J-3M, 3O, and 3P, which utilize members that would be attached to the laminate-type cover 50, can be used to form ingress protection elements suitable for a laminate-type cover 50.

FIG. 20D illustrates another embodiment of the lid 80. In this embodiment, the lid 80 does not comprise an acoustic port 51 or a dielectric layer 83. This particular embodiment is suitable for a bottom-port MEMS microphone 10. All the conductive layers 81 can be electrically coupled together by internal electrical vias (not shown) or by the sidewall plating 84. The lid 80 does not necessarily need all the material layers shown in FIG. 20D, and, in some embodiments, the lid 80 may comprise only a single non-conductive layer 82. Other embodiments may comprise only a single non-conductive layer 82 and a single conductive layer 81, or other numbers of conductive layers 81 and non-conductive layers 82.

Figure 21A:
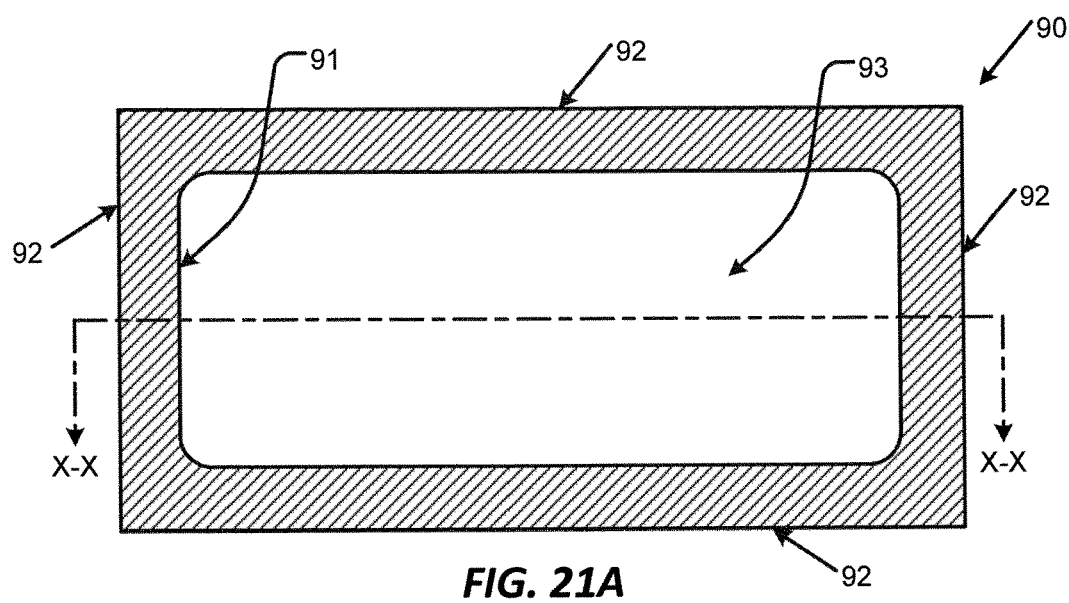
FIG. 21A is a plan view of an embodiment of a sidewall spacer component for a laminate-type cover for a MEMS microphone according to the disclosed invention.

Referring to FIG. 21A, a top view of the sidewall spacer 90 component of the laminate-type cover 50 comprising laminated conductive and non-conductive layers is depicted. The sidewall spacer 90 comprises an interior opening (or interior window) 93 that has an interior sidewall 91 that is the outer perimeter of the interior opening 93. The sidewall spacer 90 also has exterior sidewalls 92, which are preferably flat. The interior opening 93 can be formed by many different techniques, such as routing or punching. The interior opening 93 preferably has sidewall plating 94 on the interior sidewall 91 for suppressing electromagnetic interference that could cause poor operation in the MEMS microphone die 11 and/or the ASIC 12 enclosed within the MEMS microphone 10.

Figure 21B:
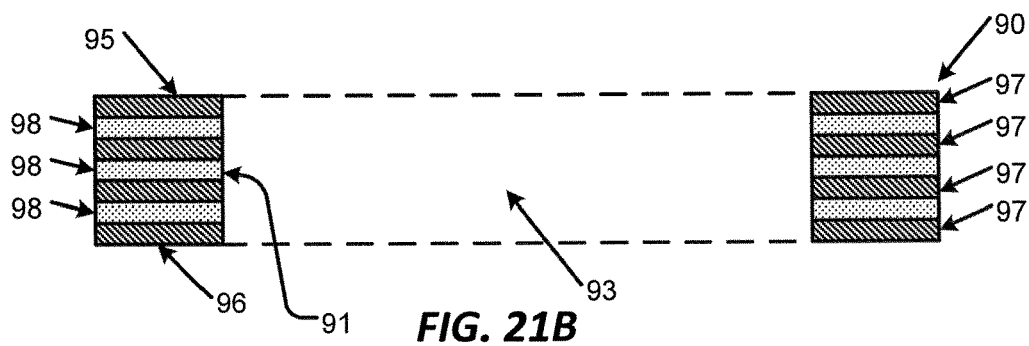
FIG. 21B is a longitudinal cross-sectional view of a first embodiment of a sidewall spacer component for a laminate-type cover for a MEMS microphone according to the disclosed invention.
Figure 21C:
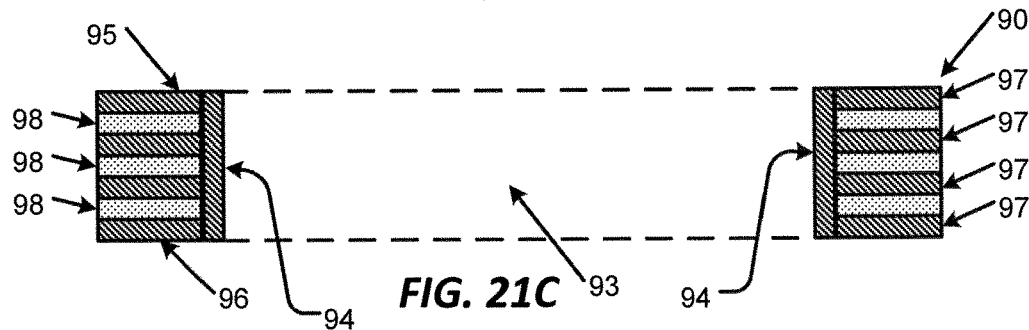
FIG. 21C is a longitudinal cross-sectional view of another embodiment of a sidewall spacer component for a laminate-type cover for a MEMS microphone according to the disclosed invention.
Figure 21D:
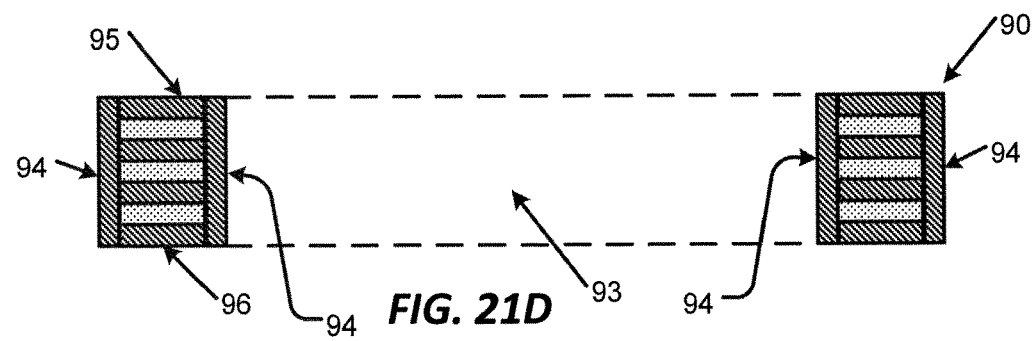
FIG. 21D is a longitudinal cross-sectional view of a third embodiment of a sidewall spacer component for a laminate-type cover for a MEMS microphone according to the disclosed invention.

Referring to FIGS. 21B-21D, various embodiments of the sidewall spacer 90 are shown along cross-section C-C. The sidewall spacer 90 is comprised of alternating conductive layers 97, preferably copper, and non-conductive layers 98, preferably FR-4 printed circuit board material. The number of conductive layers 97 and non-conductive layers 98 is dependent upon the desired internal height of the acoustic chamber 15. The bottom surface 96 of the sidewall spacer 90 is the attachment surface 53 for the cover 50. The interior sidewall 91 can be plated, coated, or metallized with a sidewall plating 94, preferably copper, as shown in FIGS. 21C and 21D. In a preferred embodiment, the entire surface area of the interior sidewall 91 is plated, coated, or metallized with a sidewall plating 94. The sidewall plating 94 provides electromagnetic shielding for the electronic components that are enclosed by the sidewall spacer 90. The sidewall plating 94 is electrically coupled to the ground plane in the substrate 20 through the conductive layer 97 that provides the bottom surface 96 (also attachment surface 53) of the sidewall spacer 90, and then to the terminal pads designated for electrical connection to a ground potential. The sidewall plating 94 is also electrically coupled to the conductive layer 97 that provides the upper surface 95 of the sidewall spacer. This allows the lid 80 to be electrically coupled to the ground plane in the substrate 20 as well. The conductive layers 97 and the sidewall plating 94 are elements of the electromagnetic shielding that operates in a fashion similar to a Faraday cage to minimize and suppress electromagnetic interference. An alternative embodiment for enhanced electromagnetic shielding is shown in FIG. 21D, wherein the sidewall spacer 90 has sidewall plating 94 on the interior sidewall 91 and on the exterior sidewall 92 of the sidewall spacer 90.

MEMS Microphone Arrays

The panel method of manufacturing MEMS microphones allows microphone arrays to be created. Referring to FIGS. 22A-22C, several embodiments of microphone arrays are depicted. During the singulation process, two or more MEMS microphones 10 may be left together (e.g., not singulated from each other) to form a microphone array 99. Each MEMS microphone 10 is individually operable and electrically separate from the other microphones in its microphone array 99. This technique for creating a microphone array 99 can be utilized with laminate-type cover (i.e., shared substrate, sidewalls and/or lids) or metal can-type cover MEMS microphones (i.e., shared substrate edges). As shown in FIGS. 22A-22C, several different arrangements of MEMS microphones 10 are possible. In addition, while top-port microphones are shown in FIGS. 22A-22C, microphone arrays in bottom-port and directional configurations can be manufactured arranged in this manner. As shown in FIGS. 22A-22C, the acoustic port 51 has been modified to accommodate an ingress protection element 100, specifically a formed step offset member. See FIGS. 3B-3D. As will be apparent, the microphone array 99 can use all the embodiments of the ingress protection element, depending upon whether the microphone array 99 is comprised of can-type microphones or laminate-type microphones.

In an alternative embodiment for the microphone array 99, instead of each MEMS microphone 10 in the microphone array 99 being electrically isolated and thus individually controllable, the PCB panel 70 or the panel of lids 80 may be constructed such that a microphone array 99 shares common electrical pathways through the individual substrates 72 of the PCB panel 70, or through the panel of lids 80, or both. For example, use of a common set of terminal pads to provide input power and ground potential to multiple MEMS microphones in a microphone array 99 may be more efficient than having an end user PCB 61 with multiple PCB terminal pads 62 for each microphone in the microphone array 99. Signal lines, e.g., clocks, could be combined to a common electrical pathway that spans several individual substrates 72 in a PCB panel 70.

Mounting MEMS Microphones to PCB

Preferably, the terminal pads 21, the sealing ring 23, and the ground ring 24 of a MEMS microphone 10 are reflow soldered to the land patterns on a PCB 61. In an exemplary mounting process, sticky solder paste is screen-printed or dispensed onto the land patterns on the PCB 61. Preferably, the amount of solder paste printed or dispensed on the land patterns is a predetermined amount, and is calculated such that, when the solder paste liquefies in the reflow oven, there is just enough liquid solder to completely cover the terminal pads 21, the sealing ring 23, and the ground ring 24 of the MEMS microphone 10 the PCB terminal pads 62, the PCB sealing ring 64, and the PCB ground ring 66 and form a strong mechanical with good electrical continuity. The liquefied solder wicks along those connection surfaces to ensure coverage. Limiting the amount of solder paste ensures the liquefied solder (or other conductive adhesive) remains contained just to the various terminal pads and ground rings, and not wicking or creeping away and causing unintended short circuits.

Figure 23A:
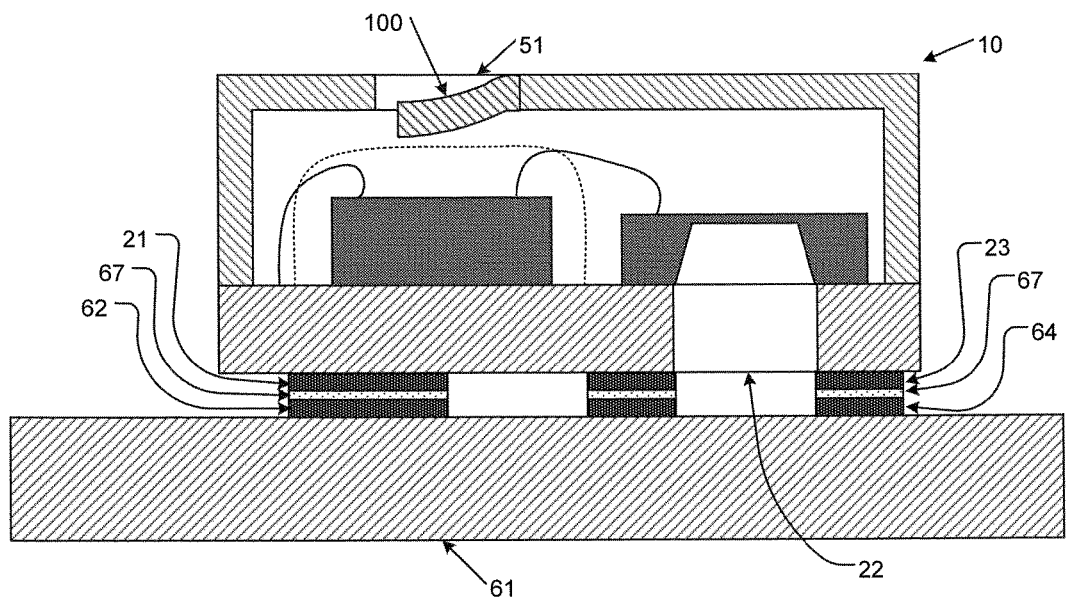
FIG. 23A is a cross-sectional view of a first embodiment of the MEMS microphone according to the disclosed invention affixed to an end user printed circuit board.
Figure 23B:
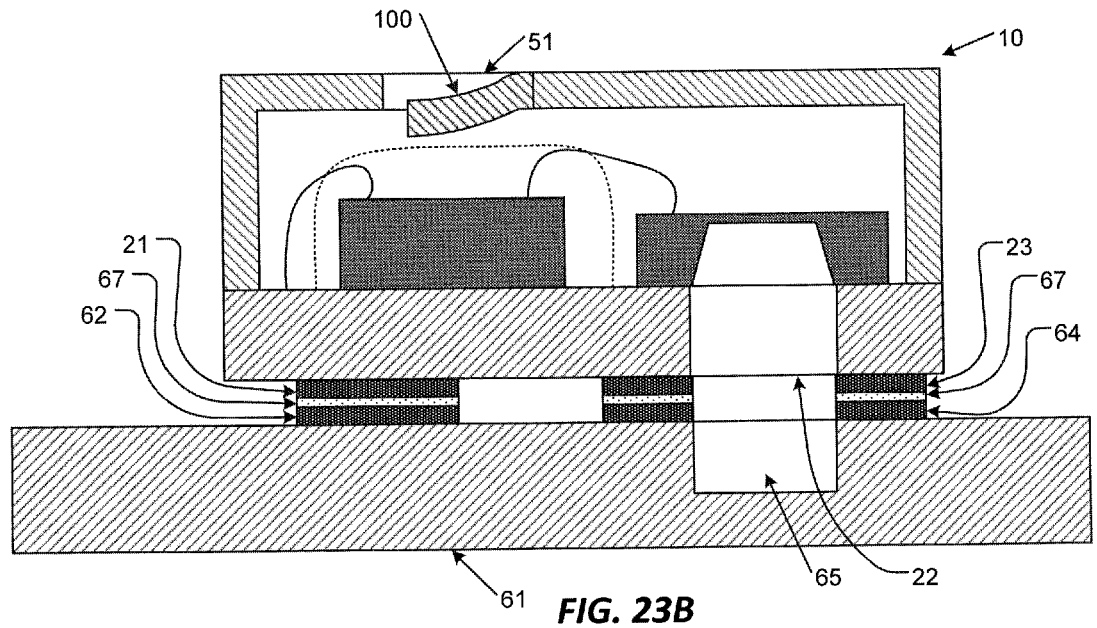
FIG. 23B is a cross-sectional view of a second embodiment of the MEMS microphone according to the disclosed invention affixed to an end user printed circuit board.
Figure 23C:
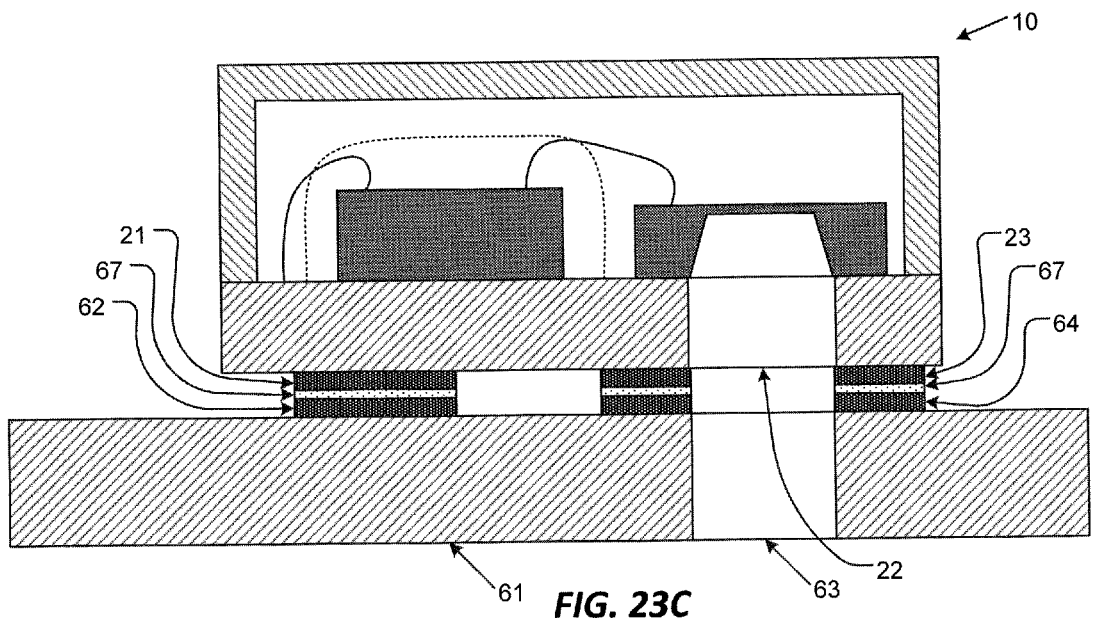
FIG. 23C is a cross-sectional view of a third embodiment of the MEMS microphone according to the disclosed invention affixed to an end user printed circuit board.

Referring to FIGS. 23A-23C, examples of mounting a MEMS microphone 10 onto an end user PCB 61 is shown. For each of the examples, the PCB 61 has a land pattern comprising plurality of PCB terminal pads 62 and, if required, a PCB sealing ring 64 and a PCB ground ring 66, are patterned to match the configuration of the terminal pads 21, the sealing ring 23, and the ground ring 24 on the lower surface 26 of the MEMS microphone 10.

Referring to FIG. 23A, in this particular embodiment, the acoustic port 22 acts as an enlarged back volume for the MEMS microphone die 11. Preferably, solder 67 is used to mechanically and electrically couple the terminal pads 21 to the PCB terminal pads 62, and the sealing ring 23 to the PCB sealing ring 64, in a reflow soldering process. Other adhesives, such as conductive epoxy, could be used. The solder 67 on the sealing ring 23 and the PCB sealing ring 64, when liquefied, should wick completely around the respective rings, and when solidified, the solder 67, the sealing ring 23, and the PCB sealing ring 64 create a sealed acoustic environment around the acoustic port 22. The solidified solder 67 also creates an electrical and mechanical coupling between the terminal pads 21 and PCB terminal pads 62, and the sealing ring 23 and PCB sealing ring 64. The directional MEMS microphone 10 shown in FIG. 23A could also have a ground ring 24, which would be coupled to PCB ground ring 66, but a ground ring 24 was not included for reasons of clarity in FIG. 23A.

Referring to FIG. 23B, another embodiment of the mounting of a MEMS microphone to a PCB is shown. The PCB 61 has a PCB recess 65 that is aligned with the acoustic port 22 in the substrate 20. The PCB recess 65 can be formed by etching or drilling the PCB 61. In another embodiment, the PCB recess 65 could be manufactured to be similar to the extended recess 29 embedded in the substrate 20 shown in FIG. 1B. The PCB recess 65 in FIG. 23B provides additional back volume to enhance the operation of the MEMS microphone die 11. Preferably, solder 67 is used to mechanically and electrically couple the terminal pads 21 to the PCB terminal pads 62, and the sealing ring 23 to the PCB sealing ring 64, in a reflow soldering process. Again, a directional MEMS microphone 10 is used, as the only way acoustic energy can enter the acoustic chamber 15 is through the acoustic port 51 in the cover 50. The directional MEMS microphone 10 shown in FIG. 23B could also have a ground ring 24, which would be coupled to PCB ground ring 66, but a ground ring 24 was not included for reasons of clarity in FIG. 23B.

Referring to FIG. 23C, a bottom-port MEMS microphone 10 is mounted on a PCB 61 that has a PCB acoustic port 63. The PCB acoustic port 63 is aligned with the acoustic port 22 in the substrate 20, and acoustic energy passes through the PCB acoustic port 63 into the acoustic port 22, and then to the diaphragm of the MEMS microphone die 11. Preferably, solder 67 is used to mechanically and electrically couple the terminal pads 21 to the PCB terminal pads 62, and the sealing ring 23 to the PCB sealing ring 64, in a reflow soldering process. The PCB acoustic port 63 can be formed by etching or drilling the PCB 61, and the diameter of the PCB acoustic port 63 is chosen to meet the user's acoustic requirements. The diameter of the PCB acoustic port 63 can be larger or smaller than the diameter of the acoustic port 22 in the MEMS microphone 10. The acoustic chamber 15 acts as the back volume for the MEMS microphone die 11. The bottom-port MEMS microphone 10 shown in FIG. 23C could also have a ground ring 24, which would be coupled to PCB ground ring 66, but a ground ring 24 was not included for reasons of clarity in FIG. 23C.

While specific embodiments have been illustrated and described, numerous modifications come to mind without significantly departing from the spirit of the disclosed invention, and the scope of protection is only limited by the scope of the accompanying claims.

The foregoing description of the preferred embodiments of the disclosed invention has been presented for purposes of illustration and description. It is not intended to be exhaustive or to limit the disclosed invention to the precise form disclosed, and modifications and variations are possible in light of the above teachings or may be acquired from practice of the disclosed invention. The embodiments were chosen and described in order to explain the principles of the disclosed invention and its practical application to enable one skilled in the art to utilize the disclosed invention in various embodiments and with various modifications as are suited to the particular use contemplated.

Thus, while only certain embodiments of the disclosed invention have been specifically described herein, it will be apparent that numerous modifications may be made thereto without departing from the spirit and scope of the disclosed invention. Further, acronyms are used merely to enhance the readability of the specification and claims. It should be noted that these acronyms are not intended to lessen the generality of the terms used and they should not be construed to restrict the scope of the claims to the embodiments described therein.

The invention claimed is:

1. A micro-electro-mechanical system (MEMS) microphone comprising:
a substrate including a first surface and a second surface;
an application-specific integrated circuit (ASIC) disposed on a first region of the first surface;
a microphone die disposed on a second region of the first surface, the microphone die comprising a membrane and a diaphragm, wherein the second region is displaced from the first region; and
a cover formed of a solid material including a sidewall portion and a top portion, the sidewall portion extending from a periphery of the top portion, wherein ends of the sidewall portion are attached to a peripheral region of the first surface such that the cover substantially encloses a volume proximate to the first surface so as to form an acoustic chamber, wherein the top portion further comprises:
an acoustic port; and
an ingress protection element formed of the solid material, the ingress protection element including a first edge extending from a boundary of the acoustic port in a direction such that a portion of the ingress protection element is disposed within the acoustic chamber to define an opening between the ingress protection element and the top portion, the ingress protection element further including a second edge, the ingress protection element comprising one of:
a formed step offset member having the second edge disposed within the acoustic chamber; or
a v-side shear member having both the first edge and the second edge coupled to the acoustic port and having a v-shaped portion disposed within the acoustic chamber.

2. The MEMS microphone of claim 1, wherein the top portion is substantially planar, wherein at least a portion of the ingress protection element is curved with respect to the top portion.

3. The MEMS microphone of claim 1, wherein the acoustic port is disposed more proximate to the first region than the second region.

4. The MEMS microphone of claim 3, wherein a surface normal of the ingress protection element extends away from the second region.

5. The MEMS microphone of claim 3, wherein the ingress protection element includes a first portion extending from the first edge and a second portion extending from the first portion to the second edge, wherein the first portion is bent at an acute angle towards the first surface.

6. The MEMS microphone of claim 5, wherein the angle is approximately 15 degrees.

7. The MEMS microphone of claim 1, wherein the second edge is more laterally displaced from the second region than the first edge.

8. The MEMS microphone of claim 1, wherein the acoustic port and ingress protection element are substantially rectangular-shaped, wherein the ingress protection element includes the first edge, the second edge, a third edge, and the fourth edge.

9. The MEMS microphone of claim 8, wherein only the first edge is attached to the boundary.

10. The MEMS microphone of claim 1, wherein the ingress protection element comprises the v-side shear member.

11. A solder reflow surface mount micro-electro-mechanical system (MEMS) microphone comprising:
a substrate comprising:
a base layer that has a top surface and a bottom surface;
a first plurality of metal pads disposed on the top surface of the base layer;
a second plurality of metal pads disposed on the bottom surface of the base layer; and
one or more electrical pathways disposed within the base layer, wherein the pathways electrically couple one or more of the first plurality of metal pads on the top surface of the base layer to one or more of the second plurality of metal pads on the bottom surface of the base layer;
a MEMS microphone die mounted to the top surface of the substrate and electrically coupled to at least one of the first plurality of metal pads on the top surface of the substrate; and
a cover formed from a solid material that comprises a top portion and a sidewall portion that adjoins the top portion at an angle and that surrounds and supports the top portion, wherein the side-wall portion is attached to the substrate to form an acoustic chamber, wherein the cover further comprises:
an acoustic port disposed in the top portion, wherein the acoustic port is offset from the MEMS die microphone such that there is no overlap between the acoustic port and the MEMS die microphone in a vertical direction; and
an ingress protection element extending from an edge of the acoustic port into the acoustic chamber, wherein no more than a single continuous section of the ingress protection element is directly attached to the edge.

12. The MEMS microphone of claim 11, wherein the ingress protection element is substantially rectangular-shaped and includes a first edge, a second edge, a third edge, and a fourth edge, wherein the single continuous section comprises the first edge such that gaps are formed between the second, third, and fourth edges and the top portion.

13. The MEMS microphone of claim 11, wherein the top portion is substantially planar, wherein the single continuous section comprises:
a first portion that is attached to the edge of the acoustic port and is substantially co-planar with the top section; and
a second portion extending from the first portion that is curved into the acoustic chamber.

14. The MEMS microphone of claim 11, wherein the single continuous section is bent at an acute angle towards the substrate.

15. The MEMS microphone of claim 11, wherein the ingress protection element is formed of the solid material.

16. The MEMS microphone of claim 11, wherein a portion of an end of the ingress protection element opposite to the single continuous section is disposed within a plane that is substantially parallel to a plane in which the top portion of the cover is disposed.

17. The MEMS microphone of claim 11, wherein an entirety of an end of the ingress protection element opposite to the single continuous section is offset from the top portion.

18. A method of forming a micro-electro-mechanical system (MEMS) microphone comprising:
- providing a substrate including a surface, wherein an application-specific integrated circuit (ASIC) is disposed on a first region of the surface and a microphone die is disposed at a second region of the surface, wherein the second region is displaced from the first region;
- providing a cover including a sidewall portion and a top portion, the sidewall portion extending at an angle to the top-portion;
- forming an acoustic port and an ingress protection element in the top portion by punching the top portion such that a section of the top portion extends at an angle from the remainder of the top portion, wherein the section is the ingress protection element; and
- attaching the sidewall portion to the substrate such that the acoustic port is offset from the second region.

19. The method of claim 16, where the cover is constructed of a solid material including at least one of copper, brass, stainless steel, and a copper-nickel-zinc alloy.

20. The method of claim 16, wherein forming the ingress protection element comprises punching the ingress protection element in the top portion using a formed punch.

* * * * *